(12) United States Patent
Zbinden et al.

(10) Patent No.: US 9,915,796 B2
(45) Date of Patent: Mar. 13, 2018

(54) TRANSCEIVER AND INTERFACE FOR IC PACKAGE

(71) Applicant: Samtec, Inc., New Albany, IN (US)

(72) Inventors: Eric J. Zbinden, New Albany, IN (US); Randall E. Musser, New Albany, IN (US); Jean-Marc A. Verdiell, New Albany, IN (US); John A. Mongold, New Albany, IN (US); Brian R. Vicich, New Albany, IN (US); Keith R. Guetig, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 15/211,138

(22) Filed: Jul. 15, 2016

(65) Prior Publication Data

US 2016/0327761 A1    Nov. 10, 2016

Related U.S. Application Data

(63) Continuation of application No. 15/181,762, filed on Jun. 14, 2016, now Pat. No. 9,841,572, which is a
(Continued)

(51) Int. Cl.
*H04B 10/24* (2006.01)
*H04B 10/00* (2013.01)
(Continued)

(52) U.S. Cl.
CPC .......... *G02B 6/4284* (2013.01); *G02B 6/428* (2013.01); *G02B 6/4232* (2013.01);
(Continued)

(58) Field of Classification Search
USPC .................................................. 398/115, 116
See application file for complete search history.

(56) References Cited

U.S. PATENT DOCUMENTS 5,425,651 A    6/1995   Thrush et al.
5,642,259 A    6/1997   Ma
(Continued)

FOREIGN PATENT DOCUMENTS

CN    1715979 A    1/2006
CN    1969462 A    5/2007
(Continued)

OTHER PUBLICATIONS

Zbinden et al.; "Transceiver and Interface for IC Package"; U.S. Appl. No. 15/157,548, filed May 18, 2016.
(Continued)

*Primary Examiner* — Oommen Jacob
(74) *Attorney, Agent, or Firm* — Keating & Bennett, LLP

(57) ABSTRACT

An interconnect system includes a first circuit board, first and second connectors connected to the first circuit board, and a transceiver including an optical engine and arranged to receive and transmit electrical and optical signals through a cable, to convert optical signals received from the cable into electrical signals, and to convert electrical signals received from the first connector into optical signals to be transmitted through the cable. The transceiver is arranged to mate with the first and second connectors so that at least some converted electrical signals are transmitted to the first connector and so that at least some electrical signals received from the cable are transmitted to the second connector.

12 Claims, 59 Drawing Sheets

Related U.S. Application Data continuation of application No. 15/157,548, filed on May 18, 2016, now Pat. No. 9,651,752, which is a continuation of application No. 14/295,367, filed on Jun. 4, 2014, now Pat. No. 9,374,165, which is a continuation of application No. 13/895,571, filed on May 16, 2013, now Pat. No. 8,787,711, which is a continuation of application No. 13/758,464, filed on Feb. 4, 2013, now Pat. No. 8,588,562, which is a continuation of application No. 13/539,173, filed on Jun. 29, 2012, now Pat. No. 8,588,561.

(60) Provisional application No. 61/504,072, filed on Jul. 1, 2011, provisional application No. 61/636,005, filed on Apr. 20, 2012.

(51) Int. Cl.

| | | |
|---|---|---|
| *H01R 27/00* | (2006.01) | |
| *G02B 6/42* | (2006.01) | |
| *H04B 1/3827* | (2015.01) | |
| *H04B 10/40* | (2013.01) | |
| *H04B 10/27* | (2013.01) | |
| *H04B 10/25* | (2013.01) | |
| *H04B 10/80* | (2013.01) | |
| *H05K 7/20* | (2006.01) | |
| *H01R 13/639* | (2006.01) | |
| *H01R 12/71* | (2011.01) | |

(52) U.S. Cl.
CPC ......... *G02B 6/4246* (2013.01); *G02B 6/4249* (2013.01); *G02B 6/4261* (2013.01); *G02B 6/4269* (2013.01); *G02B 6/4278* (2013.01); *G02B 6/4279* (2013.01); *G02B 6/4292* (2013.01); *G02B 6/4293* (2013.01); *H01R 12/716* (2013.01); *H01R 13/639* (2013.01); *H04B 1/3833* (2013.01); *H04B 10/2504* (2013.01); *H04B 10/27* (2013.01); *H04B 10/40* (2013.01); *H04B 10/801* (2013.01); *H04B 10/803* (2013.01); *H05K 7/20418* (2013.01); *H01L 2224/48091* (2013.01); *H01L 2224/49175* (2013.01)

(56) References Cited

U.S. PATENT DOCUMENTS

| | | | |
|---|---|---|---|
| 5,815,916 A * | 10/1998 | Luc | H01R 43/0256 29/33 M |
| 5,820,391 A | 10/1998 | Delprete et al. | |
| 5,895,281 A | 4/1999 | Rothenberger | |
| 6,135,797 A | 10/2000 | McCleerey et al. | |
| 6,802,654 B1 | 10/2004 | Roberts et al. | |
| 7,004,765 B2 | 2/2006 | Hsu et al. | |
| 7,539,367 B2 | 5/2009 | Tamura et al. | |
| 7,828,569 B2 * | 11/2010 | Aronson | H01R 24/64 439/218 |
| 8,036,500 B2 | 10/2011 | McColloch | |
| 9,002,155 B2 | 4/2015 | Li et al. | |
| 9,016,957 B2 | 4/2015 | Ben David et al. | |
| 2005/0276547 A1 | 12/2005 | Wang et al. | |
| 2005/0277323 A1 * | 12/2005 | Eldridge | G01R 31/2889 439/482 |
| 2007/0086710 A1 | 4/2007 | Takizawa et al. | |
| 2007/0224851 A1 | 9/2007 | Togami et al. | |
| 2007/0232091 A1 * | 10/2007 | Hong | H05K 1/117 439/66 |
| 2009/0093137 A1 * | 4/2009 | Badehi | G02B 6/4201 439/61 |
| 2010/0020505 A1 * | 1/2010 | Brodsky | H05K 1/144 361/721 |
| 2010/0231250 A1 * | 9/2010 | Breinlinger | G01R 1/0458 324/750.08 |
| 2011/0189895 A1 * | 8/2011 | Ito | H01R 24/38 439/629 |
| 2012/0113581 A1 * | 5/2012 | Anguiano-Wehde | G06F 1/187 361/679.33 |

FOREIGN PATENT DOCUMENTS

| | | |
|---|---|---|
| CN | 201207506 Y | 3/2009 |
| CN | 101406111 A | 4/2009 |
| CN | 201303129 Y | 9/2009 |
| CN | 102017323 A | 4/2011 |

OTHER PUBLICATIONS

Faith et al.; "Transceiver System"; U.S. Appl. No. 15/207,643, filed Jul. 12, 2016.
Zbinden et al.; "Transceiver and Interface for IC Package"; U.S. Appl. No. 15/265,885, filed Sep. 15, 2016.
Zbinden et al.; "Transceiver and Interface for IC Package"; U.S. Appl. No. 15/485,557, filed Apr. 13, 2017.
Zbinden et al., "Transceiver and Interface for IC Package", U.S. Appl. No. 15/181,762, filed Jun. 14, 2016.
Zbinden et al., "Transceiver and Interface for IC Package", U.S. Appl. No. 15/211,142, filed Jul. 15, 2016.
Official Communication issued in Chinese Patent Application No. 201610570388.8, dated Aug. 28, 2017.
Official Communication issued in Chinese Patent Application No. 201610570329.0, dated Jul. 27, 2017.

* cited by examiner

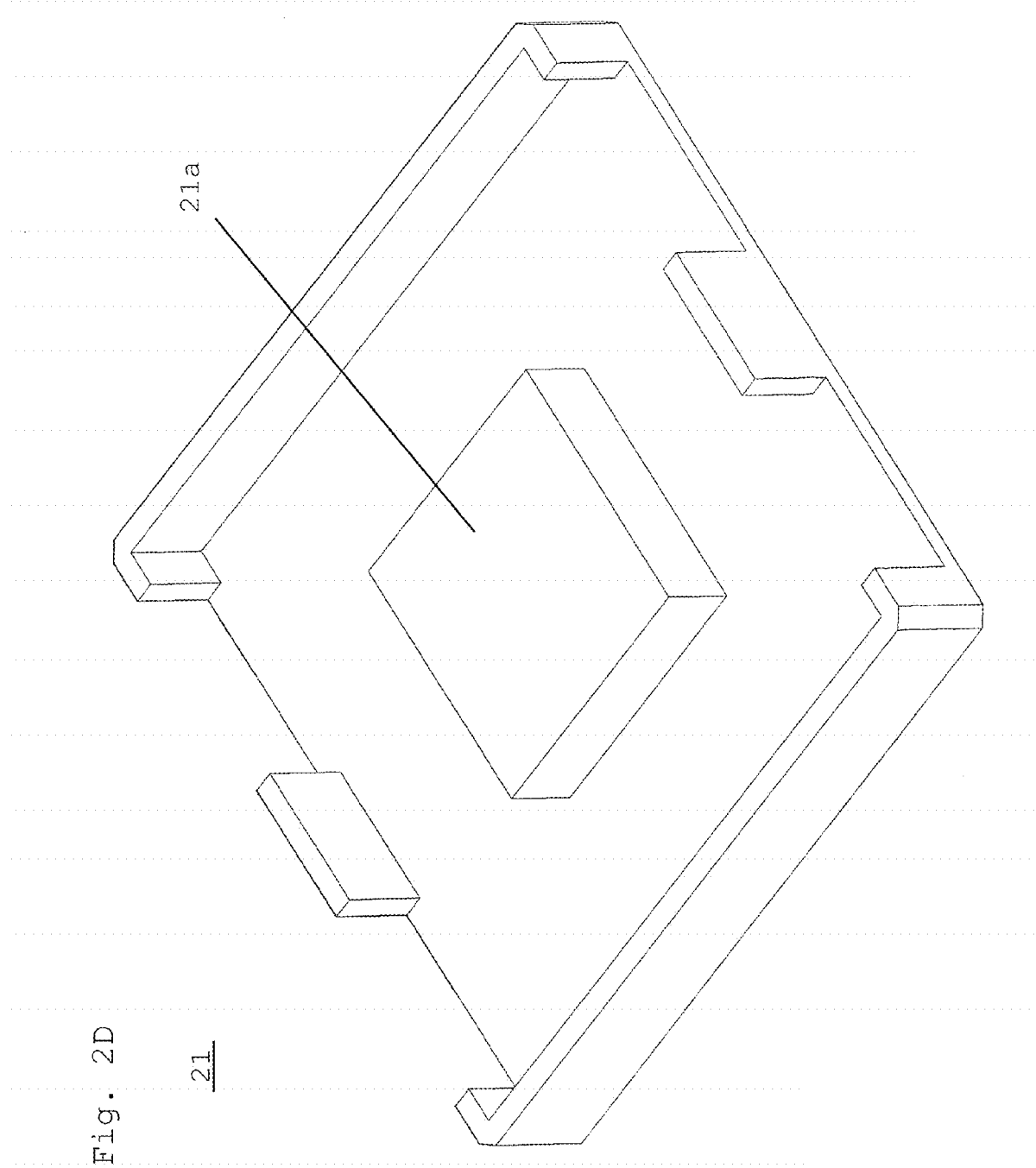

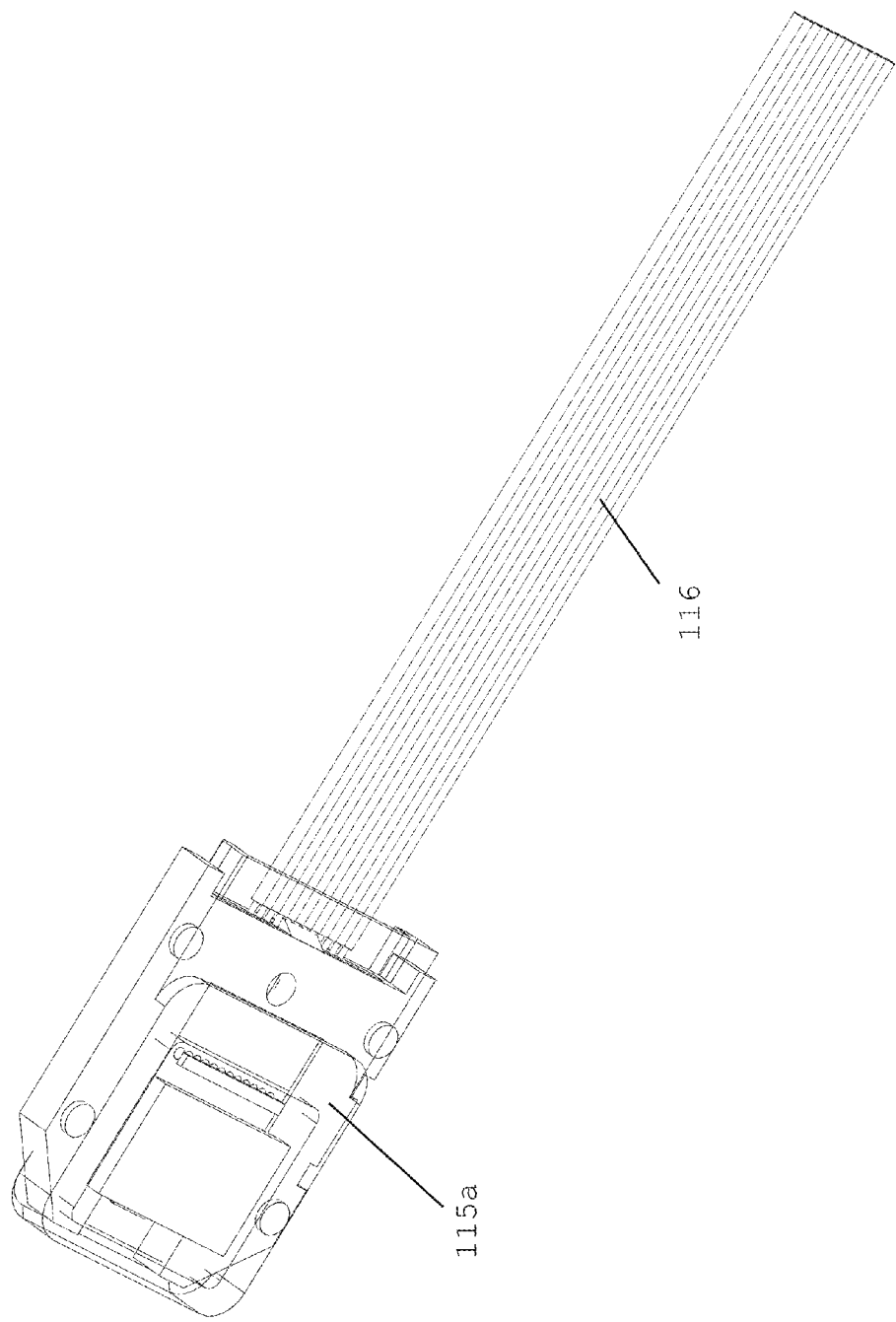

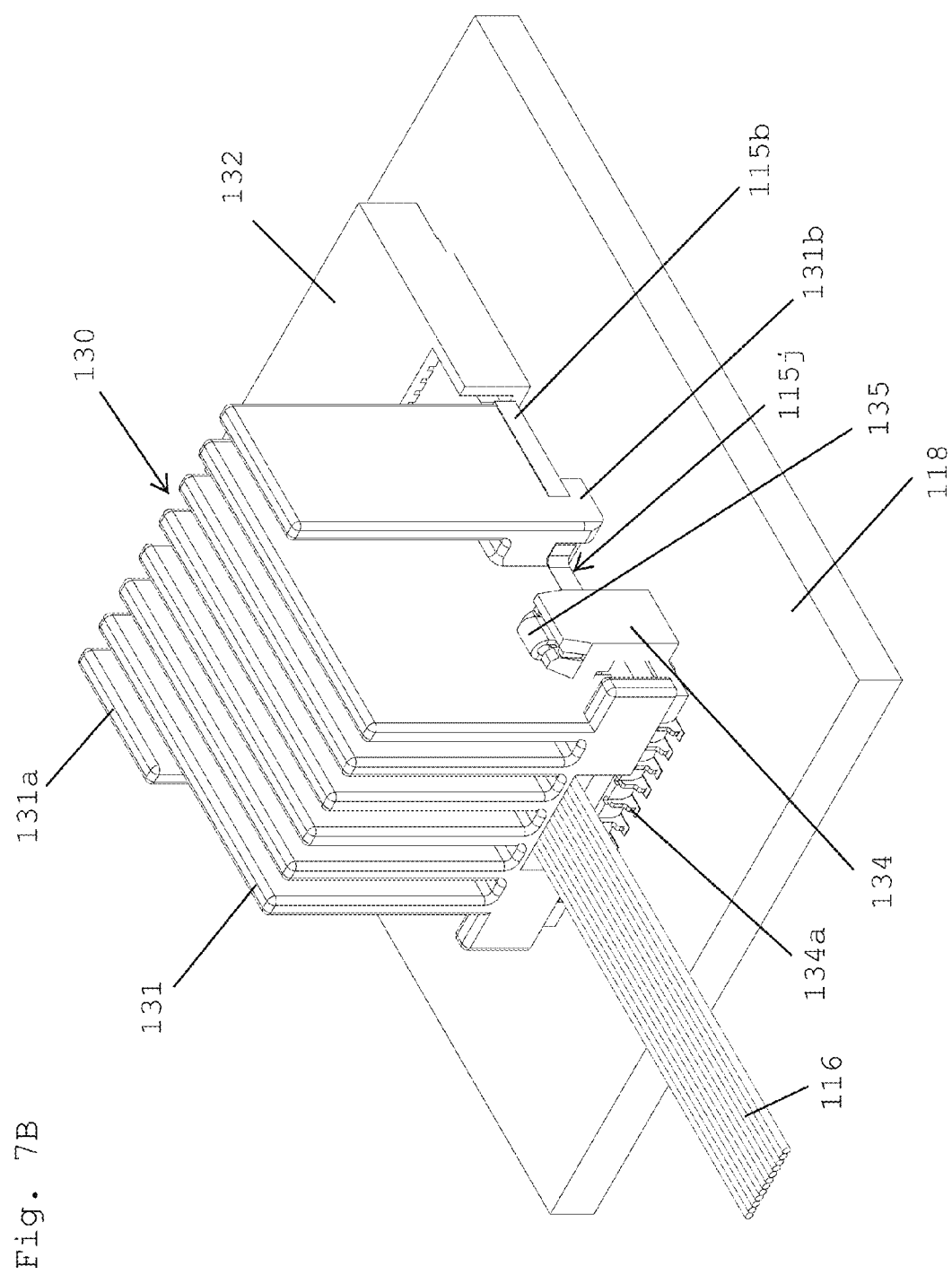

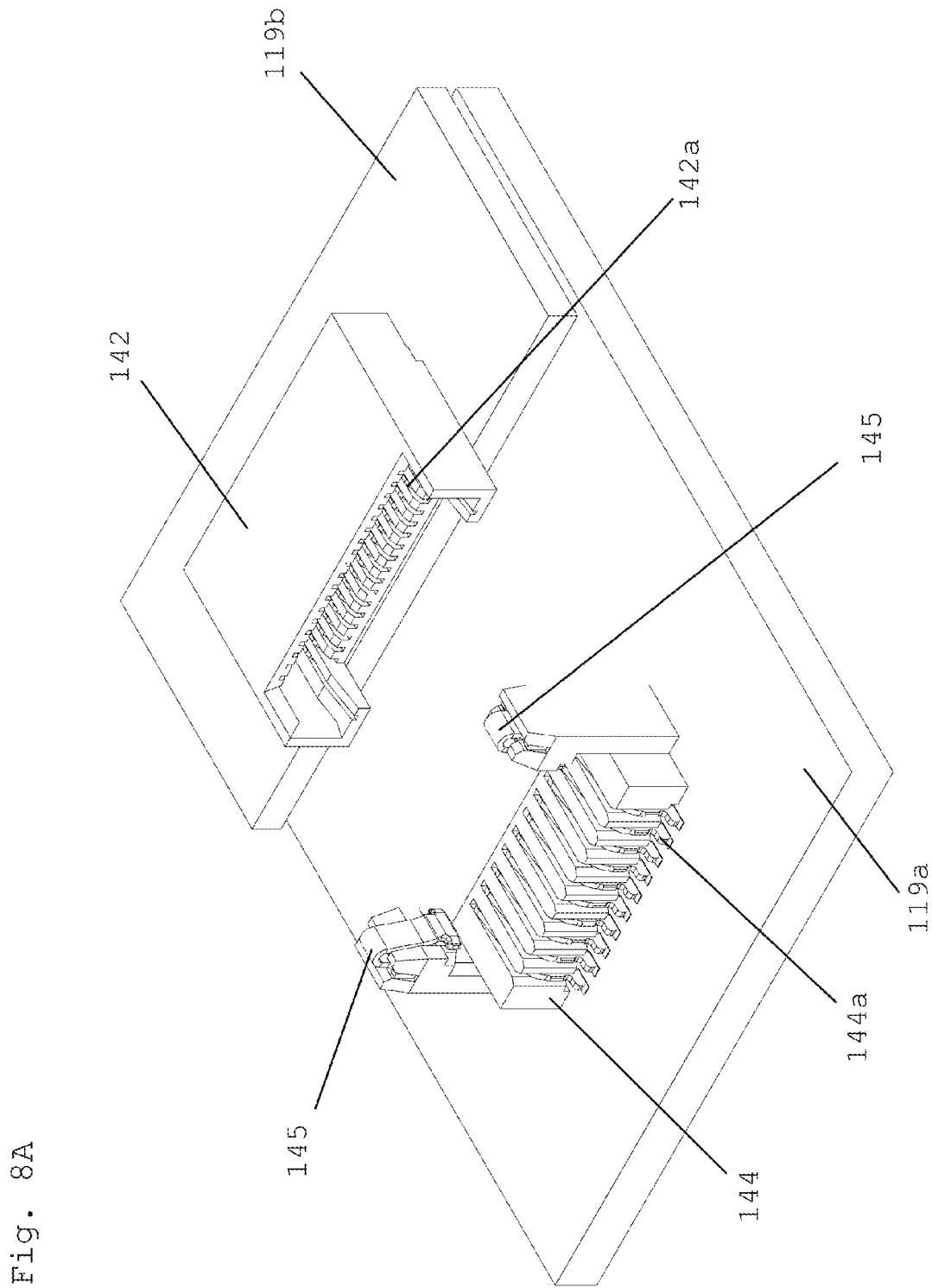

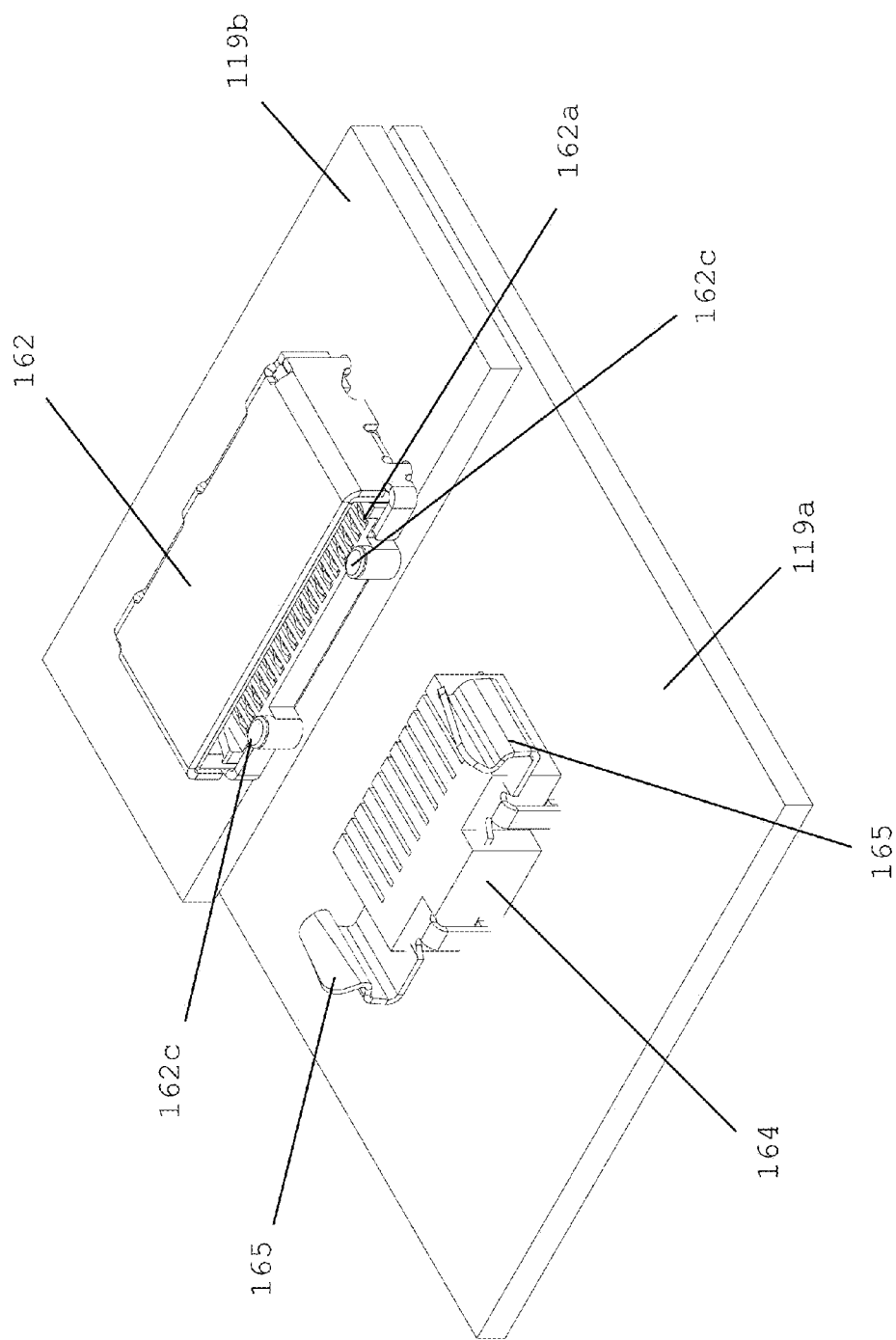

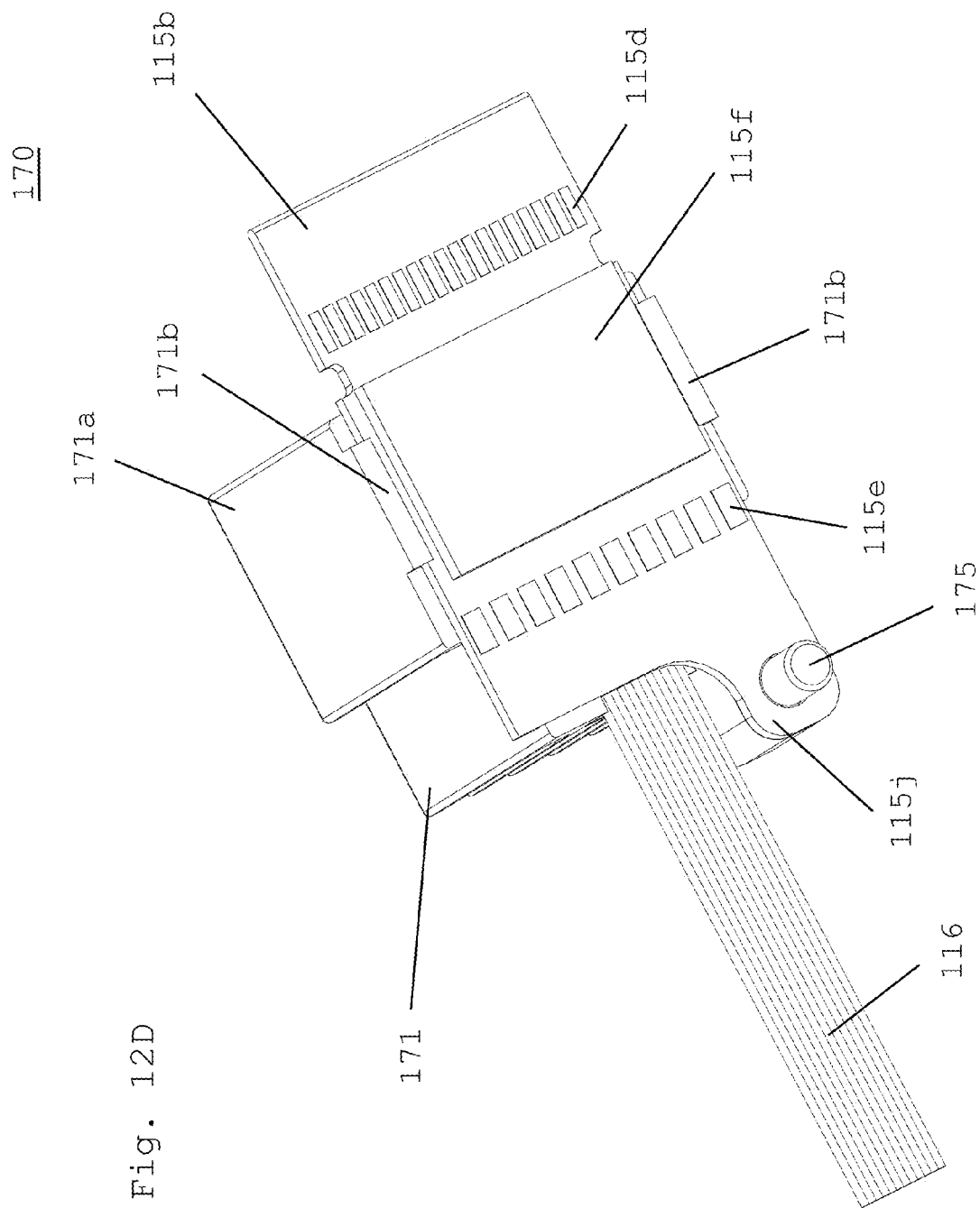

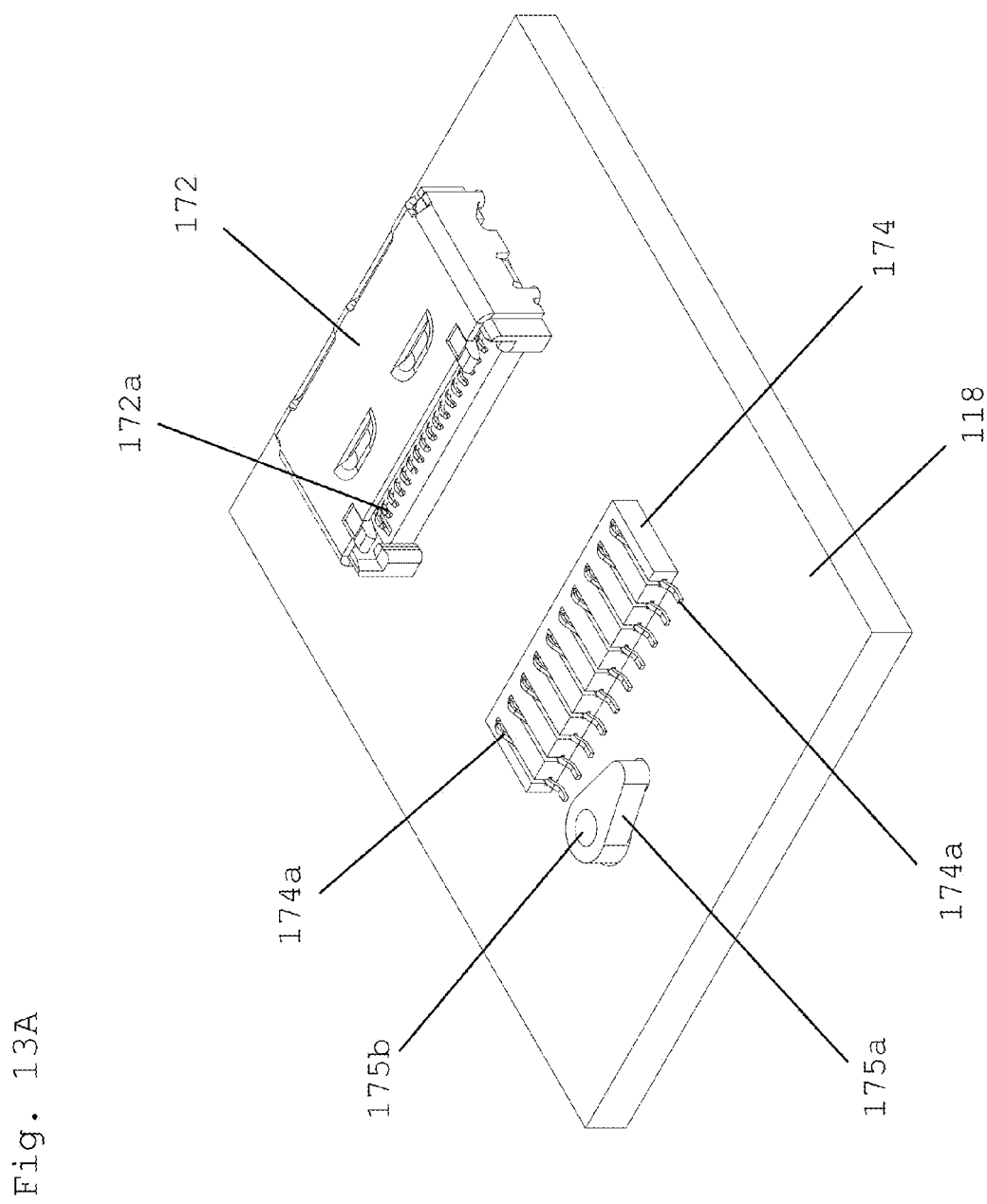

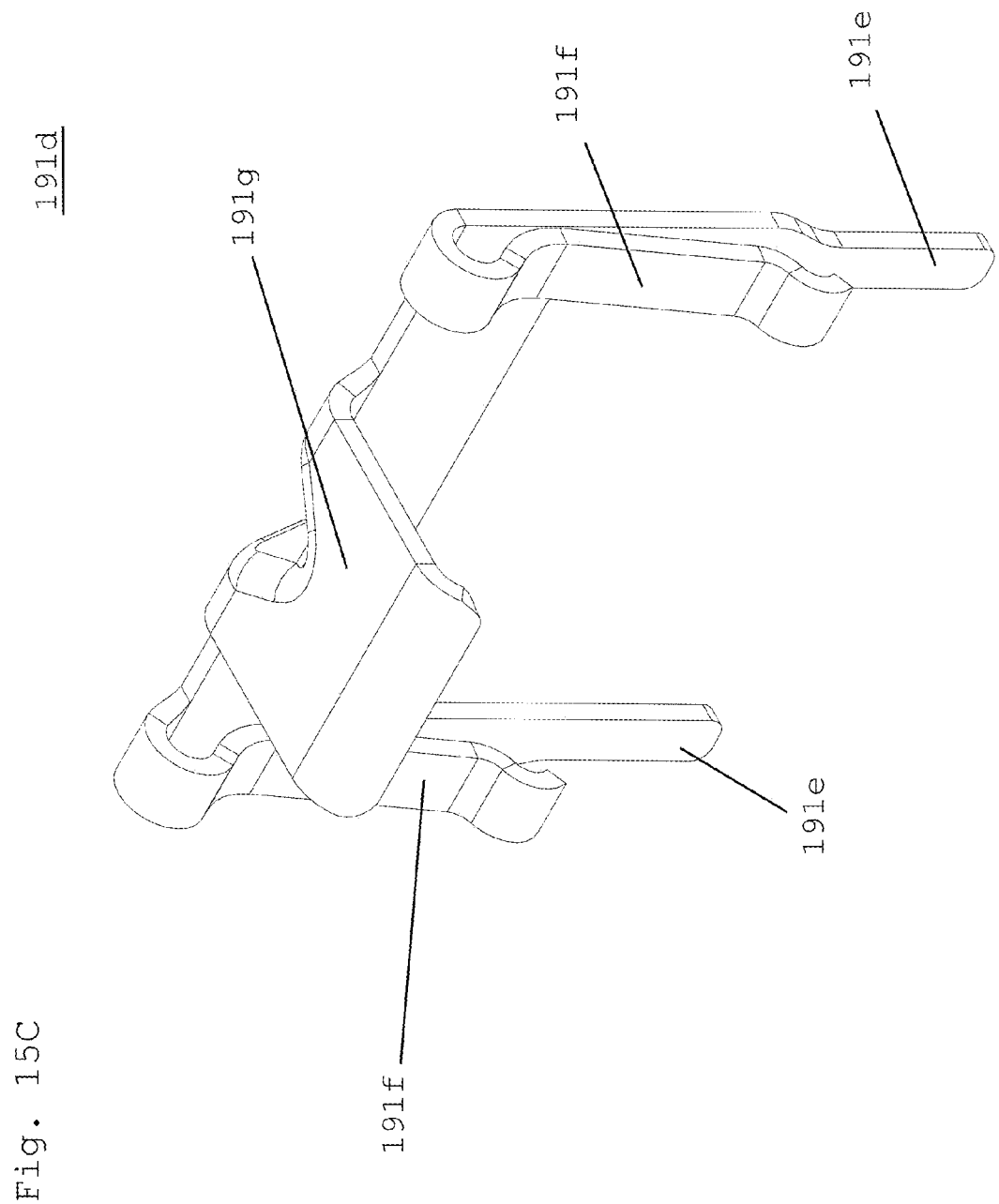

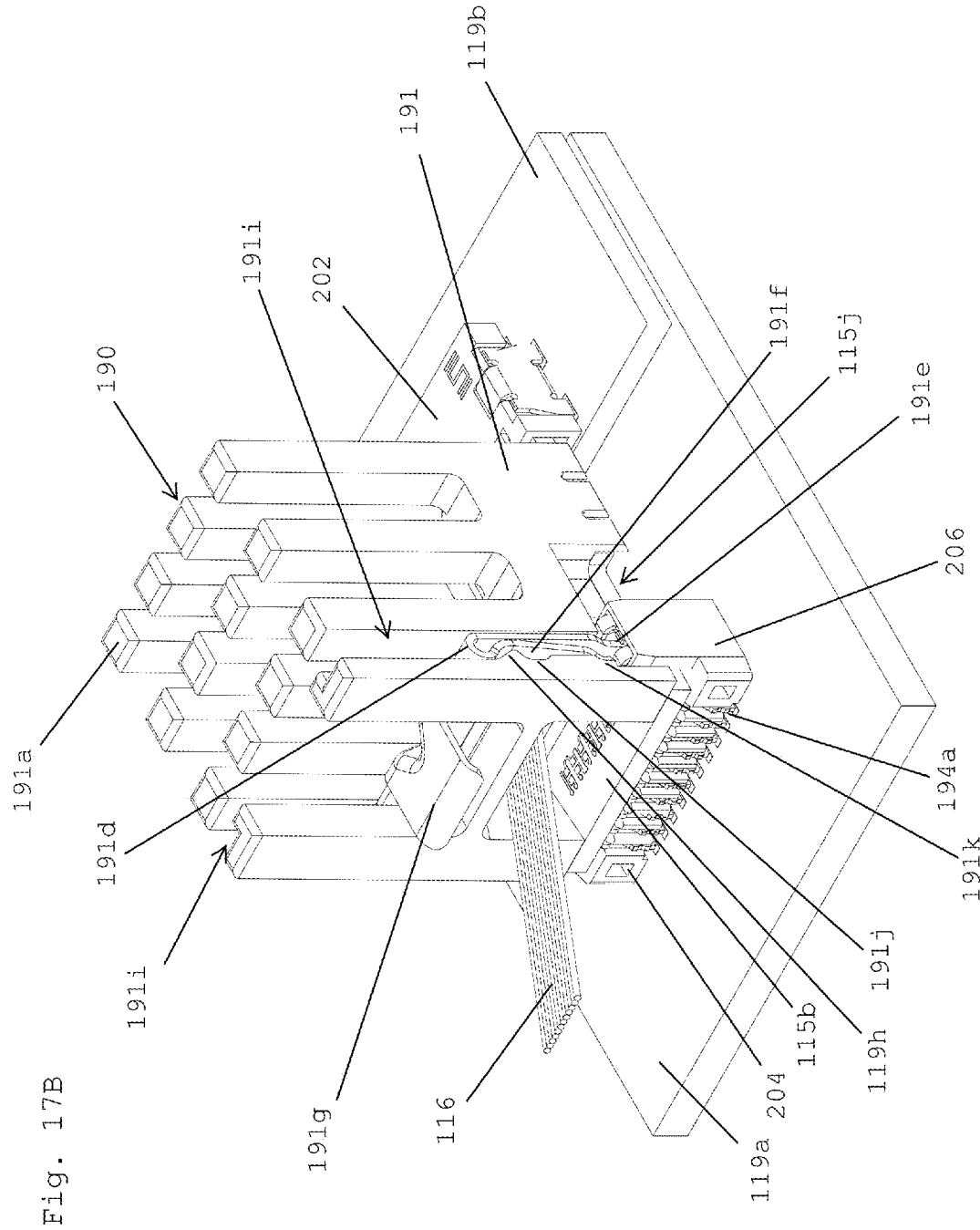

TRANSCEIVER AND INTERFACE FOR IC PACKAGE

BACKGROUND OF THE INVENTION

1. Field of the Invention

The present invention relates to transceivers and IC packages. More specifically, the present invention relates to transceivers that can be directly plugged into an IC package.

2. Description of the Related Art

FIG. 18 shows a conventional transceiver 500 and a conventional integrated circuit (IC) package 504. The transceiver 500 is connected to a socket 501 on a printed circuit board (PCB) 503. The IC package 504 is connected to the PCB 503 through solder balls 504a. The IC package 504 is a ball grid array (BGA). The IC package 504 is connected to the socket 501 by traces 502 located on or in the PCB 503. The transceiver 500 includes an optical engine that provides optical-to-electrical and electrical-to-optical conversion. That is, the electrical signals received from the IC package 504 are converted to optical signals that are transmitted through the optical fiber cable 500a, and all optical signals received through the optical fiber cable 500a are converted to electrical signals and are transmitted to the IC package 504 through the traces 502 on the PCB 503 and the solder balls 504a.

Increased bandwidth demands make it difficult to transmit data to and from IC packages over copper connections, including the traces 502 shown in FIG. 18. Signals to and from the IC package have to travel over a long distance. For example, an electrical signal transmitted by an IC die (not shown in FIG. 18) of the IC package 504 has to be transmitted through an IC circuit board (not shown in FIG. 18), through solder balls 504a, along traces 504 on the PCB 503 to the socket 501, and finally to the transceiver 500 where the electrical signals are converted to optical signals and transmitted through the optical fiber cable 500a. Optical signals transmitted from the optical fiber cable 500a to the transceiver 500 must follow the same lengthy path, but in reverse. The length of this path can reach up to 20 inches. High-end applications, such as switches, can use many transceivers, in which the optical and electrical signals for each of the transceivers must travel similarly lengthy paths. This approach as shown in FIG. 18 with a lengthy path has many drawbacks, including:

1. Requiring more power to amplify or recover the data signals, which increases the bit error rate and which creates some limitations in the placements of components on the PCB, because data signals have to travel over lossy copper traces on a PCB.
2. Increasing costs by increasing the number of components, including connectors, transceiver cages, housing, etc. and requiring a larger number of BGA connections between the IC package and the PCB because all the data signals have to be transmitted to and from the BGA of the IC package.

Known transceivers, including the conventional transceiver 500 shown in FIG. 18, cannot be adapted for connecting directly to an IC package because known transceivers are not small enough or have adequate mechanical retention. Known transceivers require a large amount of space and consume hardware to mate or dock the optical engine. Known transceivers cannot be adapted to both on-board and ball grid array (BGA) stepped-plane environments. Size and geometry of known transceivers is limited by interference from low-speed signals and power signals being carried in the same transceiver as the high-speed signals.

Known LGA connector systems require additional hardware to mate and operate, including, for example, springs, fasteners, latch bars or levers, latches for heat sinks. This hardware applies even compression pressure over the top of connector systems. Springs are typically used to allow for thermal expansion while applying and distributing force. Added hardware is typically used for alignment and ease of installation for electrical, optical alignment, and mechanical reasons.

FIG. 19A shows a known IC package 514 that includes a socket 510 that includes a multi-fiber push-on (MPO) 511. The IC package 514 also includes an IC die 515 and a circuit board 516 with solder balls 516a. MPO 511 is an optical connector in which optical signals are inputted and outputted. All the optical components, including those that convert optical signals to electrical signals and convert electrical signals to optical signals, must be located in the IC package 514 and cannot be easily replaced if they fail. That is, the IC package 514 must include, in addition to MPO 511, a converter that converts optical signals to electrical signals and that converts electrical signals to optical signals, which increases the size and cost of the IC package 514. Because the converter must be included in the IC package 514 when it is manufactured, the converter must also be able to tolerate the reflow temperatures used when the IC package 514 is connected to host circuit board (not shown in FIGS. 19A and 19B). Further, the IC package fails if either the IC die 515 or the converter fails. FIG. 19B shows a conventional modification of the IC package 514 shown in FIG. 19A in which the conventional IC package 524 includes a socket 520 located on the opposite side of the IC package 524 as the MPO 521. The socket 520 and the MPO 521 are connected by fiber optic cables 527. The IC package 524 includes an IC die 525 and a circuit board 526 with solder balls 526a. Because MPO 511 is an optical connector, MPO 511 is more expensive than a copper connector, and is sensitive to dust and other contamination. MPO 511 also requires expensive precision mechanical latching to ensure proper alignment of the optical connector that mates with the MPO 511. The mechanical latching causes the MPO 511 to be sensitive to mechanical stress on the fibers connected to the MPO 511, which can create optical misalignment. The IC package 514 requires more stringent stiffness requirements compared to IC packages that can be used with copper connectors. In addition, the IC package 514 cannot be tested electrically during production because only a very expensive optical tester can be used.

Known transceivers, which typically include an optical engine and typically use pluggable connectors, are not designed to be directly connected to an IC package. Known transceivers are not small enough or have adequate mechanical retention. Known transceivers require a large amount of space and require hardware to mate or dock the optical engine. Known transceivers cannot be adapted to both on-board and ball grid array (BGA) stepped-plane environments.

Typical transceivers have a single electrical connector that transmits all of the high speed signals, the low speed signals, and the power and ground signals, which limits miniaturization of the transceiver. Known IC package connector systems require additional hardware to mate and operate, including, for example, springs, fasteners, latch bars or levers, latches for heat sinks. This hardware applies even compression pressure over the top of the connector systems. Springs are typically used to allow for thermal expansion while applying and distributing force. Added hardware is typically used for alignment and ease of installation for electrical, optical alignment, and mechanical reasons.

SUMMARY OF THE INVENTION

To overcome the problems described above, preferred embodiments of the present invention provide a transceiver that can be plugged directly into an IC package. Because the transceiver includes an optical engine that can be unplugged from the IC package, none of the optical components need to be located within the IC package.

An interconnect system according to a preferred embodiment of the present invention includes a host circuit board, an IC package connected to the host circuit board and including a first connector, an IC circuit board, and an IC die, a transceiver including an optical engine arranged to convert optical signals into electrical signals and arranged to convert electrical signals into optical signals. The transceiver is arranged to mate with the first connector so that at least some electrical signals transmitted to and from the IC die are transmitted only on or through the IC circuit board.

The IC circuit board preferably includes a plurality of solder balls arranged in a ball grid array. The interconnect system preferably further includes a second connector connected directly to the host circuit board and arranged to connect the transceiver directly to the host circuit board so that at least some electrical signals received by the transceiver are transmitted directly to the host circuit board. The second connector preferably is a zero-insertion-force connector. The second connector can include a latch that is arranged to connect the transceiver to the second connector. The second connector can include a clip that is arranged to connect the transceiver to the second connector. The second connector and the transceiver can be connected with a screw, for example.

The first connector is preferably an edge-card connector. The transceiver preferably further includes a heatsink. The transceiver preferably further includes a transceiver circuit board, and the heatsink preferably includes a pair of legs that are arranged to connect the transceiver circuit board to the heat sink, preferably includes a pair of protrusions and a strap that are arranged to connect the transceiver circuit board to the heat sink, or preferably includes a pair of opposing clips that are arranged to connect the transceiver circuit board to the heat sink. The transceiver is preferably connected to the host circuit board with a screw, for example.

The IC package preferably further includes a lid. The lid preferably provides a heat path for the optical engine when the transceiver is mated with the first connector. The transceiver preferably includes a cable through which the transceiver receives and transmits optical signals. The optical signals are preferably converted to electrical signals and transmitted to the IC package through the first connector. The electrical signals are preferably further transmitted to the IC die through the first connector and the IC circuit board. The electrical signals are preferably transmitted directly to the host circuit board through a second connector connected to the host circuit board. The transceiver preferably includes a cable through which the transceiver receives and transmits electrical signals.

The IC package preferably includes at least one additional first connector.

An interconnect system according to a preferred embodiment includes a first circuit board, first and second connectors connected to the first circuit board, and a transceiver including an optical engine and arranged to receive and transmit optical signals through a cable, to convert optical signals received from the cable into electrical signals, and to convert electrical signals received from the first connector into optical signals to be transmitted through the cable. The transceiver is arranged to mate with the first and second connectors so that at least some converted electrical signals are transmitted to the first connector and so that at least some electrical signals received from the cable are transmitted to the second connector.

The first connector can be connected to the first circuit board through a second circuit board. The transceiver is preferably arranged to receive and transmit electrical signals through the cable. The cable is preferably permanently attached to the transceiver.

A system according to a preferred embodiment of the present invention includes a host circuit board, a package including first and second connectors, and a third connector connected to the host circuit board but not connected to the package. The package is surface mounted to the host circuit board through the first connector. The second connector is connected to the package but is not connected to the host circuit board. The system can transmit electrical signals or only optical signals or both electrical and optical signals.

The system preferably further includes a transceiver including a fourth connector arranged to mate with the second connector, an interface arranged to mate with the third connector, a cable including at least one optical fiber, and an optical engine arranged to convert at least some electrical signals received from the second connector into optical signals and transmit the converted optical signals to the at least one optical fiber and arranged to convert optical signals received from the at least one optical fiber into electrical signals and transmit the converted electrical signals to the second connector. The cable is preferably permanently attached to the optical engine.

The transceiver preferably includes at least one copper cable that is permanently attached to the fourth connector.

The third connector preferably provides mechanical retention for the transceiver. The third connector provides latching for the transceiver. The third connector preferably provides electrical connections between the transceiver and the host circuit board without going through the package. The third connector provides electrical connections between the transceiver and the host circuit board without going through the package and provides mechanical retention.

The above and other features, elements, characteristics and advantages of the present invention will become more apparent from the following detailed description of preferred embodiments of the present invention with reference to the attached drawings.

BRIEF DESCRIPTION OF THE DRAWINGS

FIGS. 2C and 2D show a lid for use with an IC package according to the first and second preferred embodiments of the present invention.

FIGS. 5A and 5B shows a transceiver for use with the third through eighth preferred embodiments of the present invention.

FIGS. 7A and 7B show a circuit board and a transceiver according to the third preferred embodiment of the present invention.

FIGS. 8A and 8B show a circuit board and a transceiver according to the fourth preferred embodiment of the present invention.

FIGS. 11A-11D show circuit boards and transceivers according to the sixth preferred embodiment of the present invention.

FIGS. 12C and 12D show a transceiver with a heatsink for use with the seventh and eighth preferred embodiments of the present invention.

FIGS. 13A and 13B show a circuit board and a transceiver according to the seventh preferred embodiment of the present invention.

FIG. 15C and 15D show a U-clip for use with the ninth and tenth preferred embodiments of the present invention.

FIGS. 17A and 17B show a circuit board and a transceiver according to the tenth preferred embodiment of the present invention.

DETAILED DESCRIPTION OF PREFERRED EMBODIMENTS

Figure 1A:
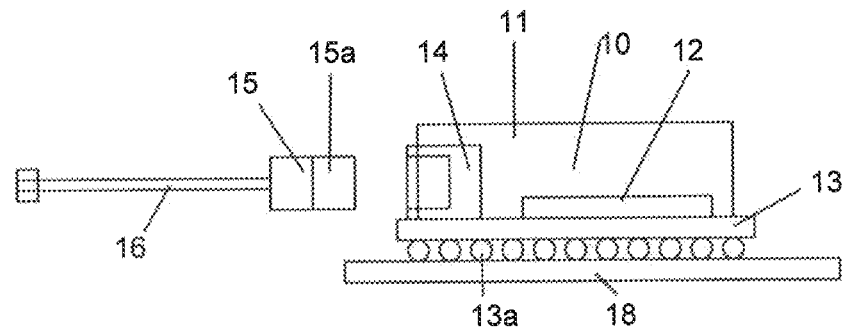
FIG. 1A is a conceptual drawing of an IC package and a transceiver according to a preferred embodiment of the present invention before being mated together.
Figure 1B:
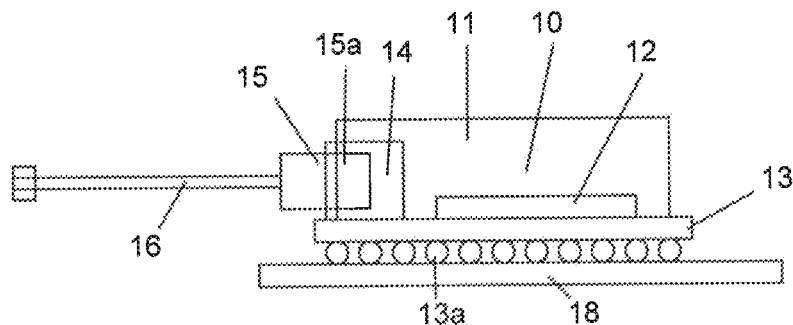
FIG. 1B is a conceptual drawing of an IC package and a transceiver according to a preferred embodiment of the present invention mated together.

FIGS. 1A-1E are conceptual drawings of the IC package 10 and the transceiver 15 according to a preferred embodiment of the present invention. FIG. 1A shows an IC package 10 and a transceiver 15 before being mated together, while FIG. 1B shows the IC package 10 and the transceiver 15 mated together. The IC package 10 includes an IC die 12 and an enclosure (e.g., lid 11 and circuit board 13) for protecting the IC die 12 and electrical contacts (e.g., solder balls 13a) for transmitting electrical signals in a larger overall system. The transceiver 15 includes an optical engine 15a and is connected to cable 16. The cable 16 preferably includes a plurality of fiber optic cables. It is also possible for the cable 16 to include, in addition to fiber optic cables, one or more copper cables. The optical engine 15a converts optical signals into electrical signals and electrical signals into electrical signals. The optical engine 15a is preferably a pluggable optical engine that includes 4, 8, or 12 channels and that can be surface mountable. However, the optical engine 15a can have any number of channels. Although current channels have a maximum speed of about 10 Gbps, higher maximum speeds will be achievable in the future, and thus the speed of the channels of the optical engine 15a is not limited. The optical engine 15a can be surface mountable. Examples of the optical engines 15a are disclosed in U.S. Pat. Nos. 7,329,054; 7,648,287; 7,766,559; and 7,824,112; U.S. Patent Application Publication Nos. 2008/0222351, 2011/0123150, and 2011/0123151; and U.S. Application No. 61/562,371, the entirety of the contents of which are hereby incorporated by reference.

Figure 1C:
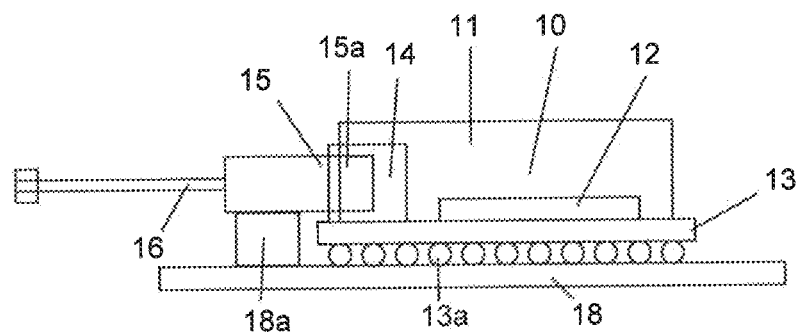
FIG. 1C is a conceptual drawing of an IC package and a transceiver according to a preferred embodiment of the present invention mated together.

FIG. 1C shows a modification of the arrangement of the IC package 10 and transceiver 15 shown in FIGS. 1A and 1B in which a connector 18a connects the transceiver 15 directly to the host circuit board 18, without going through the IC package 10. In this arrangement, signals can be transmitted directly to the host circuit board 18 without going through the IC package 10.

If the cable 16 includes one or more copper cables, then power can be transmitted through the transceiver 15. The power can be transmitted to/from the IC package 10 or could be transmitted directly to/from the host circuit board 18 through the connector 18a. If power is transmitted directly the host circuit board 18, then it is possible that the power can be further transmitted to the IC package 10.

It is also possible to transmit signals through the copper cables directly to the host circuit board 18 without going through the IC package 10. It is also possible for the optical signals to be transmitted through the cable 16. It is also possible for the optical signals to be converted into electrical signals, and for the converted electrical signals to be transmitted directly to the IC package 10 through socket 14 and/or directly to the host circuit board 18 through the connector 18*a*.

The IC package 10 shown in FIGS. 1A-1C preferably is a BGA package; however, the IC package 10 could be any suitable package type, including flip-chip BGA package, dual in-line package, pin grid array package, leadless chip carrier package, surface mount package, small-outline IC package, plastic leaded chip carrier package, plastic quad flat pack package, or thin small-outline package. The IC package 10 preferably includes a lid 11, an IC die 12, a circuit board 13, and a socket 14. The lid 11 can act as a heat sink for both the IC package 10 and the transceiver 15 and preferably covers the IC die 12, at least a portion of the circuit board 13, and at least a portion of the socket 14. It is possible to use a separate heatsink (not shown in FIGS. 1A-1C) instead of or in addition to the lid 11. The lid 11 can be arranged to ensure that the transceiver 15 is pressed in the socket 14.

Although only one IC die 12 is shown in FIGS. 1A-1C, it is possible to use two or more IC dies 12.

The circuit board 13 preferably includes solder balls 13*a* arranged in BGA for connecting the IC package 10 to the host circuit board 18. The socket 14 preferably extends through an opening through the lid 11 so that the transceiver 15 can be mated with the socket 14, as shown in FIG. 1B. Although only one socket 14 and transceiver 15 are shown in FIGS. 1A-1C, it is possible to use two or more sockets 14 and transceivers 15. The sockets 14 can be located on the same side or different sides of the IC package 10.

Figure 1D:
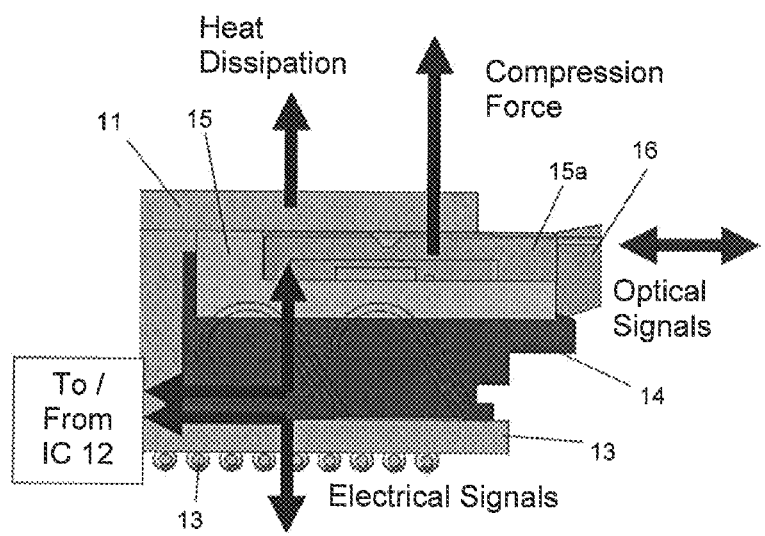
FIG. 1D is close-up sectional view of an IC package and a transceiver according to a preferred embodiment of the present invention.

The lid 11 of the IC package 10 preferably provides a path for heat dissipation, as shown in FIG. 1D. FIG. 1D is a close-up view showing a possible arrangement of the socket 14 and transceiver 15. In FIG. 1D, the lid 11 and the socket 14 provide a cavity such that, when the transceiver 15 is inserted into the socket 14, (1) the electrical connection between the transceiver 15 and the socket 14 is assured by the upward compression force of the electrical contacts and (2) the heat dissipates along the path provided between the transceiver 15 and the lid 11. There is a heat path directly from the transceiver 15 to the lid 11. As shown in FIG. 1D, optical signals can be transmitted to and from the transceiver 15 through cable 16, and electrical signals can be transmitted between the IC die 12 and transceiver 15 and between the IC die 12 and the host circuit board 18, which, although not shown in FIG. 1D, would be connected to the circuit board 13 through solder balls 13*a*.

Figure 1E:
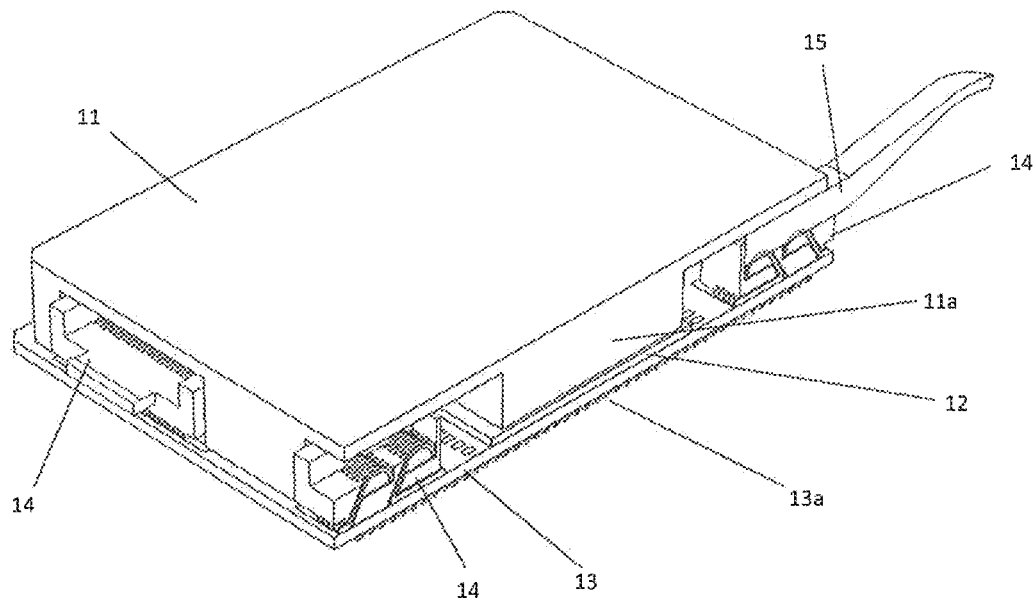
FIG. 1E is close-up view of an IC package and a transceiver according to a preferred embodiment of the present invention.

FIG. 1E is a sectional view of a possible arrangement of the transceiver 15 and the IC package 10. FIG. 1E shows the IC package 10 preferably including four sockets 14, for example, three of which are shown in the figure. One of the sockets 14 can be arranged along the upper right surface of the lid. The IC package 10 includes an IC die 12 located on a circuit board 13 that includes solder balls 13*a*. The lid 11 includes a finger 11*a* that provides a heat path from the IC die 12 to the lid 11. As with FIG. 1D, the socket 14 in FIG. 1E is arranged to provide a cavity such that, when the transceiver 15 is inserted into the cavity, a heat path is provided from the transceiver 15 to the lid 11. That is, the lid 11 provides heat paths for both the IC die 12 and the transceiver 15.

Using the IC package 10 and the transceiver 15 it is possible to transmit some or all of the data signals from the cable 16 to the IC die 12 without transmitting the data signals through the solder balls 13*a* of the IC package 10 or through the host circuit board 18. Because of the proximity of the transceiver 15 to the IC die 12, the IC package 10 needs much lower output amplification of the data signals. Similarly in the transceiver 15, higher data rates are possible because of the limited amount of dispersion in the short electrical path between the transceiver 15 and the IC die 12. Lower product and packaging cost can be achieved because: 1) fewer BGA connections are required because some or all the high speed data signals are not routed through solder balls 13*a* of the IC package 10 or through the host circuit board 18, 2) less complexity of the host circuit board 18 and less cost because fewer data signals need to be routed through the solder balls 13*a* of the IC package 10 and the host circuit board 18. Increased data signal density can be achieved because of the miniaturization of the transceiver 15. The IC package 10 can be reflowed without the transceiver 15, so there is no need for the transceiver 15 to withstand reflow temperatures. That is, the transceiver 15 can be added after the IC package 10 is connected to the host circuit board 18.

The IC package 10 and the transceiver 15 can be tested separately, minimizing yield loss. The transceiver 15 can be replaced if it fails. Similarly, the transceiver 15 can be re-used after an IC package 10 is replaced. The optical connections can be re-routed without redesigning the host circuit board 18. The IC package 10 can be electrically tested using conventional methods. The transceiver 15 and cable 16 are added last, making handling easier and allowing greater manufacturing freedom because the IC package 10 does not include any optical fiber or cable extending from it.

The optical signals within the transceiver 15 and optical connections are preferably never exposed. Optical connectors have surfaces that can get dirty, which can make the optical connection not perform or have degraded performance. By not exposing the optical connections, proper performance can be assured. There are no fragile optical connections between the transceiver 15 and the IC package 10. Because optical connectors are expensive, it is possible achieve cost savings by reducing the number of optical connectors. The transceiver 15 and the socket 14 can be designed as standard components with standard interfaces and circuit board footprints. Packaging of new IC packages 10 only requires the redesign of the routing of circuit board 13, of the BGA layout, and of the lid 11 of the new IC package 10. No change in tooling or fixturing is required for the transceiver 15 or the socket 14.

The end opposite of the optical engine 15*a* of the transceiver 15 can be customized to use any suitable connector, including, for example, MPO, LC or FC fan-out, Prizm connector, other suitable transceiver(s), etc.

A multi-channel (e.g., 12 or other) half-duplex transceiver would also yield a highly modular system, allowing customization of the number of input and outputs (I/Os) for different ICs. Similarly, a single secondary electrical connector design could be used for a 12-channel half-duplex transceiver or a 4- to 6-channel full-duplex transceiver.

The transceiver 15 according to any of various preferred embodiments of the present invention can be inserted into a IC package 10 according to any of various preferred embodiments of the present invention and can include any of the following:

1. The socket 14 of the IC package 10 can be an electrical connector for connecting the transceiver 15 to the IC package 10.
2. The transceiver 15 shares the IC package's 10 heatsink(s).
3. The transceiver 15 has its own heatsink(s).
4. The transceiver 15 has electrical connections on one side and a thermal dissipation surface on another side.

5. The transceiver 15 is permanently attached to a single or a plurality of optical fibers.
6. The transceiver 15 can include an electrical connector as well as an optical connector for receiving an optical patchcord.

The IC package 10 can include data signal connection(s) that connect the IC die to the socket(s) 14, without going through the IC package 10 or the host circuit board 18. The IC packages 10 can include the data signal connections(s) that connect the host circuit board 18 directly to the socket(s) 14, without going through the IC die 22. This provides a simple socket design, which is useful for testing and/or manufacturing.

The IC package 10 might not have an IC die 12 inside and could just transmit data from the host circuit board 18 to the transceiver 15 and provide thermal management.

The transceivers 15 preferably are miniature/low-cost edge-connector-to-optical-engine board connectors, can be directly connected to an IC package, and are small, fast, less complicated, fewer parts or components, and have sufficient mechanical retention. The transceiver 15 preferably does not require a large amount of space for mating the optical engine 15a and preferably can be adapted to both on-board and ball grid array (BGA) stepped-plane environments. The transceiver 15 is preferably not limited by interference from low-speed signals and power signals being carried in the same transceiver 15 as the high-speed signals.

The transceiver 15 and IC package 10 preferably do not require additional hardware to mate and operate. The size of the transceiver 15 is preferably compatible with mating the transceiver 15 at the edge of an IC package 10. The transceivers 15 and IC packages 10 can be mated with little insertion force.

The connector system discussed above that only uses the socket 14 as shown in FIGS. 1A and 1B is a one-piece connector system. However, a two-piece connector system can also be used, as shown in FIG. 1C. The two-piece connector system includes, for example, the socket 14 and the connector 18a as shown, for example, in FIG. 1C. In the two-piece connector system, both the transceiver 15 and a high data rate transmission copper cables can be accommodated. The socket 14 can be an edge-card connector, and the connector 18a can be a zero-insertion-force compression connector so that the transceiver 15 is pushed into the socket 14, then pressed down with zero insertion force into the connector 18a. The transceiver 15 and the IC package 10 can be used with various latching features discussed below, but with no compression hardware required. Because there is no compression hardware required, installation is simplified, component count is reduced, and a more commercially viable solution is provided. The transceivers 15 are preferably capable of holding the weight of a heatsink (shown, for example, as heatsink 25c in FIG. 4B) required for the optical engine 15a.

The transceivers 15 can separate high-speed signals from low-speed signals and/or power. Preferably, the high-speed signals are located within portion of the transceiver 15 that mates with the socket 14, and the low-speed signals and/or power signals are located within the portion of the transceiver 15 that mates with the connector 18a. This separation of signals can simplify board implementation, can enhance signal integrity, and can result in less hardware being used.

Space on the IC package 10 is limited to the length, width, and height of the socket 14. Because less space is required, a less expensive and more widely usable and marketable solution is provided. The length of the socket 14 is preferably less than about 11.25 mm, for example, which allows multiple, for example, at least four, connections to an IC package 10. The socket 14 can be a 0.5 mm pitch edge-card connector, and the connector 18a can be a 0.8 mm pitch compression connector, for example.

The IC package 10 can be, for example, a typical field-programmable gate array (FPGA) package with sides having a dimension of about 45 mm, which allows for eight transceivers (four on each of two sides). The height of the socket 14 is comparable to the typical height of an IC package 10, including an FPGA package, which is usually within the range of about 0.75 mm to about 2.2 mm, for example. The socket 14 preferably has a depth that is as small as possible because the smaller the depth of the socket 14, the smaller the IC package 10 can be to accommodate the socket 14. Currently, the socket 14 with a depth of about 0.95 mm to about 2.45 mm, for example, is preferred; however, it is possible that in the future even smaller depths can be used.

The two-piece connector systems can be used in multiple environments, including a stepped-plane environment (e.g., BGA, LGA, and PGA applications) and a flat, co-planar environment (e.g., on-board applications in which the two connectors are on the same circuit board). In the stepped-plane environment, the two connectors are located on two different circuit boards. Preferably, the first circuit board is a host circuit board, and the second circuit board is included in an IC package with a BGA such that the top surface of the second circuit board is located above the top surface of the host circuit board, i.e., the second circuit board is stepped up with respect to the host circuit board. In the flat, co-planar environment, the two connectors are located on the same circuit board. This multiple environment use allows the two-piece connector system to be usable in multiple markets. There are no known solutions that allow direct mating to an IC package.

The two-piece connector system can separate high-speed signals from low-speed signals and/or power. The high-speed signals can be separated using, for example, a 0.50 mm pitch edge-card connector, and the low-speed signals and/or power can be separated using a 0.80 mm pitch compression connector.

The one-piece and two-piece connector systems can be used in any signal transmission system, including any multiple high-speed cables inside the box product using, for example, insulation-displacement connector (IDC), shielded IDC, twisted pair, shielded twisted pair, power, optical fiber (glass and plastic) flex, conductive elastomer, lead wire, shielded and unshielded cables, coaxial cables, twinaxial cables, and laminated micro-stripline and microstrip.

The first and second preferred embodiments of the present invention will now be described. The first and second preferred embodiments of the present invention are similar with the main difference being different connectors being used for the socket 14. In the first preferred embodiment, a land grid array (LGA) connector 24a is preferably used, and in the second preferred embodiment, an edge-card connector 24b is preferably used.

Figure 2A:
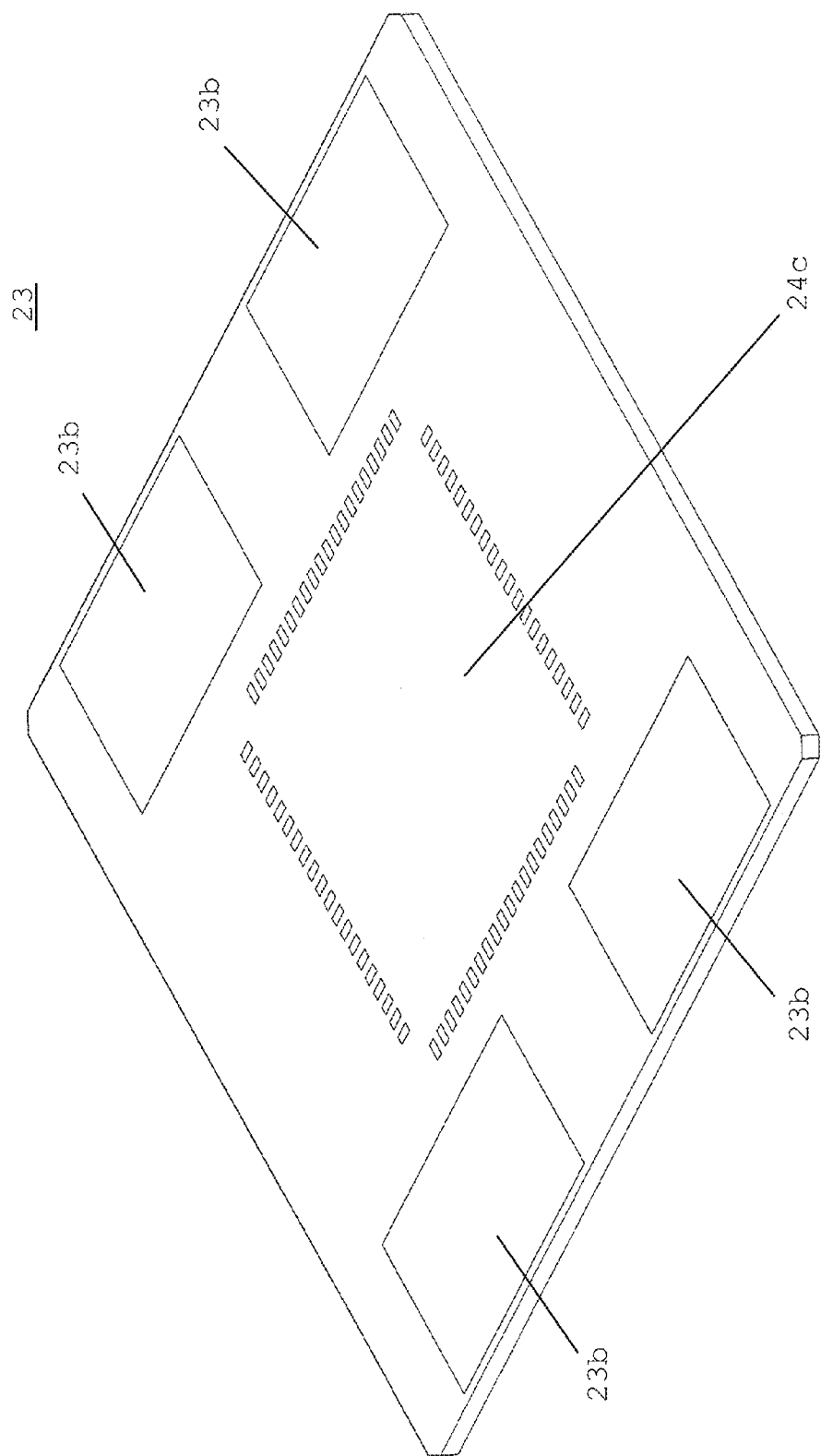
FIGS. 2A and 2B show a circuit board for use in an IC package according to the first and second preferred embodiments of the present invention.
Figure 2B:
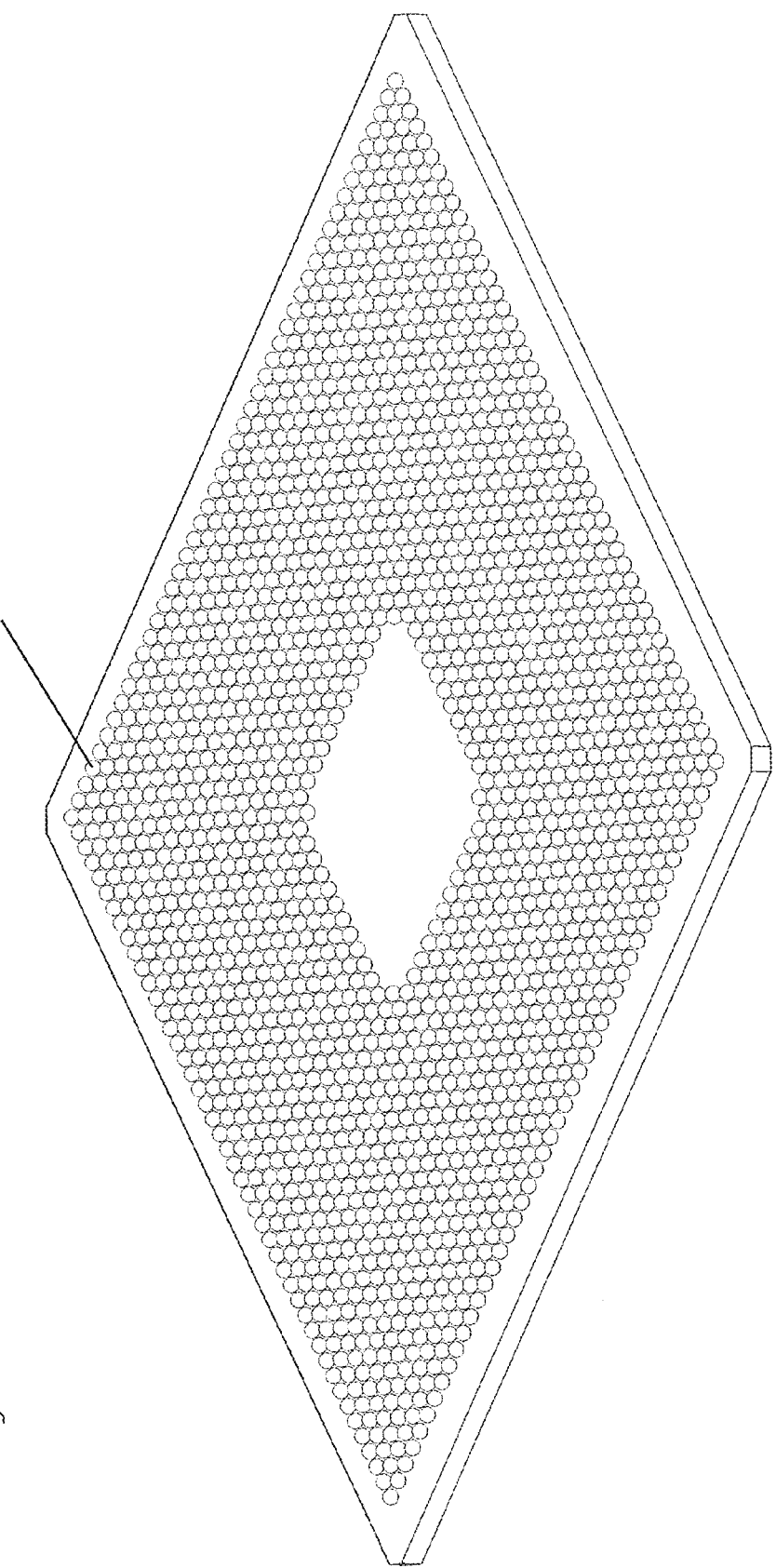
Figure 2C:
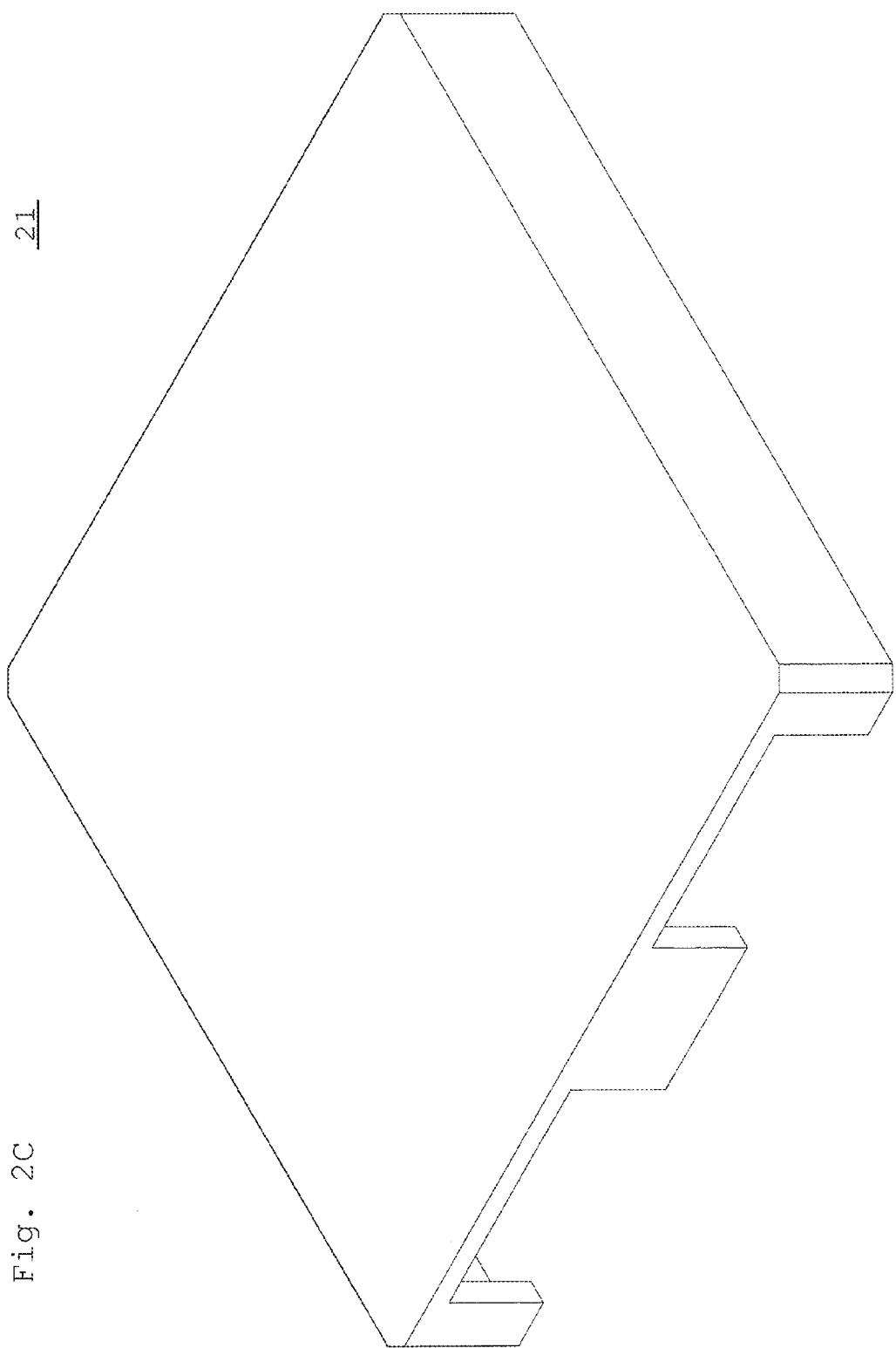

FIGS. 2A and 2B show a circuit board 23 for use with an IC package according to the first or the second preferred embodiment of the present invention, and FIGS. 2C and 2D show a lid 21 for use with an IC package according to the first or the second preferred embodiments of the present invention. As shown in FIG. 2A, the circuit board 23 includes areas 23b where LGA connector 24a (shown in FIG. 3A) or where edge-card connectors 24b (shown in FIG. 4A) corresponding to the socket 14 of FIGS. 1A-1E can be located. As with the sockets 14 discussed above, any number of LGA connectors 24a or edge-card connectors 24b can be used. The circuit board 23 also includes areas 23c where an IC die 22 (shown in FIGS. 3A and 4A) can be located. As shown in FIG. 2B, the back of the circuit board 23 includes an array of solder balls 23a.

FIGS. 2C and 2D show a lid 21 for covering the circuit board 23 shown in FIGS. 2A and 2B that can be used in either the first or second preferred embodiments. As seen in FIG. 2D, the bottom of the lid 21 preferably includes a finger 21a. The finger 21a is arranged to provide a heat path for the IC die 22 when the lid 21 covers the circuit board 23 and when the IC die 22 is placed in the area 23c of the circuit board 23. If two or more IC dies 22 are used, then the lid 21 can have two or more corresponding fingers 21a.

Figure 3A:
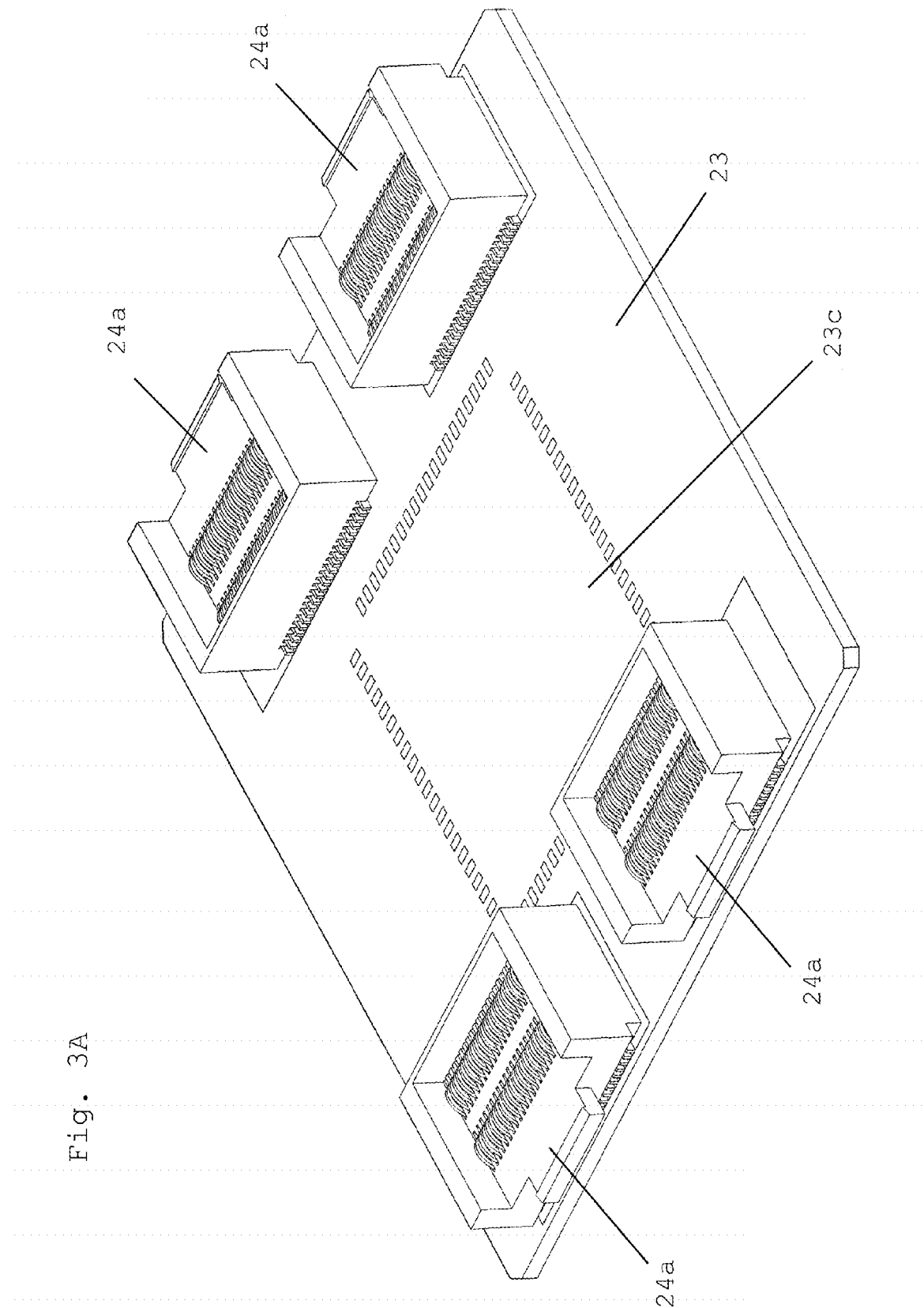
FIGS. 3A-3D show a transceiver and an IC package according to the first preferred embodiment of the present invention.

FIGS. 3A-3D show the transceiver 25 and the IC package 20 according to a first preferred embodiment of the present invention. FIG. 3A shows a circuit board 23 with four LGA connectors 24a, for example. Although FIG. 3A shows two pairs of LGA connectors 24a located on opposite sides of the circuit board 23, any number of LGA connectors 24a could be used and any arrangement of LGA connectors 24a could be used. For example, it is possible to arrange the four LGA connectors 24a on different sides of the circuit board 23 or to arrange the four LGA connectors 24a on the same side of the circuit board 23. The possible arrangements of the LGA connectors 24a are affected by the size of the circuit board 23 of the IC package 20. For example, it is possible that the circuit board's 23 size is small enough that only one LGA connector 24a will fit on a side of the circuit board 23. The LGA connectors 24a are arranged such that when the transceiver 25 is inserted into them the top of the optical engine 25a is pressed against the lid 21 to form a heat path in a similar manner as the heat path shown in FIG. 1D.

Figure 3B:
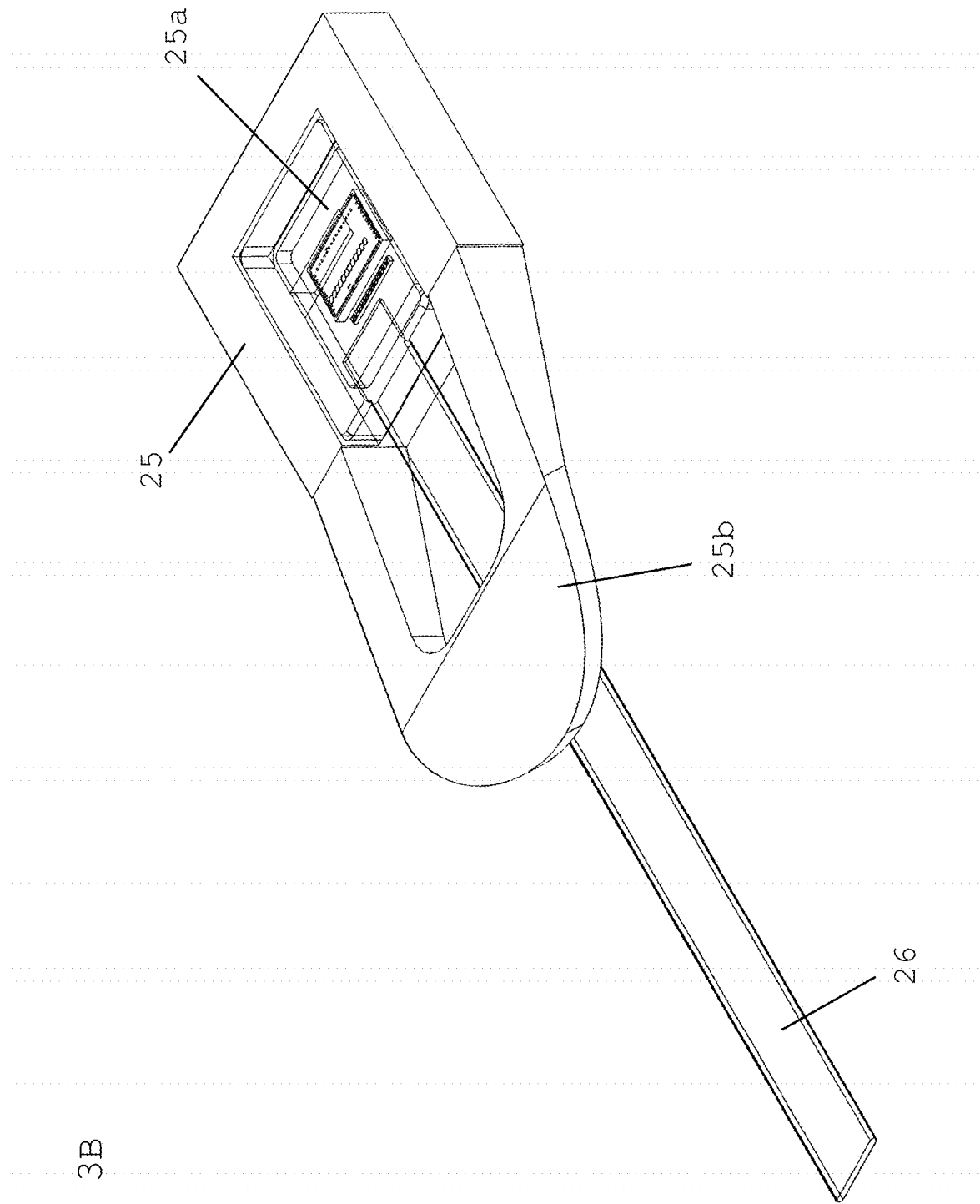
Figure 3C:
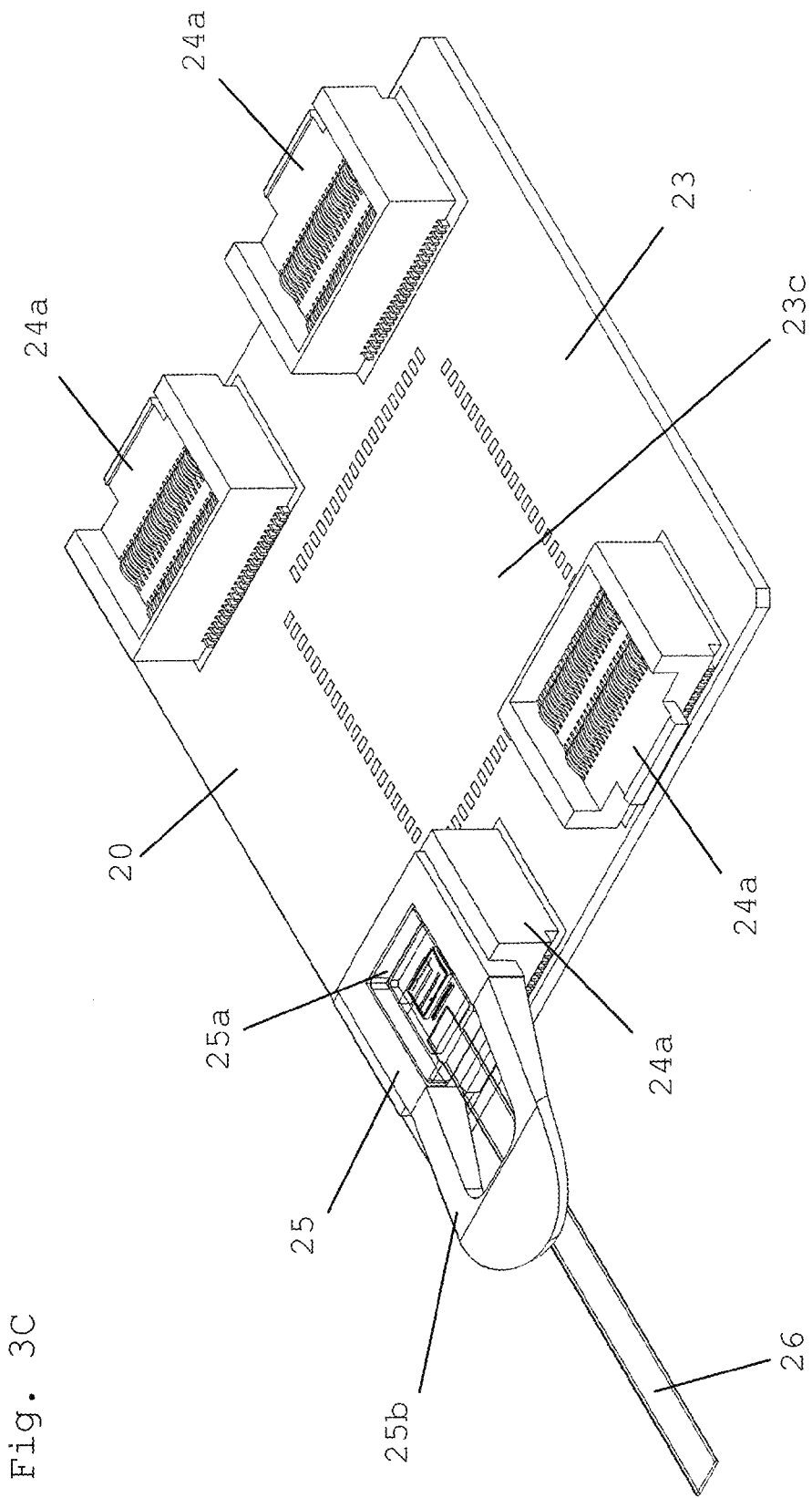

The circuit board 23 shown in FIGS. 3A and 3C does not include an IC die 22 in the area 23c. However, as explained above, a single IC die 22 could be used, or more than one IC die 22 could be used.

FIG. 3B shows a transceiver 25 that preferably includes a tab 25b. The tab 25b allows the transceiver 25 to be inserted and removed from the IC package 20. The transceiver 25 also includes an optical engine 25a that converts optical signals to electrical signals and converts electrical signals into optical signals. The optical engine 25a is connected to cable 26 that transmits optical signals. Cable 26 preferably includes one or more fiber optic cables.

Figure 3D:
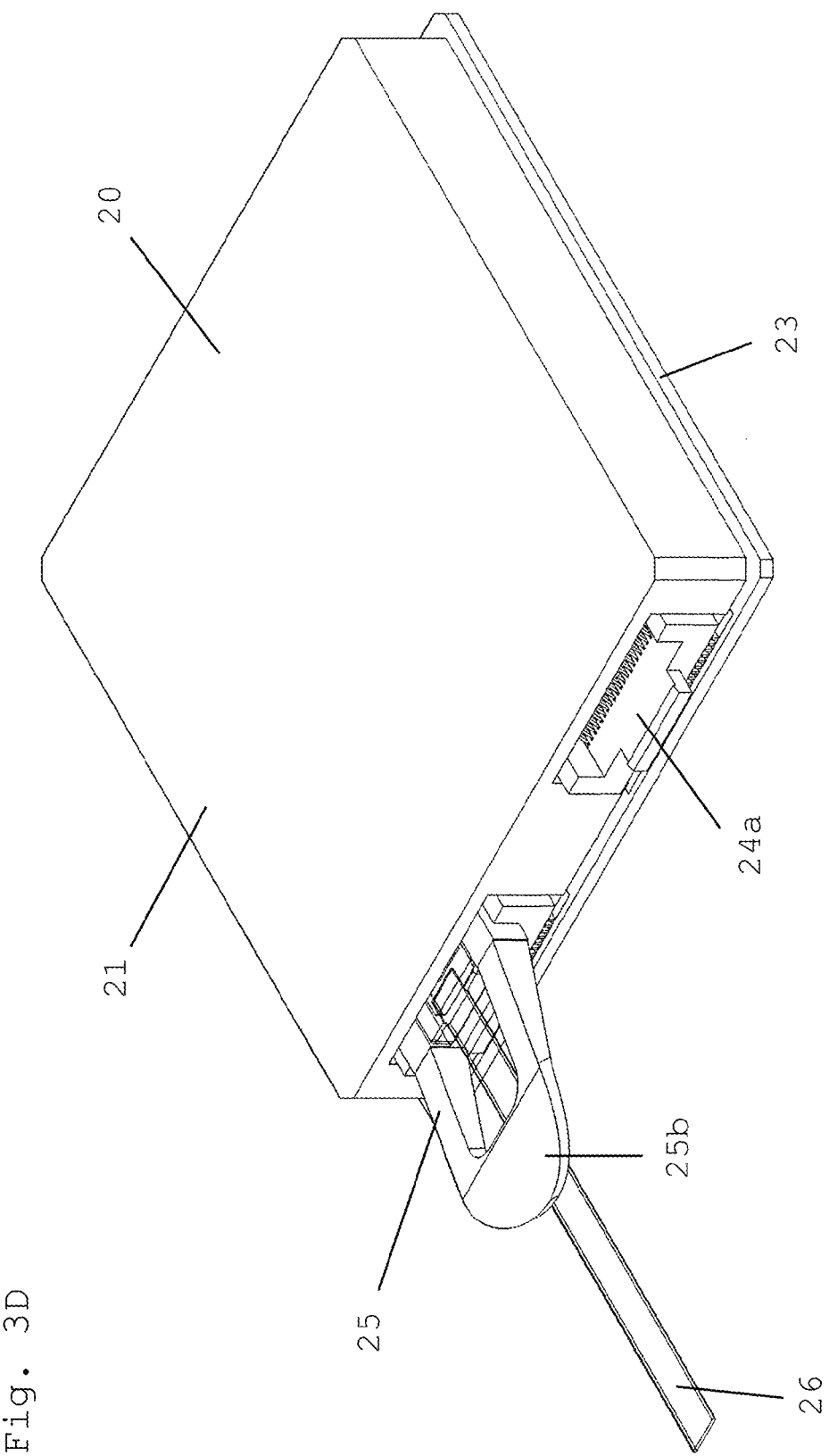

FIG. 3C shows the transceiver 25 inserted into the IC package 20, where the IC package 20 does not include the lid 21, and FIG. 3D shows the transceiver 25 inserted into the IC package 20, where the IC package 20 includes the lid 21. The optical engine 25a receives optical signals from the cable 26 and transmits the converted electrical signals to the IC die 22 through the LGA connector 24a and the circuit board 23, and the optical engine 25a receives electrical signals from the IC die 22 through the LGA connector 24a and the circuit board 23 and transmits the converted optical signals to the cable 26.

Figure 4A:
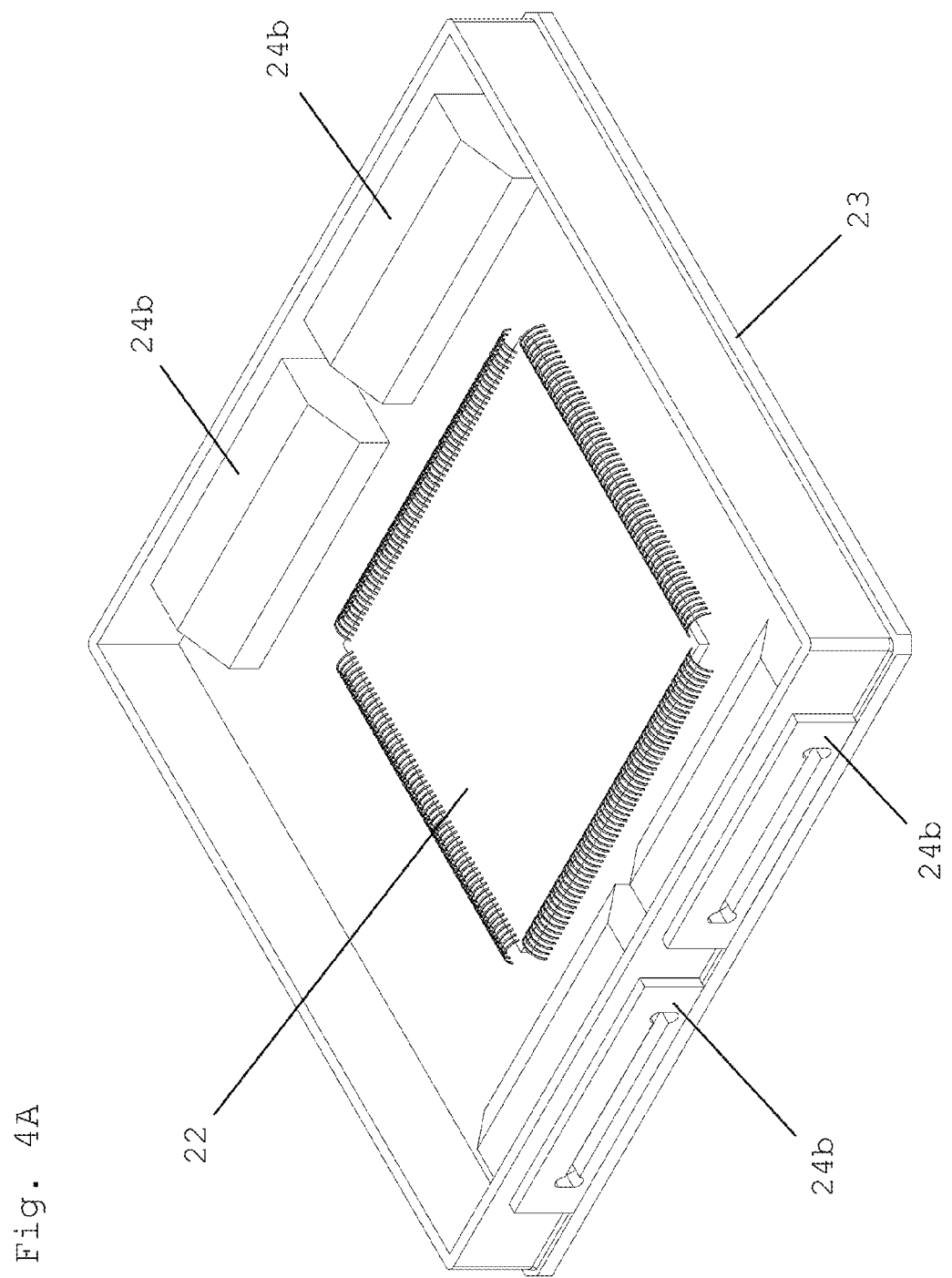
FIGS. 4A-4C show a transceiver and an IC package according to the second preferred embodiment of the present invention.
Figure 4B:
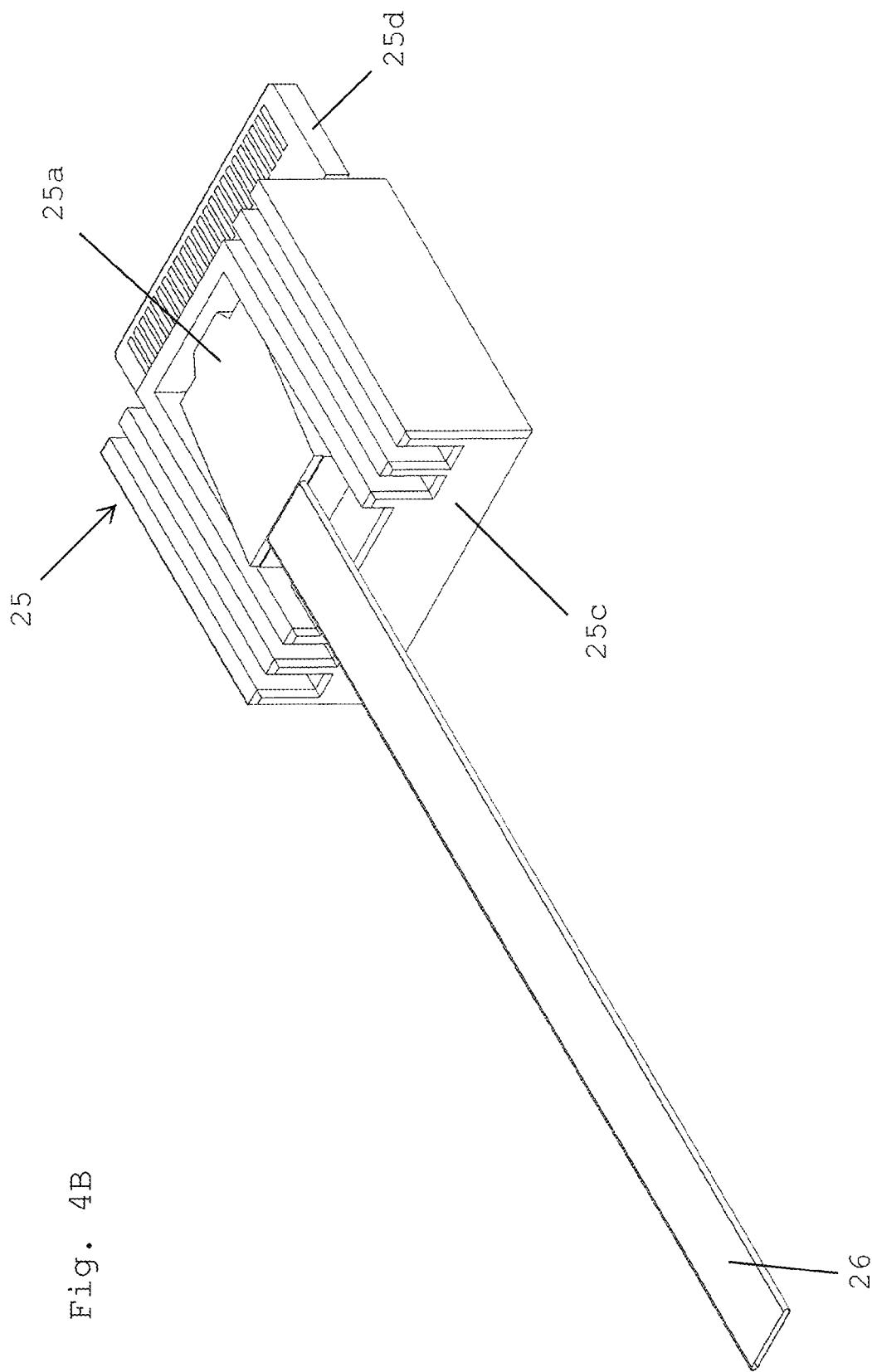
Figure 4C:
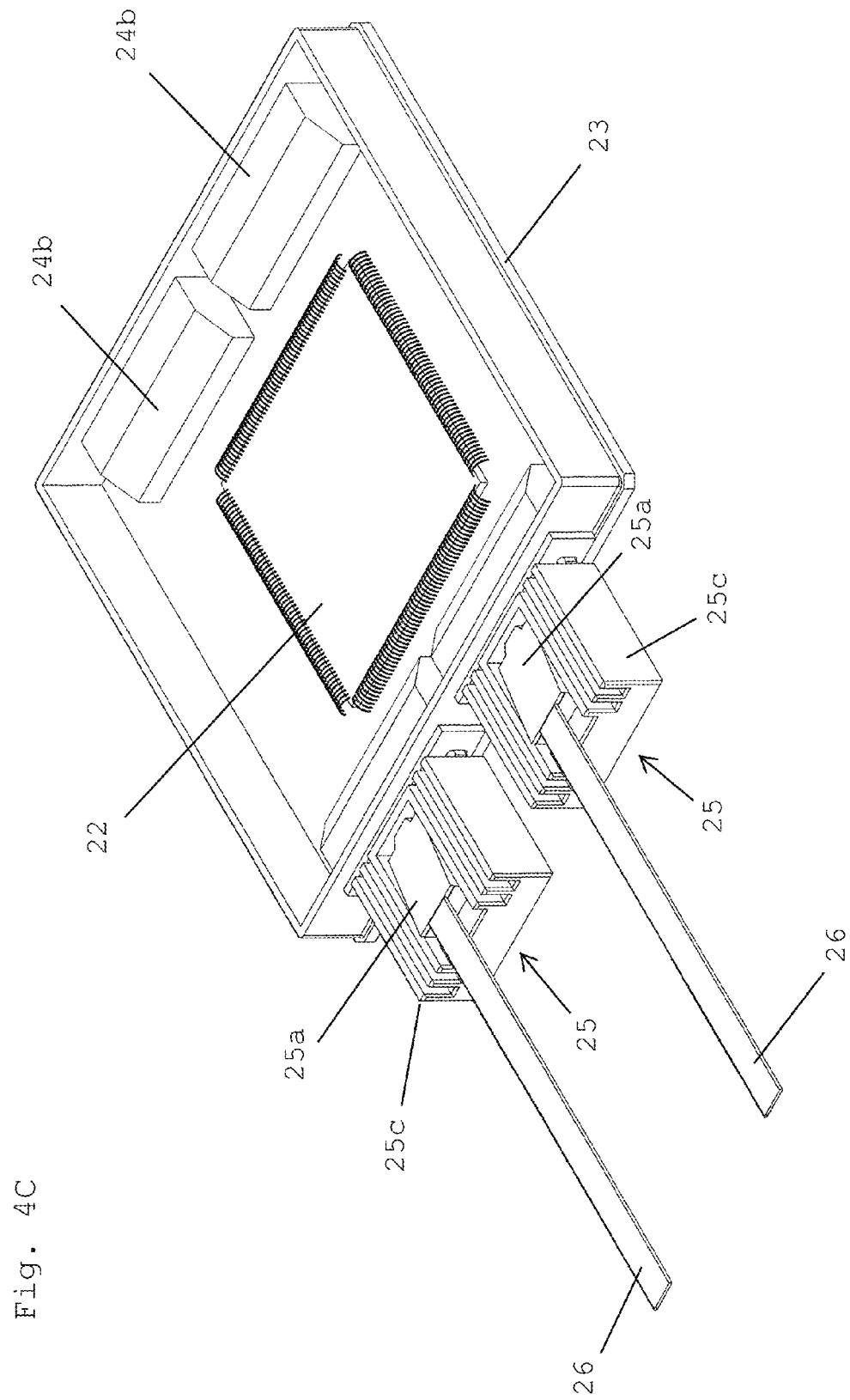

FIGS. 4A-4C show the transceiver 25 and the IC package 20 according to a second preferred embodiment of the present invention. In the second preferred embodiment, an edge-card connector 24b is used instead of LGA connector 24a, and a heatsink 25c is used instead of tab 25b. FIG. 3A shows a circuit board 23 with four edge-card connectors 24b, for example. As with the LGA connectors 24a, any number of edge-card connectors 24b could be used and any arrangement of edge-card connectors 24b could be used. The circuit board 25d can be inserted into the edge-card connectors 24b. In this preferred embodiment, the optical engine 25a is provided outside of the IC package 20. Because the optical engine 25a is outside of the IC package 20, the lid 21 cannot provide a heat path for the optical engine 25a. Accordingly, the transceiver 25 preferably includes the heatsink 25c to provide a heat path for heat dissipation for the optical engine 25a.

The circuit board 23 shown in FIGS. 4A and 4C includes an IC die 22 in the area 23c. However, as explained above, a single IC die 22 could be used, or more than one IC die 22 could be used.

FIG. 4B shows a transceiver 25 that preferably includes a heatsink 25c and circuit board 25d. The transceiver 25 includes an optical engine 25a that converts optical signals to electrical signals and converts electrical signals into optical signals. The heatsink 25c can be used to insert and remove the transceiver 25 from the IC package 20 and provides a heat path for heat dissipation from the optical engine 25a. The heatsink 25c can also protect the optical engine 25a and serve as a housing. The optical engine 25a is connected to cable 26 that transmits optical signals. Cable 26 preferably includes one or more fiber optic cables.

FIG. 4C shows the transceiver 25 inserted into the IC package 20, where the IC package 20 only includes the outer wall of the lid 21. The optical engine 25a receives optical signals from the cable 26 and transmits the converted electrical signals to the IC die 22 through the edge-card connector 24b and the circuit board 23, and the optical engine 25a receives electrical signals from the IC die 22 through the edge-card connector 24b and the circuit board 23 and transmits the converted optical signals to the cable 26.

The third through tenth preferred embodiments of the present invention will now be described. The third through tenth preferred embodiments of the present invention are similar to the above-described preferred embodiments of the present invention, with the main differences being the environment in which the transceivers are used and the method in which the transceivers are attached to the circuit board(s). The transceivers can be used in either a flat, co-planar environment with a single circuit board as shown, for example, in FIG. 5C or a stepped-plane environment with two circuit boards as shown, for example, in FIG. 5D. The transceivers can be attached to the circuit board(s) using latches 135, 145 as shown, for example, in FIGS. 7B and 8B, clips 155, 165 as shown, for example, in FIGS. 10C and 11C, screws 175 as shown, for example, in FIGS. 13B and 14B, or U-clip 191d as shown, for example, in FIGS. 16B and 17B. Some of the figures show connectors, e.g. front connector 152 in FIG. 10B, that, for simplicity, only include some of the contacts. It should be understood that the connectors can have a full set of contacts.

FIG. 5A shows an optical engine 115a connected to cable 116 that can be used with each of the third through tenth preferred embodiments. The transceiver 115 includes an optical engine 115a connected to a cable 116. The optical engine 115a is preferably a pluggable optical engine that includes 4, 8, or 12 channels and that can be surface mountable. However, the optical engine 115a can have any number of channels. Although current channels have a maximum speed of about 10 Gbps, higher maximum speeds will be achievable in the future, and thus the speed of the channels of the optical engine 115a is not limited. Examples of the optical engine 115a are disclosed in U.S. Pat. Nos. 7,329,054; 7,648,287; 7,766,559; and 7,824,112; U.S. Patent Application Publication Nos. 2008/0222351, 2011/0123150, and 2011/0123151; and U.S. Application Nos. 61/562,371, the entirety of which are hereby incorporated by reference.

Figure 5B:
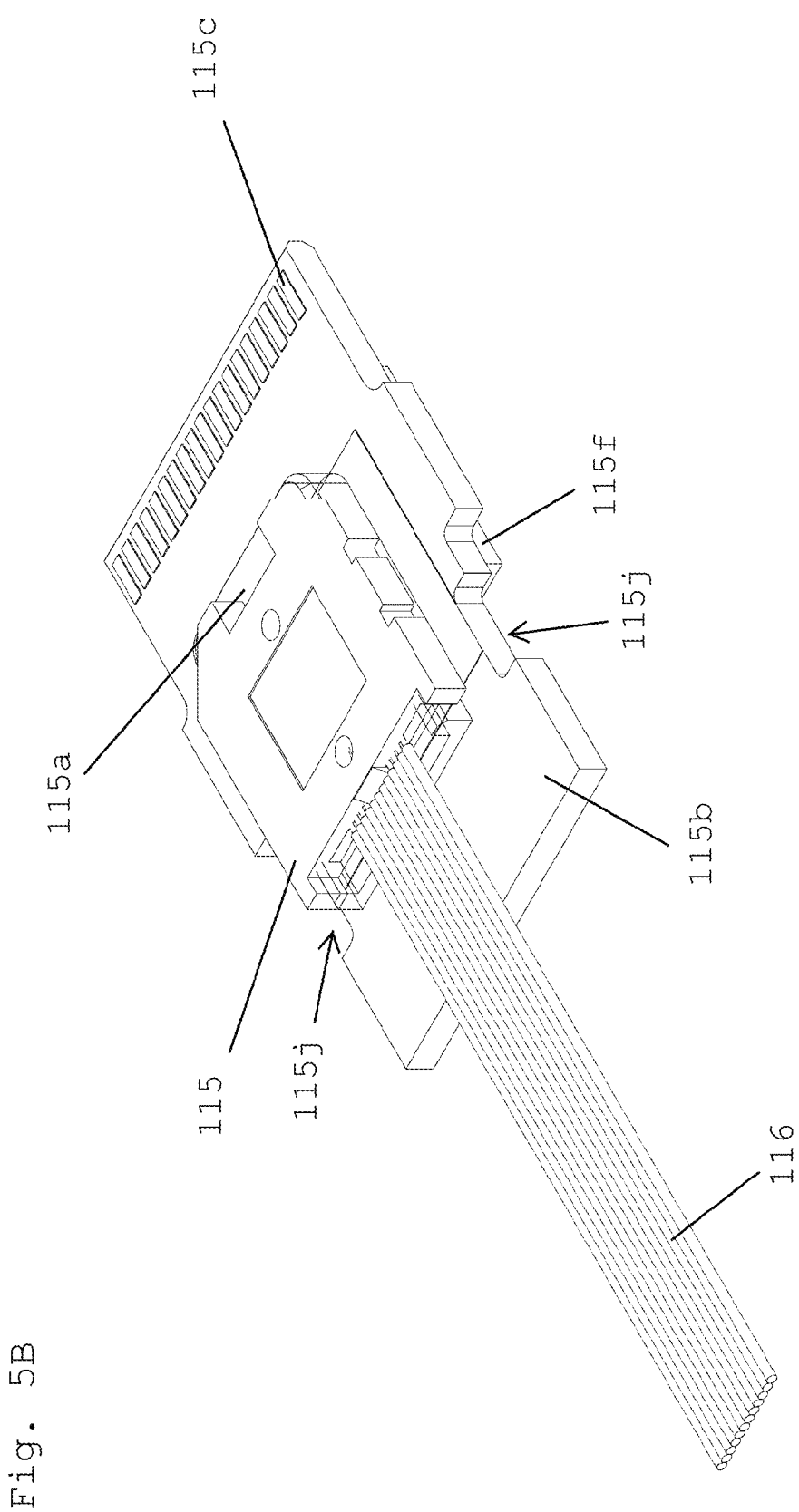

Cable 116 can include only one or more fiber optic cables, only one or more copper cables, or a combination of one or more fiber optic cables and one or more copper cables. FIG. 5B shows the optical engine 115a with a circuit board 115b. The transceiver 115 includes a heatsink (not shown in FIG. 5B) that is used to dissipate the thermal load. The circuit board 115b preferably includes lands 115c, 115d, 115e (only land 115c on the top of the circuit board 115b is shown in FIG. 5B) and an IC chip 115f. The IC chip 115f can route and/or modify the electrical signals transmitted to and from the transceiver 115, including conditioning the electrical signals for protocol specific data transfers. Lands 115d, 115e are located on the bottom of the circuit board 115b. Lands 115d are located on the bottom of the circuit board 115b opposite of the lands 115c. Lands 115e are located on the bottom of the circuit board 115b, near the end of the circuit board 115b opposite to the end with the lands 115d, 115e. The circuit board 115b can also include notches 115j that can be used with the latches 135 of the third and fourth preferred embodiments to connect the circuit board 115b to the back connectors 134, 144 as discussed below.

Figure 5C:
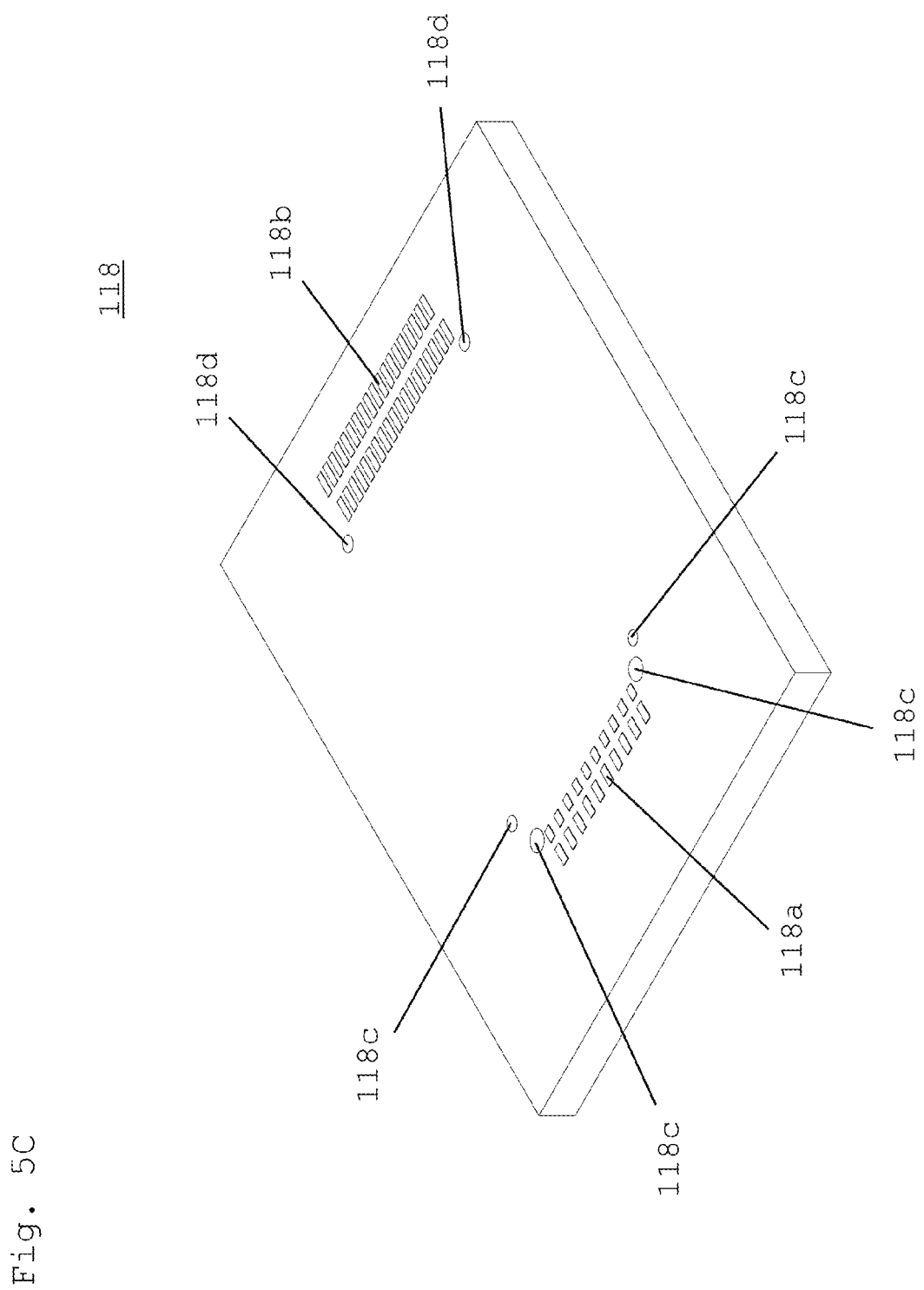
FIG. 5C is a circuit board for use with the third, fifth, and seventh preferred embodiments of the present invention.
Figure 5D:
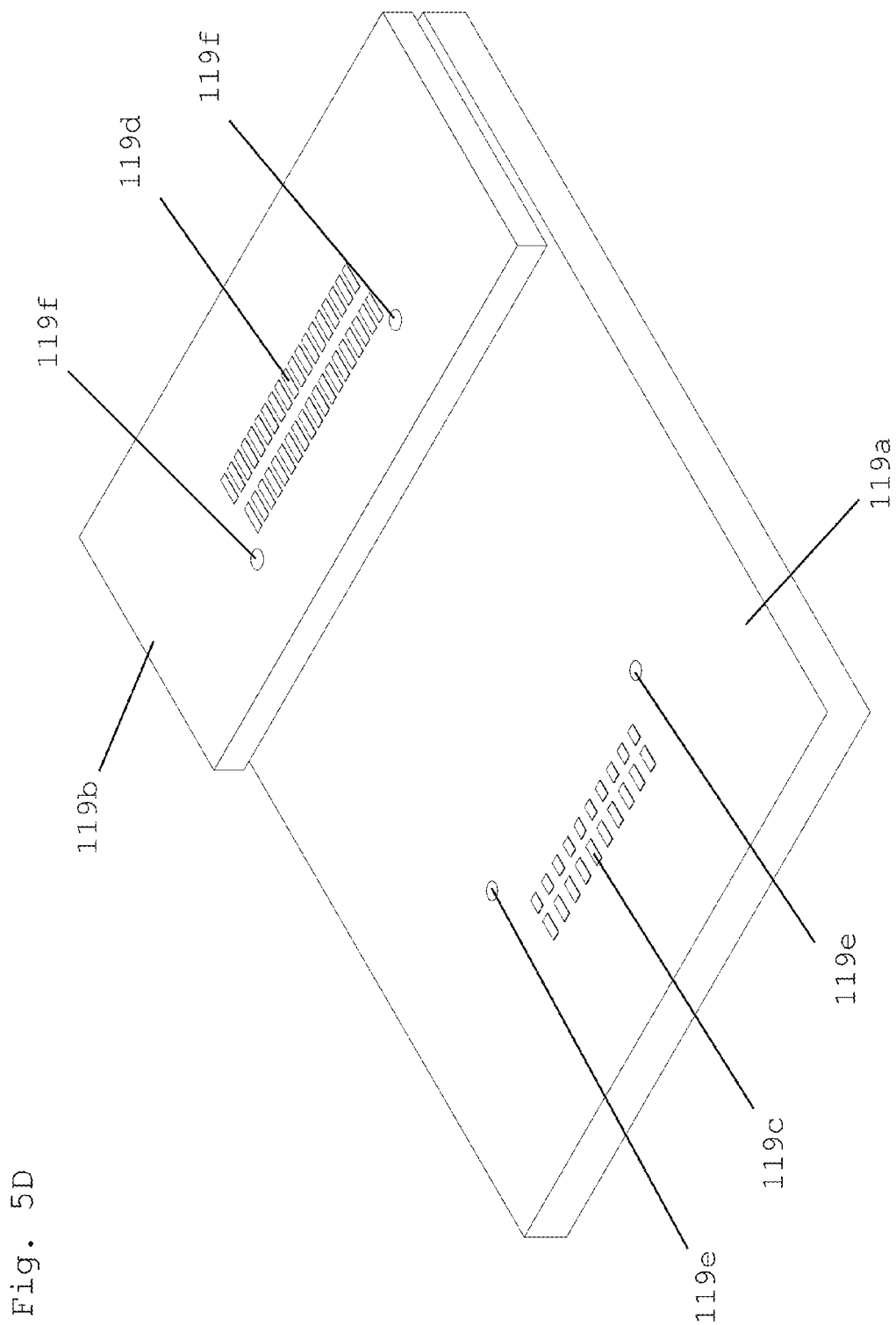
FIG. 5D is a circuit board for use with the fourth, sixth, and eighth preferred embodiments of the present invention.

FIG. 5C shows a circuit board 118 for use in a flat, co-planar environment, and FIG. 5D shows circuit boards 119a, 119b for use in a stepped-plane environment. The circuit board 118 includes lands 118a, 118b and holes 118c, 118d. The circuit board 119a includes lands 119c and holes 119e, and the circuit board 119b includes lands 119d and holes 119f. The holes 119e, 119f provide alignment for the two connectors when the two connectors are attached to the circuit boards 119a, 119b. However, it is to possible use circuit boards 118a, 119a, 119b with any arrangement and number of lands 118a, 118b, 119c, 119d and holes 118c, 118d, 119e, 119f. It is also possible to circuit boards 118a, 119a, 119b without holes 118c, 118d, 119e, 119f.

The lands 118a, 118b, 119c, 119d provide electrical connections for the two connectors of the two-piece connector systems, can be arranged in any suitable arrangement, and can include any number of individual lands. As shown in FIGS. 5C and 5D, the lands 118a, 118b, 119c, 119d can be arranged in two rows, but it is also possible that lands 118a, 118b, 119c, 119d are arranged in a single row or more than two rows. Individual lands in different rows can have the same number of individual lands or a different number of individual lands.

The holes 118c, 118d, 119e, 119f, if used, can provide alignment for the two connectors of the two-piece connector systems when the two connectors are attached to the circuit boards 118, 119a, 119b. The holes 118c, 118d, 119e, 119f can be arranged in any suitable arrangement, can include any number of holes, and can have any suitable size and shape. The holes 118c, 118d, 119e, 119f can be polarized to ensure the proper alignment of the connector when the connector is attached to the circuit boards 118, 119a, 119b.

Figure 6A:
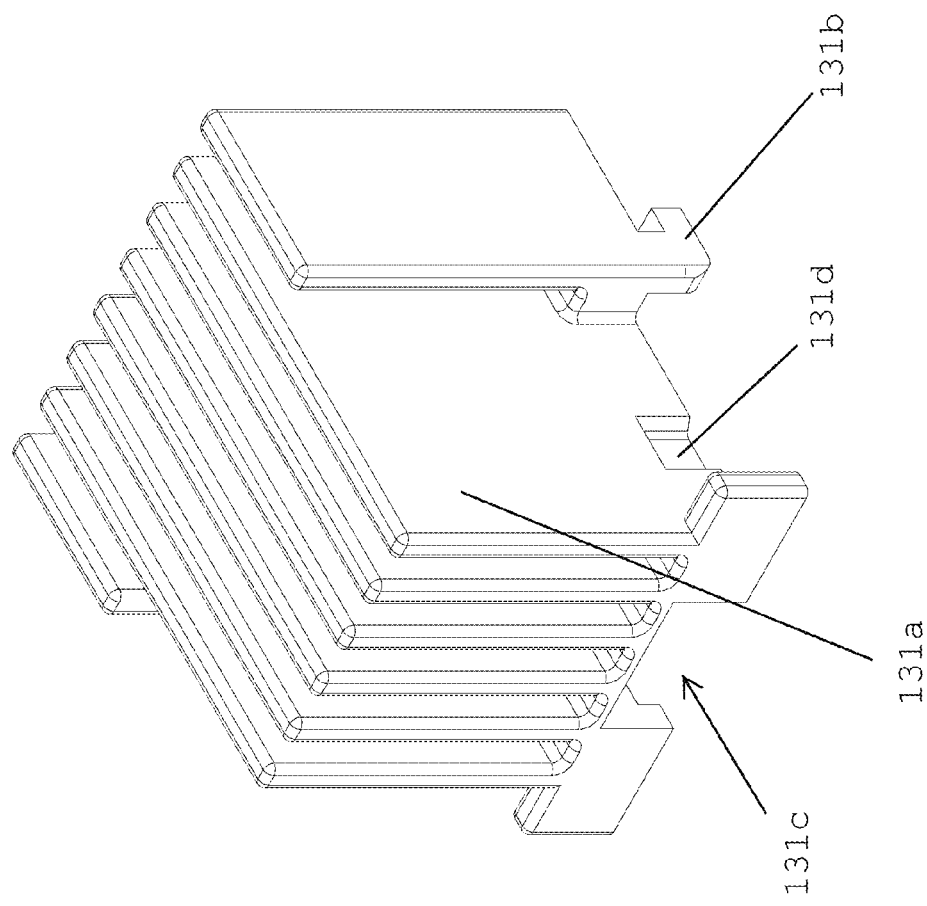
FIGS. 6A and 6B show a heatsink for use with the third and fourth preferred embodiments of the present invention.
Figure 6B:
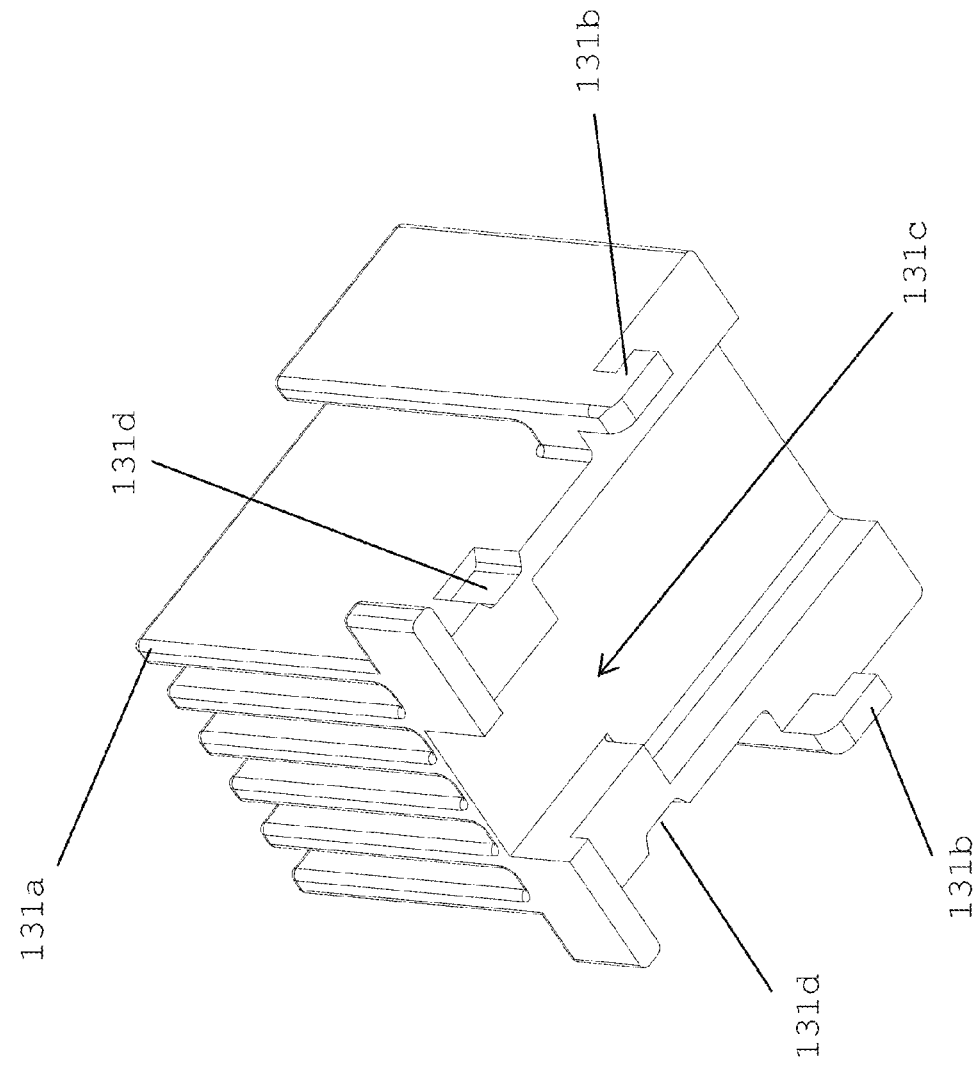
Figure 6C:
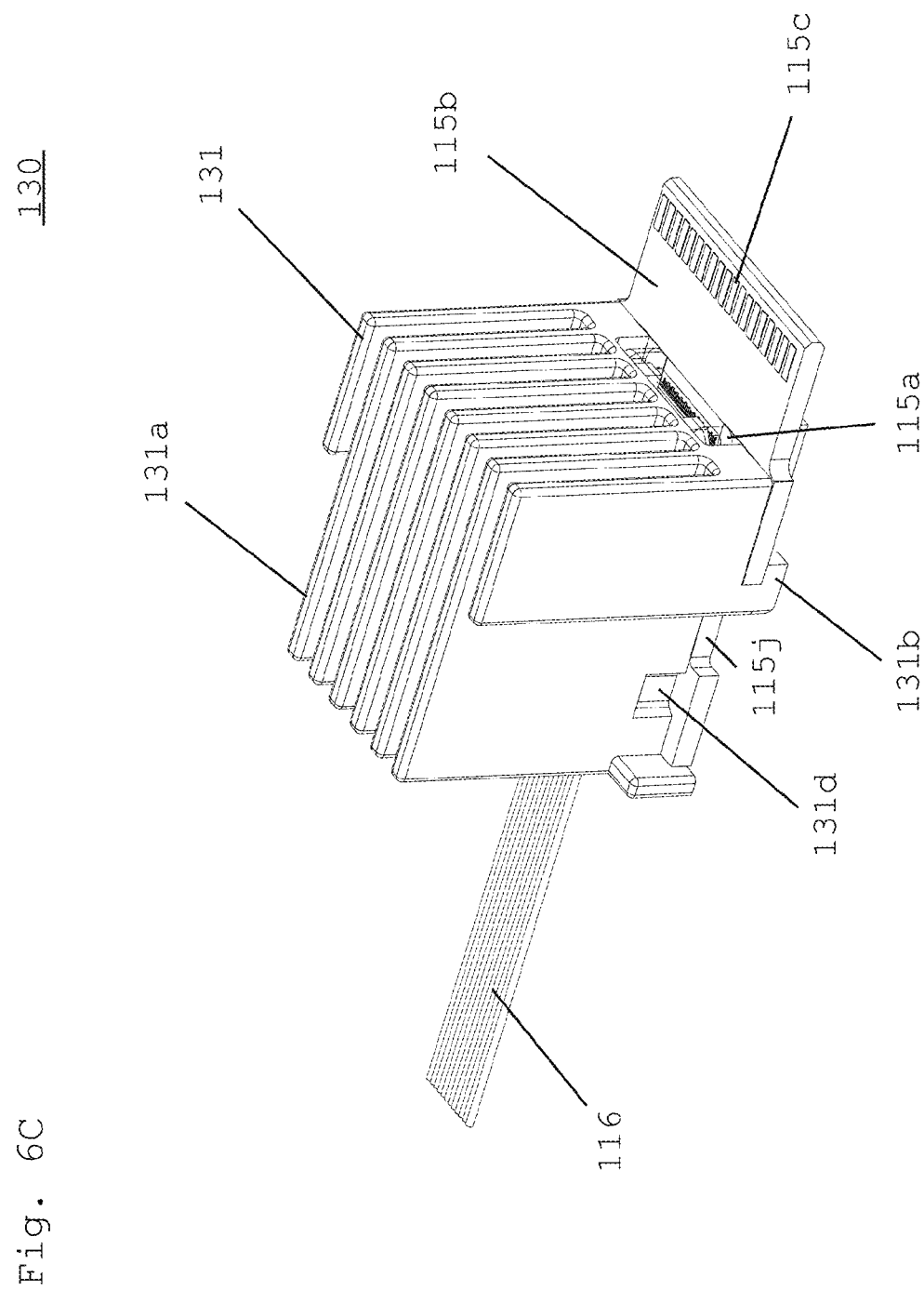
FIGS. 6C and 6D show a transceiver with a heatsink for use with the third and fourth preferred embodiments of the present invention.
Figure 6D:
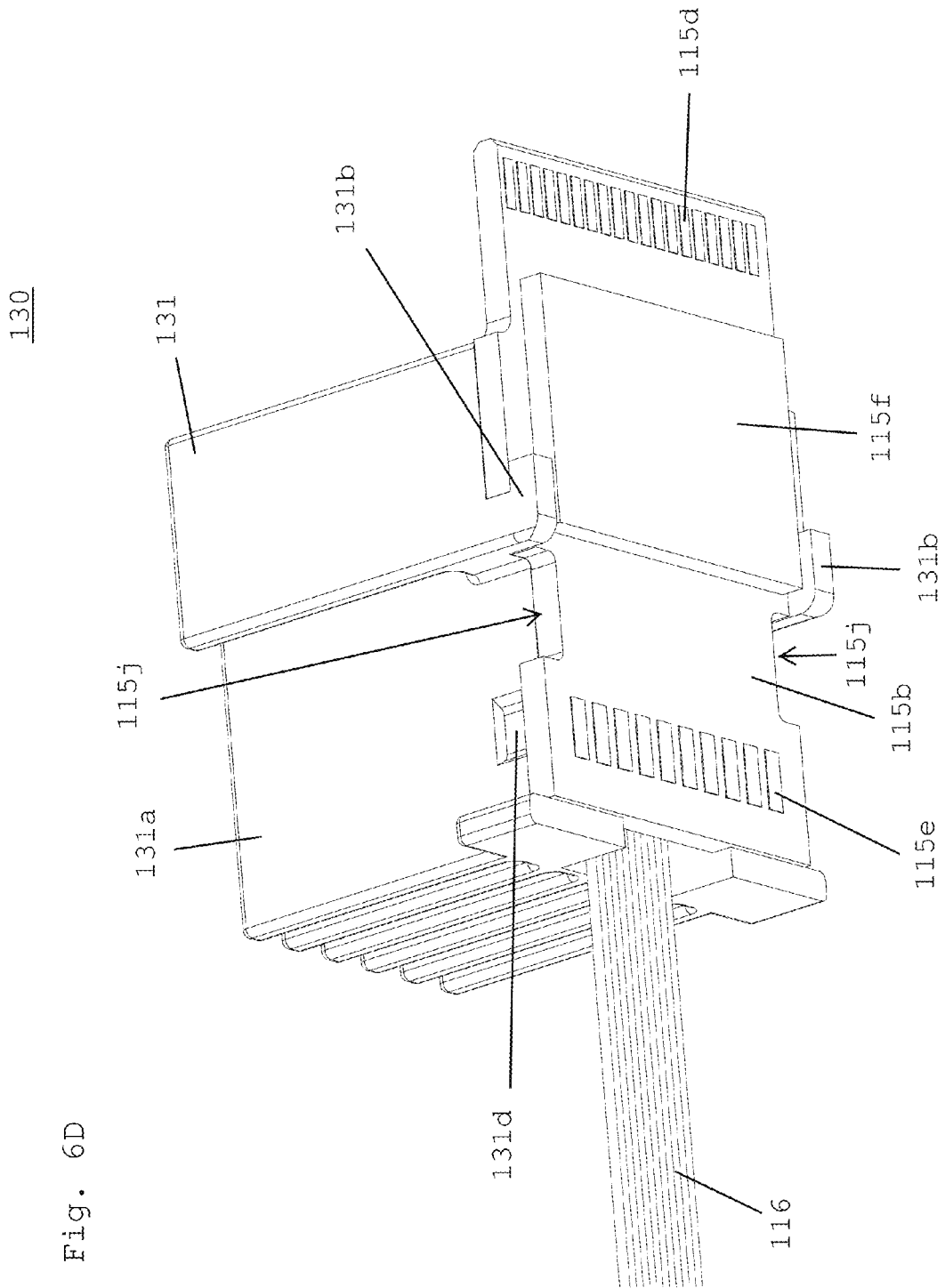

FIGS. 6A and 6B show a heatsink 131 for use with the transceiver 130 shown in FIGS. 6C and 6D. The transceiver 130 is used in the third and fourth preferred embodiments of the present invention. The transceiver 130 can be used in the flat, co-planar environment of the third preferred embodiment shown in FIGS. 7A and 7B and can be used in the stepped-plane environment of the fourth preferred embodiment shown in FIGS. 8A and 8B.

As shown in FIGS. 6A and 6B, the heatsink 131 includes fins 131a to dissipate heat from the optical engine 115a, legs 131b to secure the circuit board 115b, cavity 131c in which the optical engine 115a is located, and notches 131d that engage with the latches 135 shown FIGS. 7A-8B. Any suitable arrangement and number of fins 131a can be used as long as an adequate amount of heat can be dissipated from the optical engine 115a. Any arrangement and number of legs 131b can be used to secure the circuit board 115b to the heatsink 131. For example, it is possible to form the legs 131b with a bend to secure the circuit board 115b as shown, for example, in FIGS. 6A-6D, and it is possible to form straight legs 13b and then swage the legs around the circuit board 115b. Any suitable shape and arrangement of the notches 131d can be used to secure the transceiver 130 to the circuit boards 118, 119a.

Figure 7A:
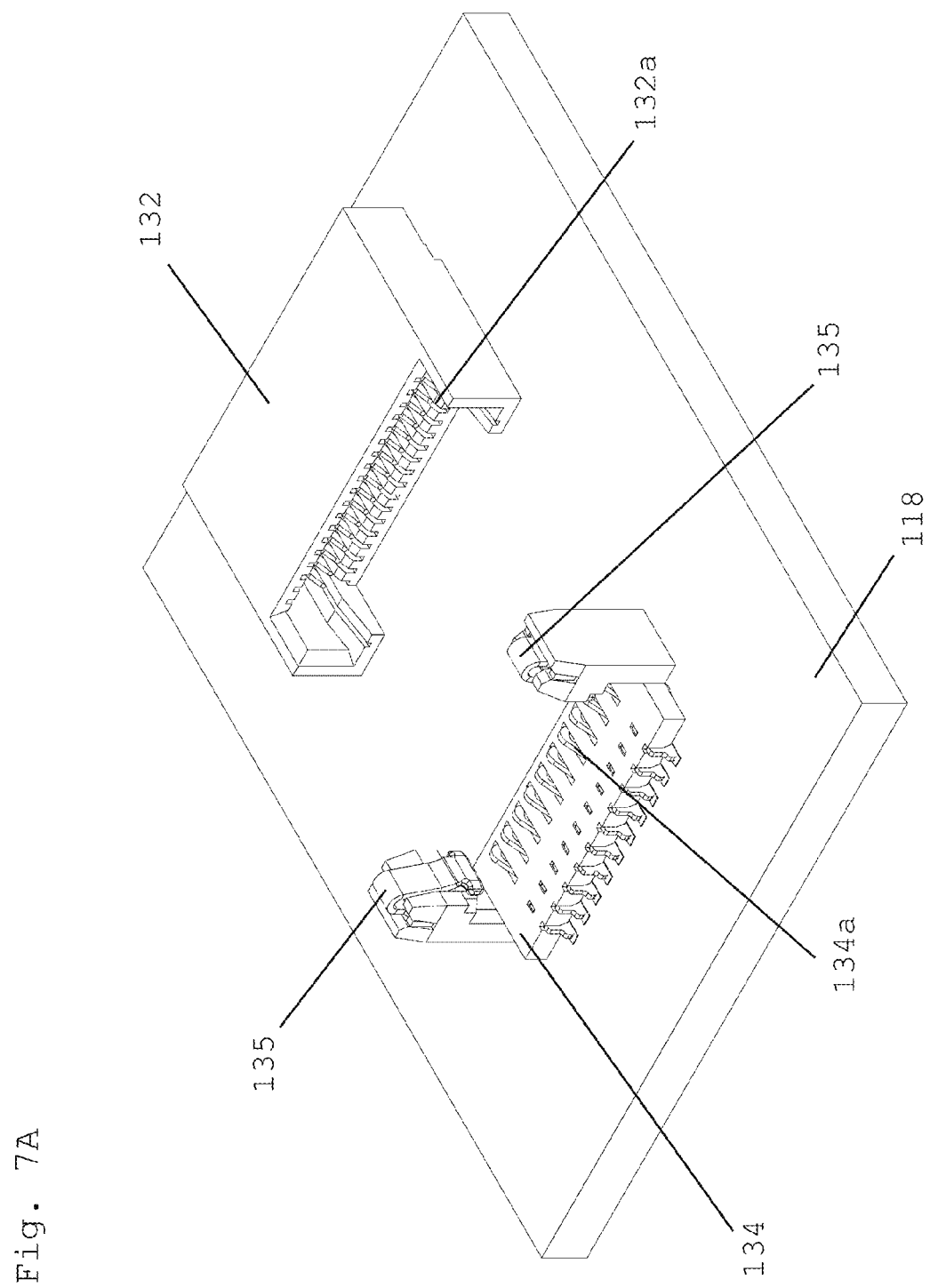

FIGS. 7A and 7B show a two-piece connector system according to the third preferred embodiment of the present invention. FIG. 7A shows the circuit board 118 with the front connector 132 and the back connector 134.

The front connector 132 is preferably an edge-card connector that mates with the front of the circuit board 115b. Preferably, the front connector 132 includes two rows of contacts 132a, with one row of contacts 132a that can engage the lands 115c on top of the circuit board 115b and with the other row contacts 132a that can engage the lands 115d on bottom of the circuit board 115b.

The back connector 134 is preferably a zero-insertion-force connector that includes latches 135 that can be used to secure the back portion of the transceiver 130 (not shown in FIG. 7A but shown in FIG. 7B) to the circuit board 118. The back connector 134 includes a row of contacts 134a that can engage the lands 115e on the bottom of the circuit board 115b. Although a single row of contacts 134a is shown in FIG. 7A, it is also possible to use more than one row of contacts 134a.

To mate transceiver 130 with the circuit board 118, the circuit board 115b is pressed down into the back connector 134 aligning latches 135 with notches 115j in the circuit board 115b, and then the circuit board 115b is pushed forward so that the front end of the circuit board 115b is inserted into the front connector 132 and the latches 135 engage with the notches 131d. To unmate the transceiver 130 from the circuit board 118, the front end of the circuit board 115b is pulled out of the front connector 132 such that the latches 135 disengage with the notches 131d and align with the notches 115j, and then the transceiver 130 is pulled out of the back connector 134. Preferably, the high-speed signals are transmitted through the front connector 132, and low-speed signals and/or power are transmitted through the back connector 134.

Figure 8B:
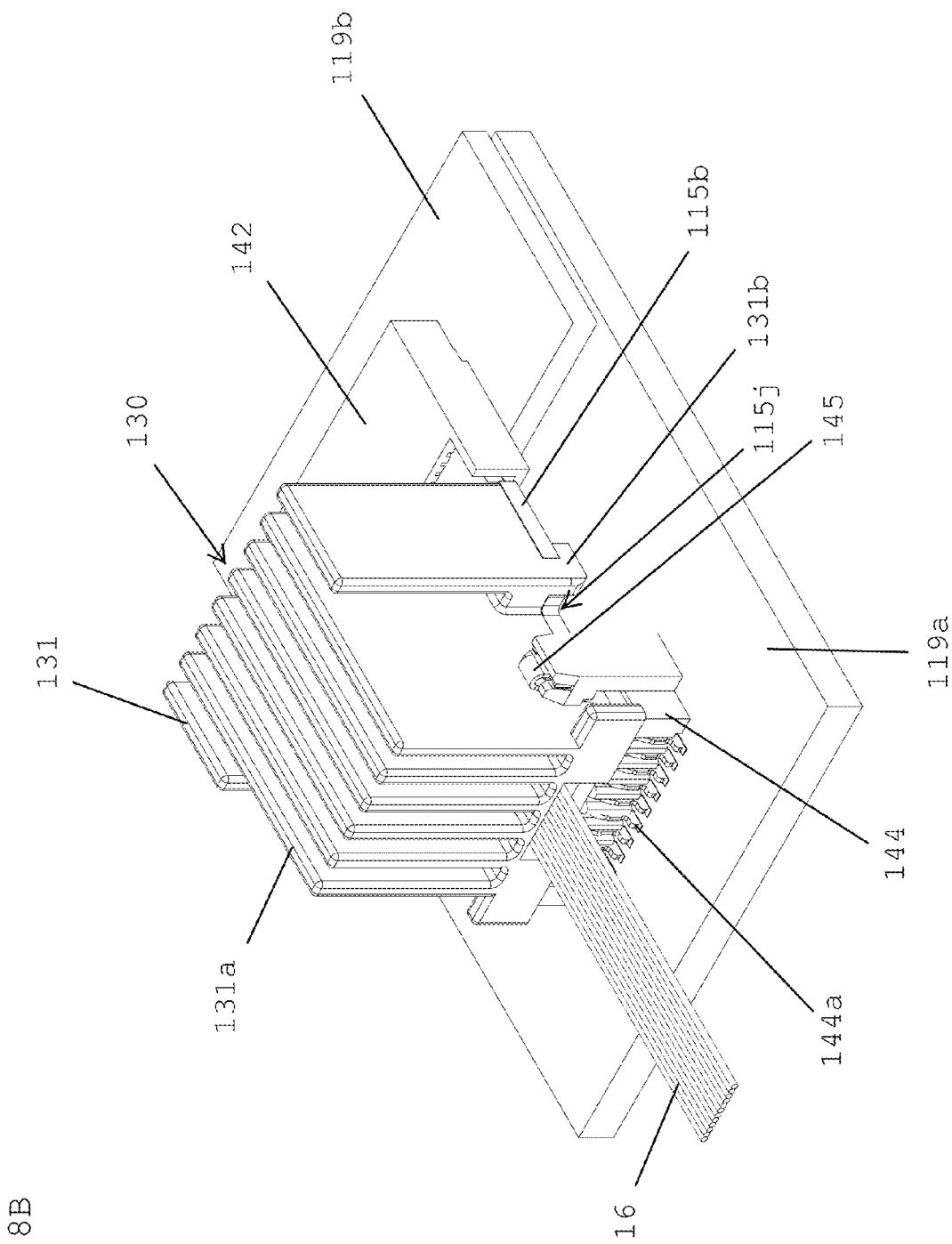

FIGS. 8A and 8B show a two-piece connector system according to the fourth preferred embodiment of the present invention. FIG. 8A shows the circuit board 119b with the front connector 142 and the circuit board 119a with the back connector 144. The circuit board 119b can be part of an IC package; however, for simplicity, only the circuit board 119a is shown.

The front connector 142 is preferably an edge-card connector that mates with the front of the circuit board 115b. Preferably, the front connector 142 includes two rows of contacts 142a, with one row of contacts 142a that can engage the lands 115c on top of the circuit board 115b and with the other row contacts 142a that can engage the lands 115d on bottom of the circuit board 115b.

The back connector 144 is preferably a zero-insertion-force connector that includes latches 145 that can be used to secure the back portion of the transceiver 130 (not shown in FIG. 8A but shown in FIG. 8B) to the circuit board 119a. The back connector 144 can be similar to the back connector 134 with the difference being that the height of the back connector 144 is larger than the height of the back connector 134. The back connector 144 includes a row of contacts 144*a* that can engage the lands 115*e* on the bottom of the circuit board 115*b*. Although a single row of contacts 144*a* is shown in FIG. 8A, it is also possible to use more than one row of contacts 144*a*.

To mate transceiver 130 with the circuit boards 119*a*, 119*b*, the circuit board 115*b* is pressed down into the back connector 144 aligning latches 145 with notches 115*j* in the circuit board 115*b*, and then the circuit board 115*b* is pushed forward so that the front end of the circuit board 115*b* is inserted into the front connector 142 and the latches 145 engage with the notches 131*d*. To unmate the transceiver 130 from the circuit boards 119*a*, 119*b*, the front end of the circuit board 115*b* is pulled out of the front connector 142 such that the latches 145 disengage with the notches 131*d* and align with the notches 115*j*, and then the transceiver 130 is pulled out of the back connector 144. Preferably, the high-speed signals are transmitted through the front connector 142, and low-speed signals and/or power are transmitted through the back connector 144.

Figure 9A:
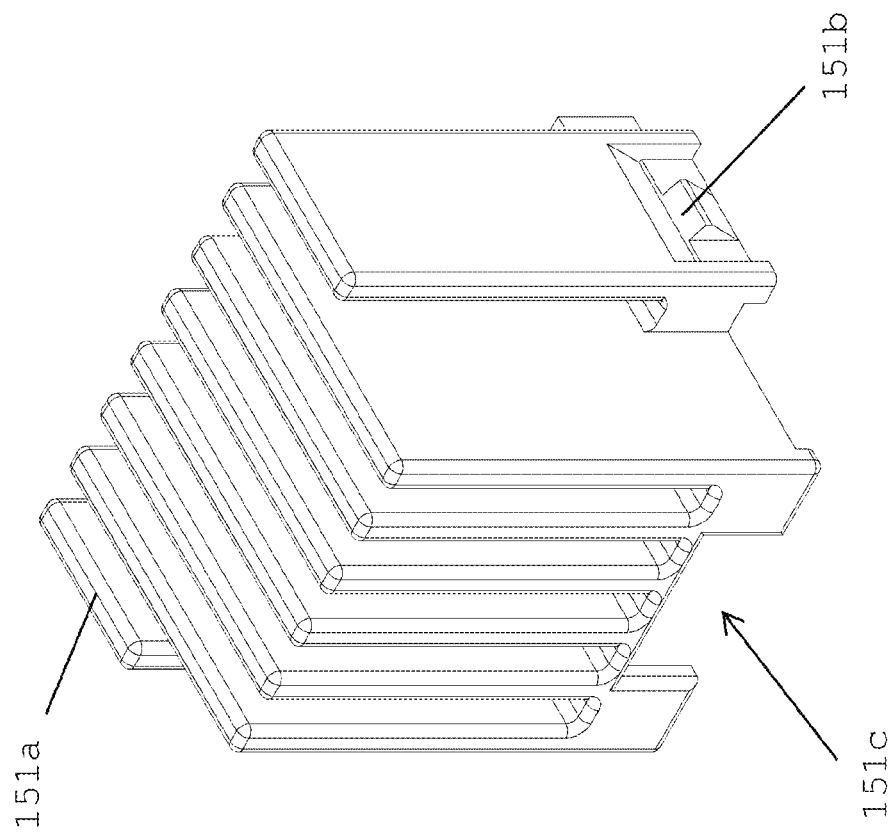
FIGS. 9A and 9B show a heatsink for use with the fifth and sixth preferred embodiments of the present invention.
Figure 9B:
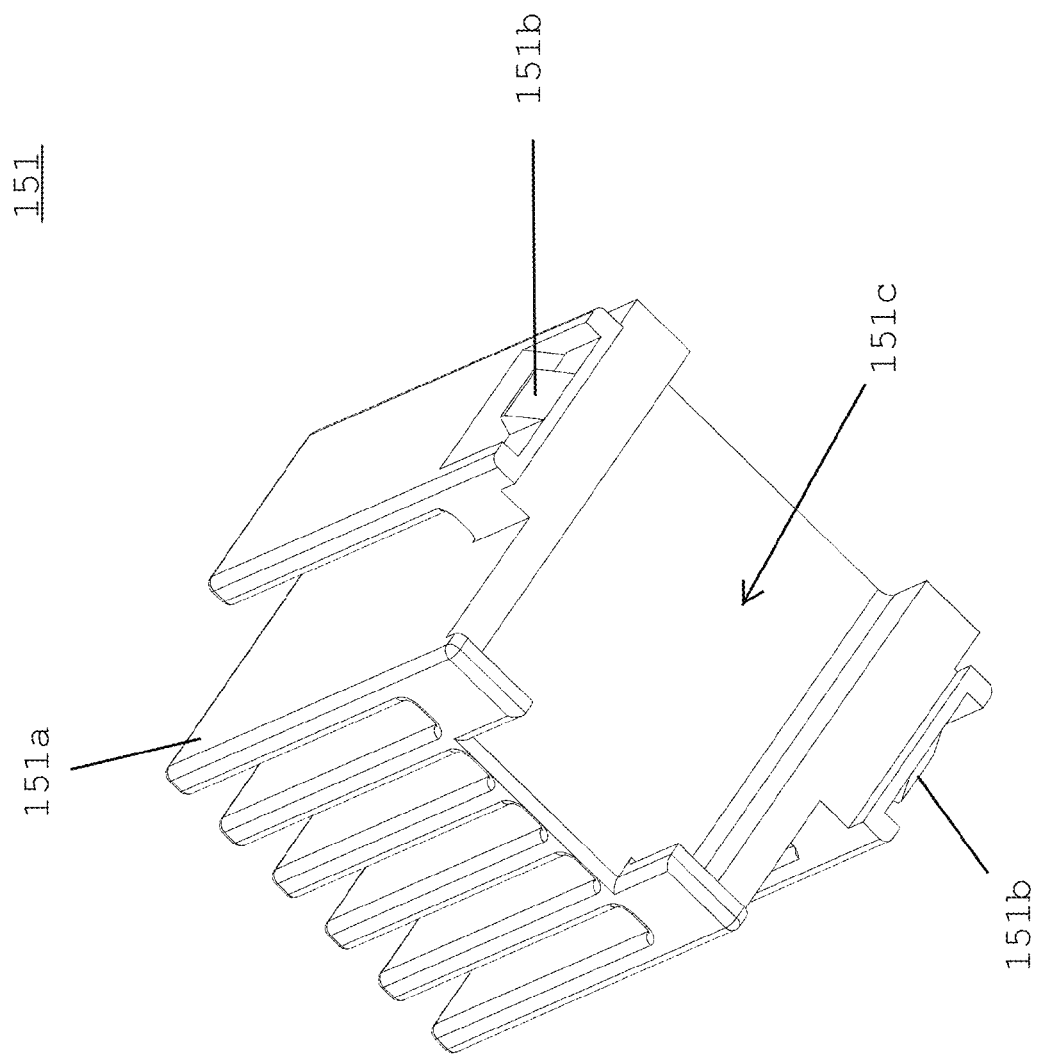

FIGS. 9A and 9B show a heatsink 151 for use with the transceiver 150 shown in FIGS. 9C-9F. The transceiver 150 is preferably used in the fifth and sixth preferred embodiments of the present invention. The transceiver 150 can be used in the flat, co-planar environment of the fifth preferred embodiment shown in FIGS. 10A-10D and can be used in the stepped-plane environment of the sixth preferred embodiment shown in FIGS. 11A-11D.

Figure 9C:
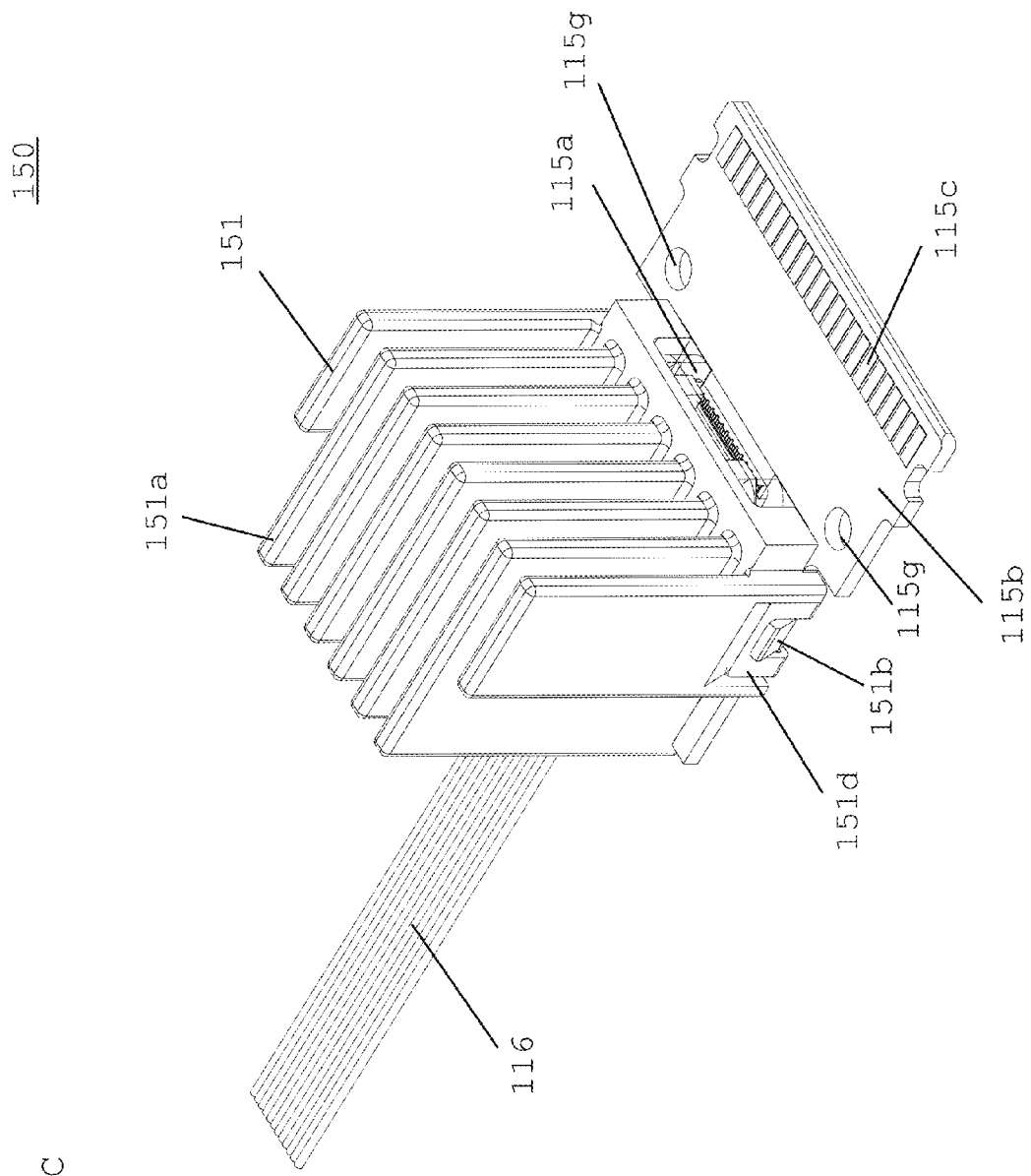
FIGS. 9C and 9D show a transceiver with a heatsink for use with the fifth and sixth preferred embodiments of the present invention.
Figure 9D:
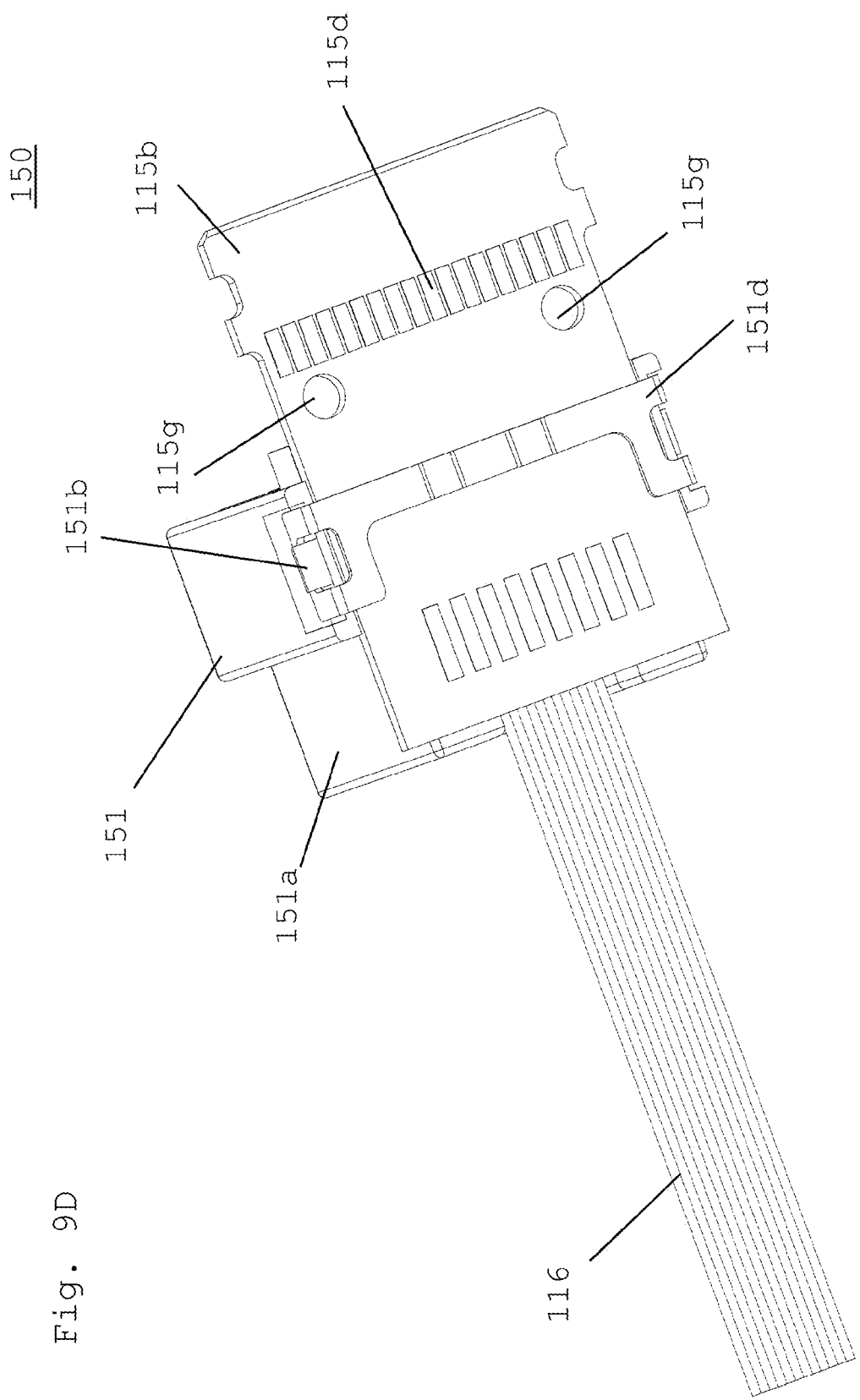
Figure 9E:
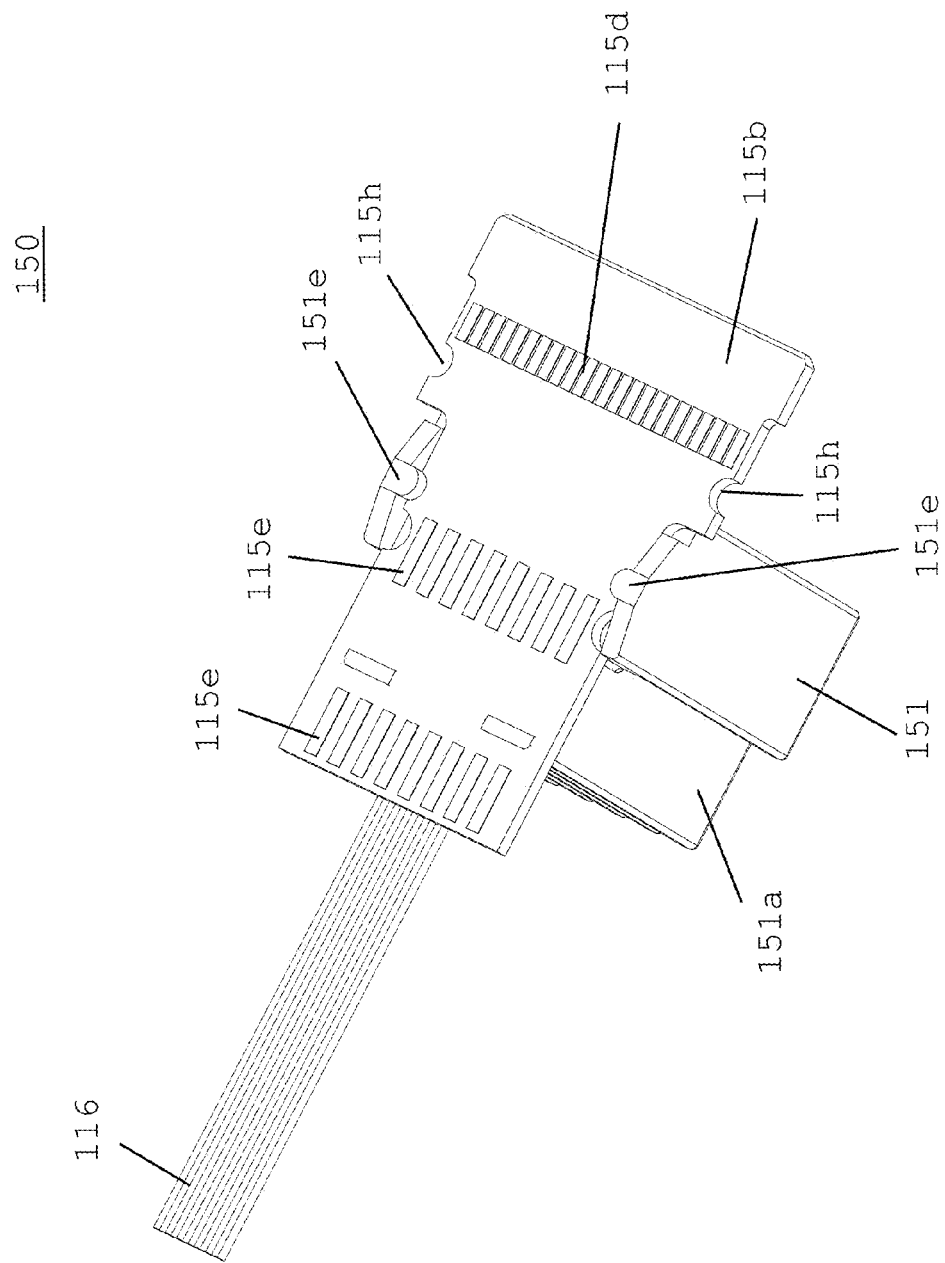
FIGS. 9E and 9F show modified transceivers with a heatsink for use with the fifth and sixth preferred embodiments of the present invention.
Figure 9F:
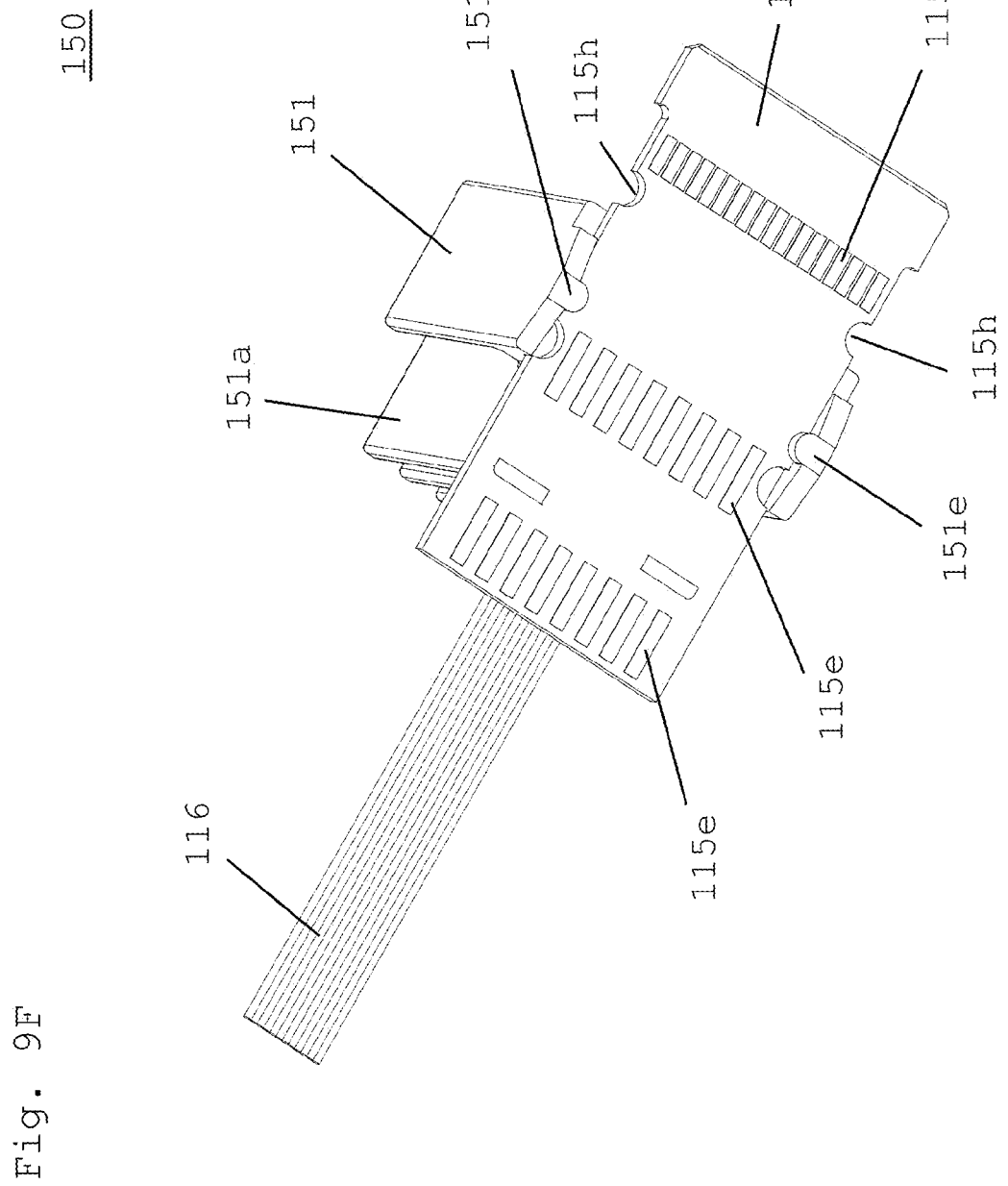

As shown in FIGS. 9A and 9B, the heatsink 151 includes fins 151*a* to transmit heat from the optical engine 115*a*, protrusions 151*b* or clips 151*e* to secure the circuit board 115*b*, and cavity 151*c* in which the optical engine 115*a* is located. Any suitable arrangement and number of fins 151*a* can be used as long as an adequate amount of heat can be dissipated from the optical engine 115*a*. If the heatsink 151 includes protrusions 151*b* as shown, for example, in FIG. 9A, then a strap 151*d* is used to secure the circuit board 115*b*. The straps 151*d* can be made of a stamped metal or any other suitable material. The strap 151*d* preferably has a U-shape with a base and ends extending from the base. The ends of the strap 151*d* includes holes that can engage with the protrusions 151*b* of the heatsink 151 to secure the circuit board 115*b* to the heatsink 151. The base of the strap 151*d* is positioned under the circuit board 115*b*, with the ends of the straps 151*d* facing the heatsink 151. Pressing the base of the strap 151*d* against the circuit board 115*b*, causes the ends of the strap 151*d* to deflect over the protrusions 151*b* to cause the holes of the straps 151*d* to engage with or snap together with the protrusions 151*b* to secure the heatsink 151 and circuit board 115*b* together. Instead of using protrusions 151*b* and strap 151*d*, it is also possible to use clips 151*e* to secure the circuit board 115*b* as shown in FIGS. 9E and 9F. Although a single pair of opposing clips 151*e* is shown in FIGS. 9E and 9F, it is possible to use more than one pair of opposing clips 151*e* to secure the circuit board 115*b*.

It is possible to use any number and any suitable arrangement of individual lands in the lands 115*c*, 115*d*, 115*e*. FIGS. 9E and 9F are bottom perspective views of the transceiver 150 showing different possible arrangements of the lands 115*d*, 115*e* on the bottom of the circuit board 115*b*. For example, it is possible to use more individual lands as seen by comparing the number of individual lands in lands 115*d* in FIG. 9E with the number of individual lands in lands 115*d* in FIG. 9F. It is also possible to use multiple rows of lands. For example, lands 115*e* preferably include two rows of lands 115*e*, instead of the one row of lands 115*e* shown, for example, in FIG. 6D. If two rows of lands 115*e* are used, then the circuit board 115*b* can be mated to a back connector 154, 164 with two rows of contacts 154*a*, 164*a* as shown, for example, in FIGS. 10B and 11B.

Figure 10A:
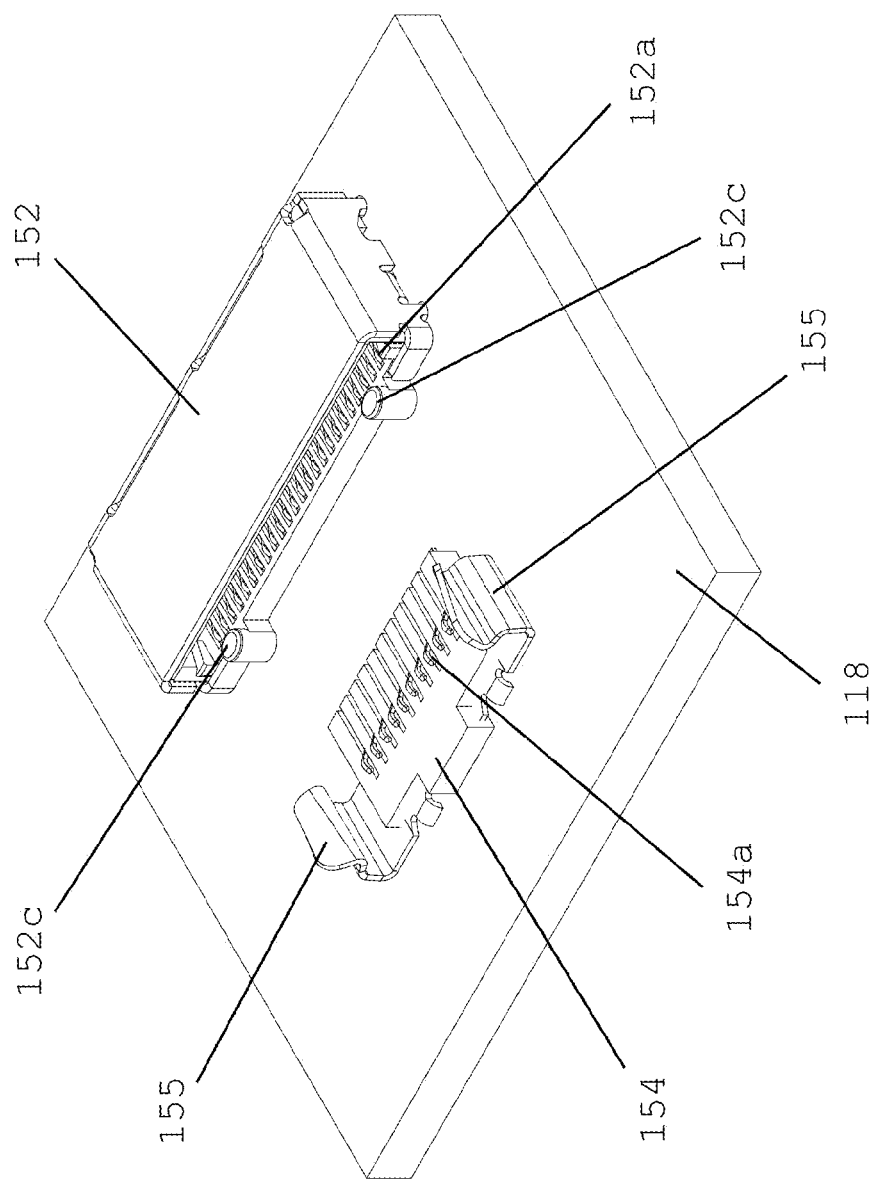
FIGS. 10A-10D show circuit boards and transceivers according to the fifth preferred embodiment of the present invention.
Figure 10B:
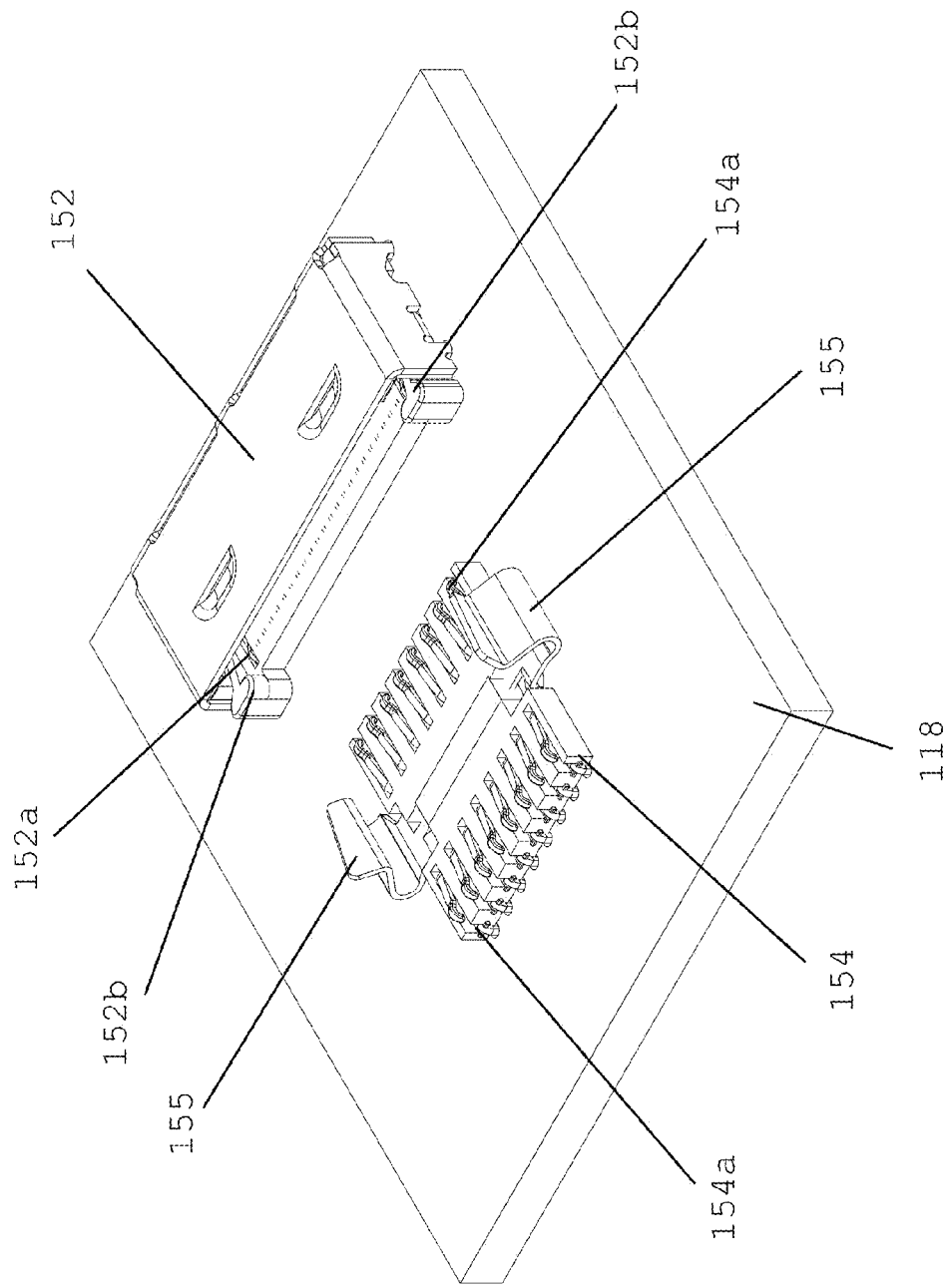
Figure 11B:
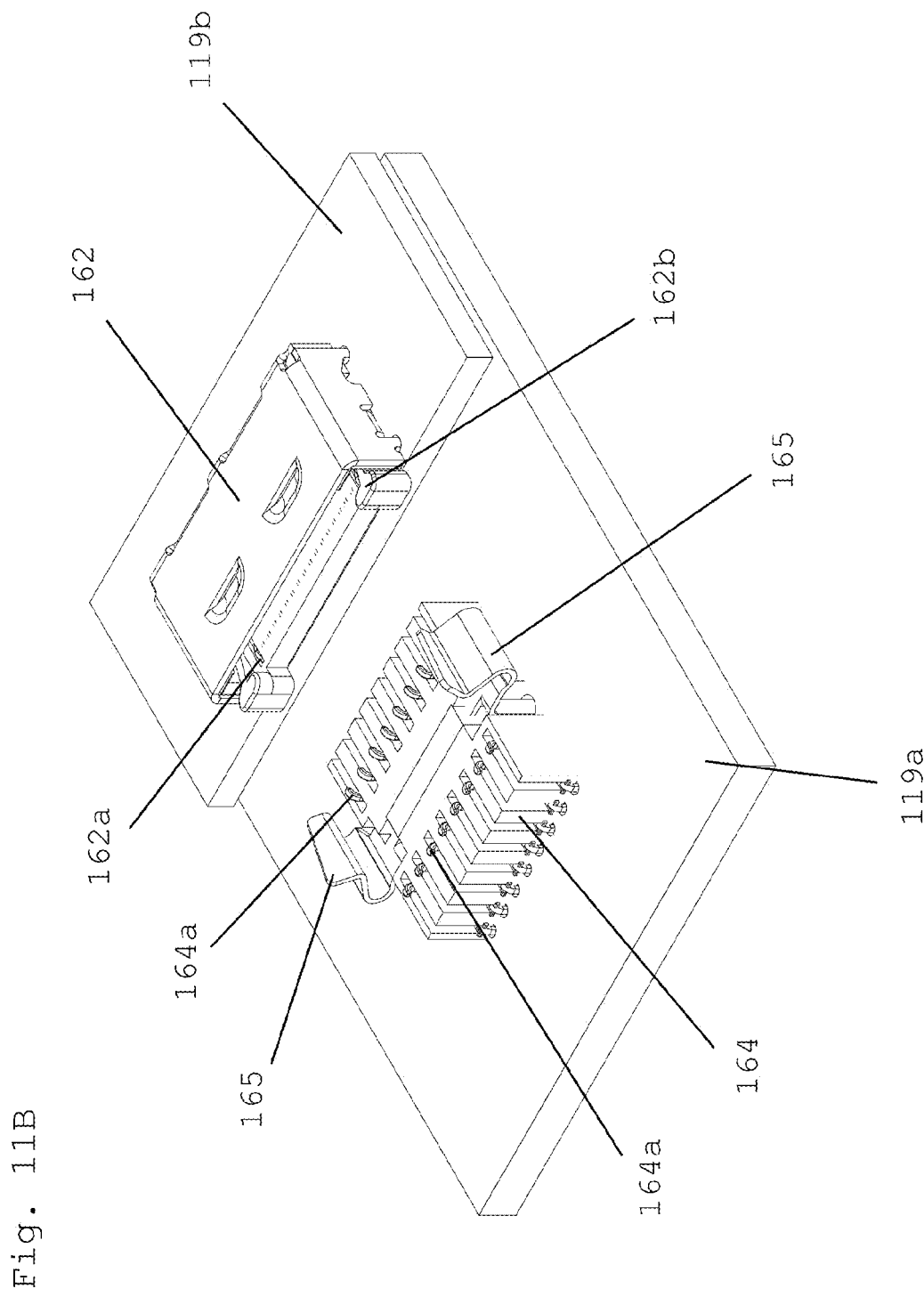

It is also possible to provide the circuit board 115*b* with guide features to guide the transceiver 150 in the front connectors 152, 162 shown, for example, in FIGS. 10A and 11A. FIGS. 9C and 9D show the circuit board 115*b* with holes 115*g* that can be used in cooperation with the posts 152*c*, 162*c* of the front connector 152, 162 shown, for example, in FIGS. 10A and 11A. FIGS. 9E and 9F show the circuit board 115*b* with notches 115*h* that can be used in cooperation with the ramps 152*b*, 162*b* of the front connector 152, 162 shown, for example, in FIGS. 10B and 11B.

Figure 10C:
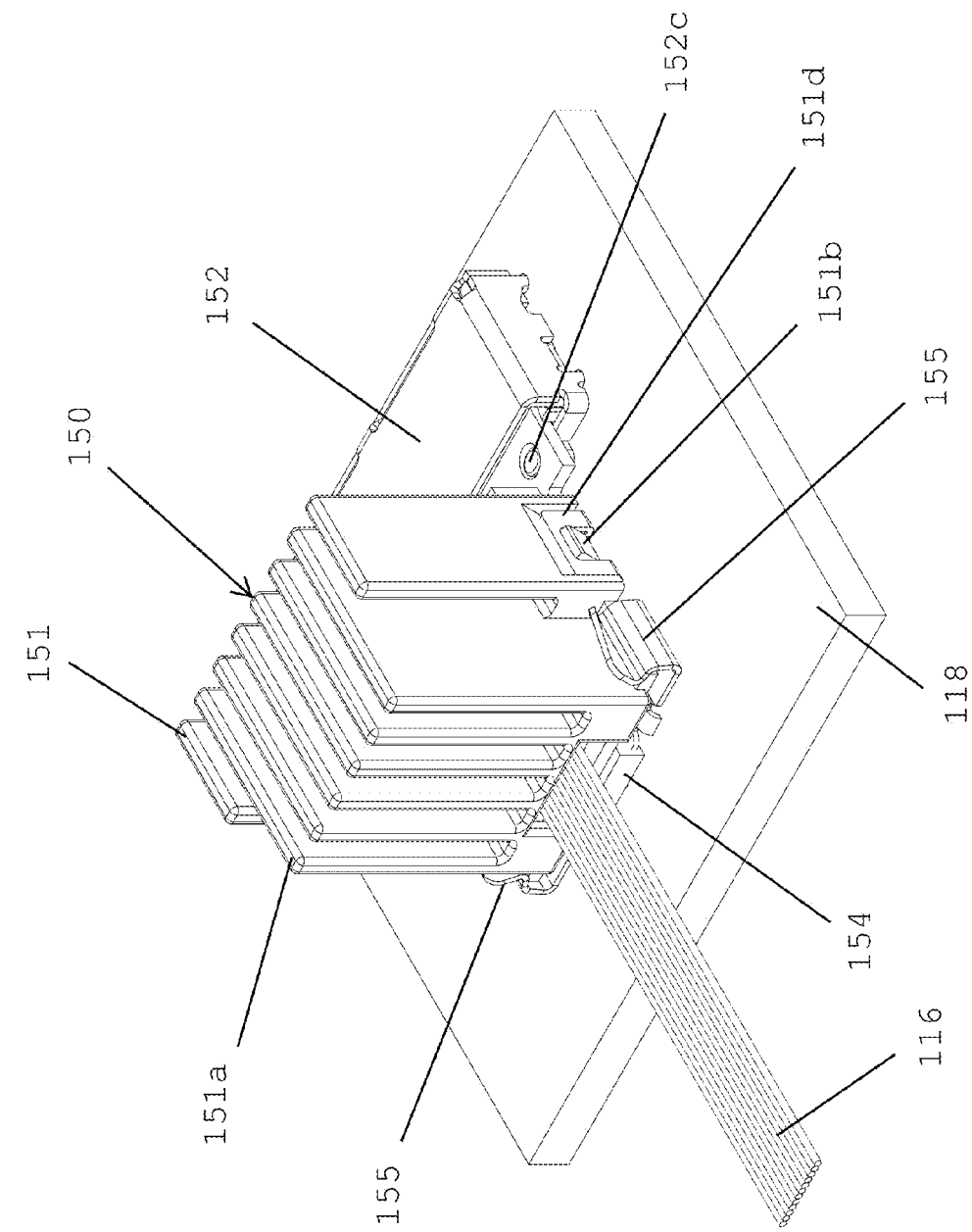

FIGS. 10A-10D show two-piece connector systems according to the fifth preferred embodiment of the present invention. FIGS. 10A and 10B show the circuit board 118 with front connectors 152 and back connectors 154.

Figure 10D:
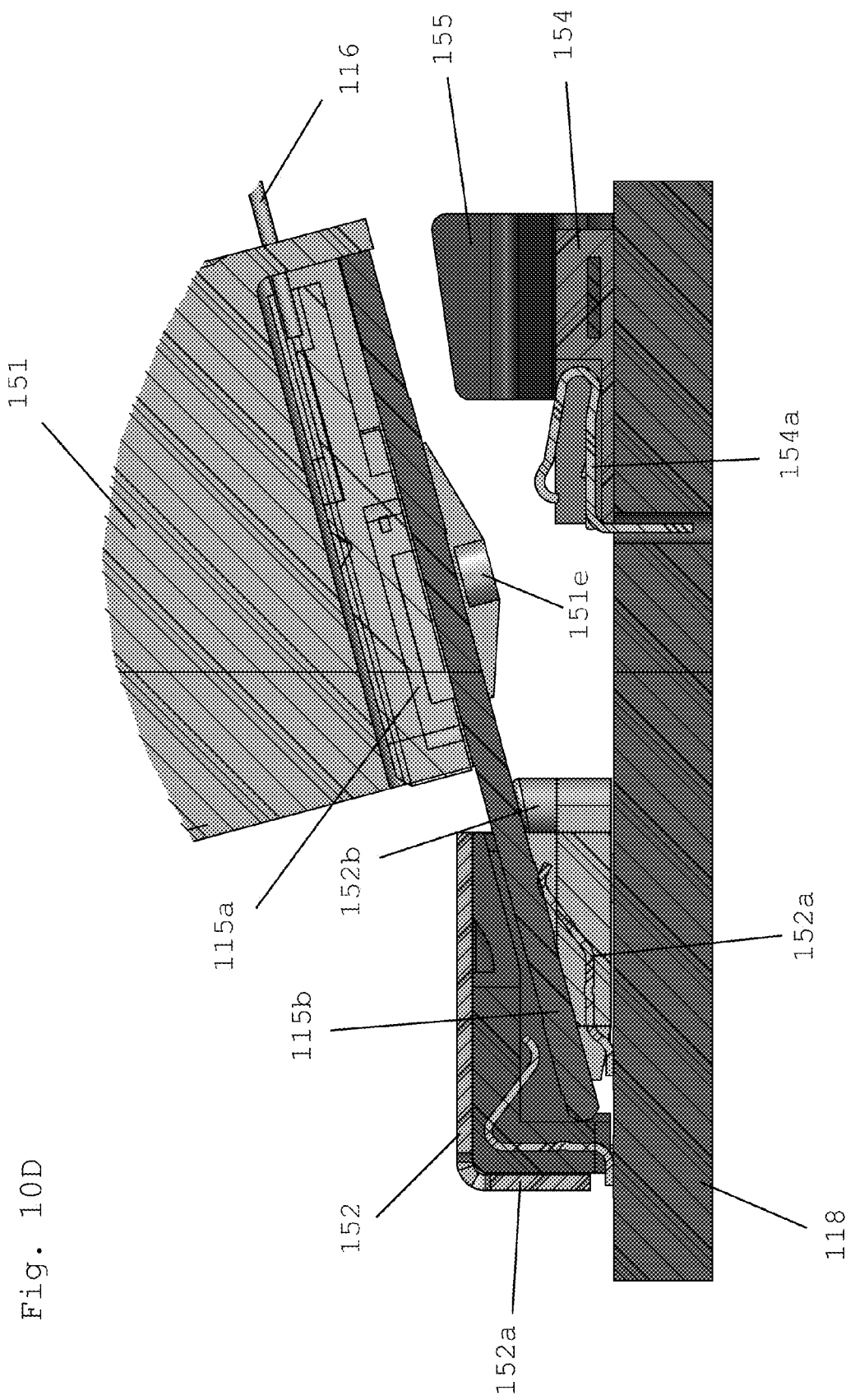
Figure 11C:
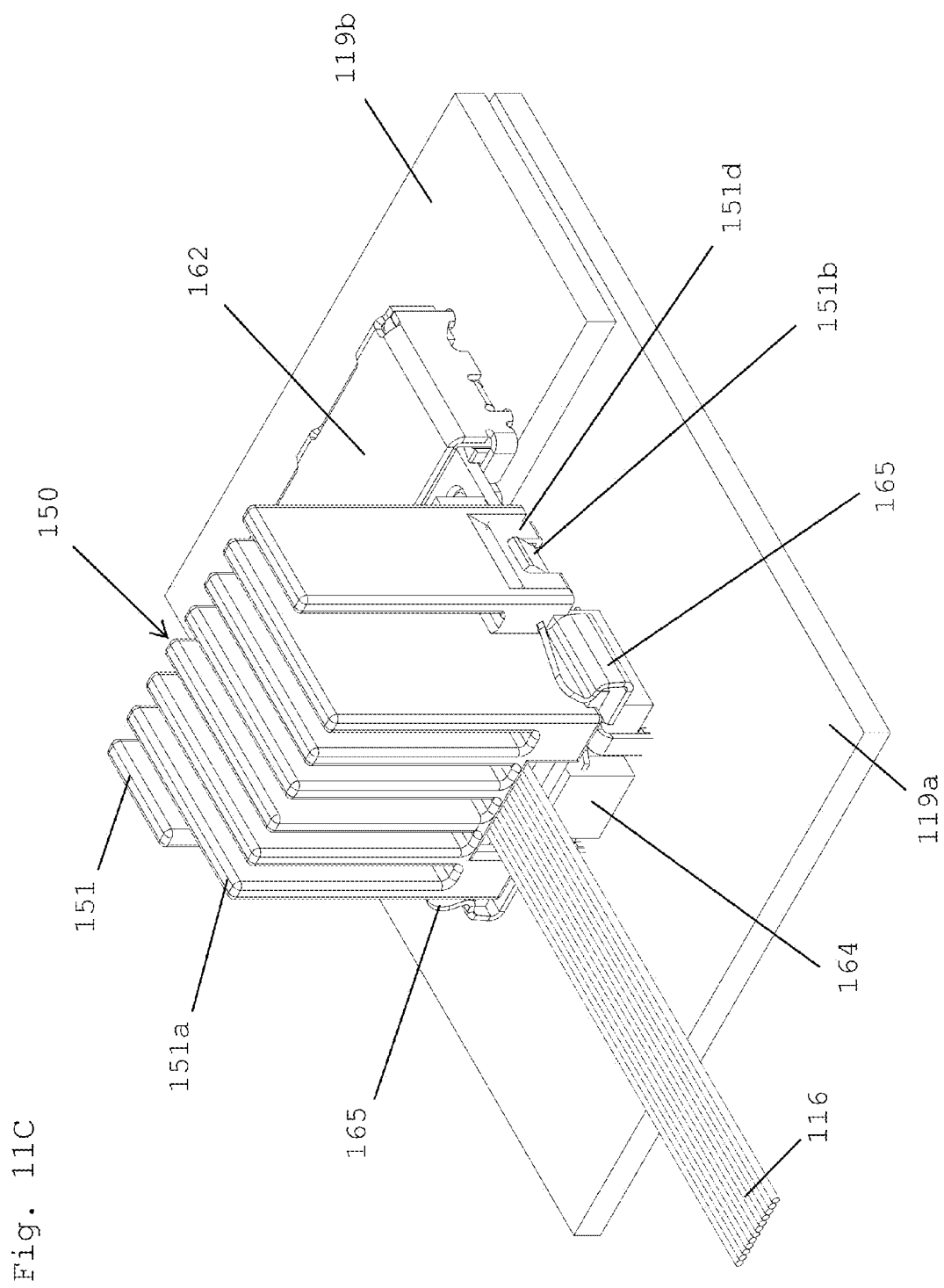

The front connectors 152 are preferably edge-card connectors that mate with the front of the circuit board 115*b*. Preferably, as seen in FIG. 10D, the front connector 152 includes two rows of contacts 152*a*, with one row of contacts 152*a* that can engage the lands 115*c* on top of the circuit board 115*b* and with the other row contacts 152*a* that can engage the lands 115*d* on bottom of the circuit board 115*b*. The front connector 152 shown in FIG. 10A includes posts 152*c* that engage with corresponding holes 115*g* in the circuit board 115*b*.

The back connector 154 is preferably a zero-insertion-force connector that includes clips 155 that can be used to secure the back portion of the transceiver 150 (not shown in FIGS. 10A and 10B but shown in FIGS. 10C and 10D) to the circuit board 118. The clips 155 can engage portions of the circuit board 115*b* that extend beyond the heatsink 151; however, it is also possible that the clips 155 engage portions of the heatsink 151. The back connector 154 includes contacts 154*a* that can engage the lands 115*e* on the bottom of the circuit board 115*b*. It is possible for the back connector 154 to include a single row of contacts 154*a* as shown in FIG. 10A or to include more than one row of contacts 154*a* as shown in FIG. 10B.

As shown in FIG. 10D, to mate the transceiver 150 with the circuit board 118, the front end of the circuit board 115*b* is inserted into the front connector 152, and then the back end of the circuit board 115*b* is pressed down into the back connector 154 such that the clips 155 engage with the portions of the circuit board 115*b* that extend beyond the heatsink 151. To unmate the transceiver 150 from the circuit board 118, a force is applied to the clips 155 to disengage the clips 155 from the portions of the circuit board 115*b* that extend beyond the heatsink 151, and then the front end of the circuit board 115*b* is pulled out of the front connector 152. Preferably, the high-speed signals are transmitted through the front connector 152, and low-speed signals and/or power are transmitted through the back connector 154.

Figure 11D:
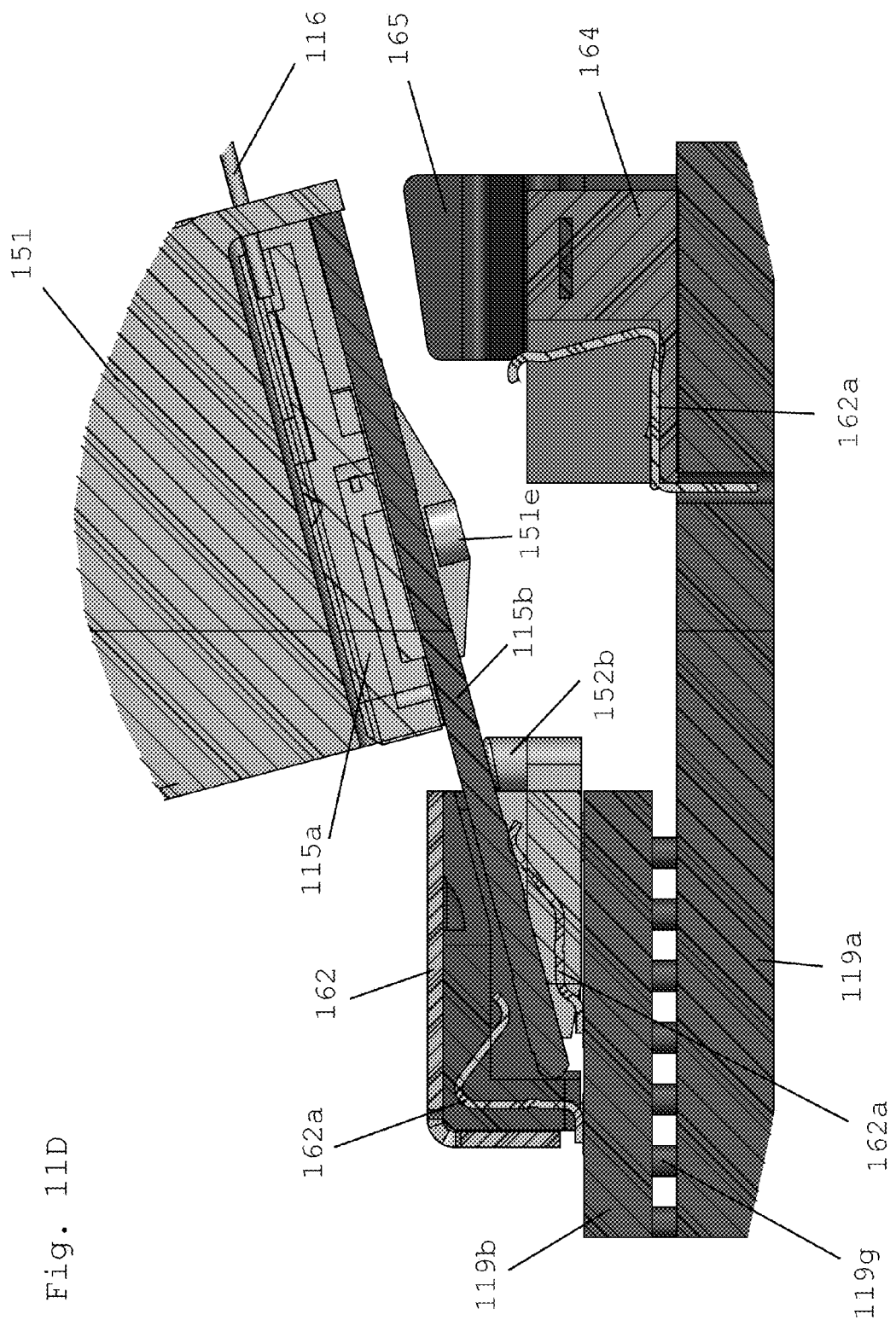

FIGS. 11A-11D show two-piece connector systems according to the sixth preferred embodiment of the present invention. FIGS. 11A and 11B show the circuit board 119*b* with the front connector 162 and the circuit board 119*a* with the back connector 164. The circuit board 119*b* can be part of an IC package; however, for simplicity, only the circuit board 119*b* is shown. As shown in FIG. 11D, the circuit boards 119*a*, 119*b* can be connected together using solder balls 119*g*.

The front connector 162 is preferably an edge-card connector that mates with the front of the circuit board 115*b*. Preferably, as seen in FIG. 11D, the front connector 162 includes two rows of contacts 162*a*, with one row of contacts 162*a* that can engage the lands 115*c* on top of the circuit board 115*b* and with the other row contacts 162*a* that can engage the lands 115*d* on bottom of the circuit board 115*b*.

The back connector 164 is preferably a zero-insertion-force connector that includes clips 165 that can be used to secure the back portion of the transceiver 150 (not shown in FIGS. 11A and 11B but shown in FIGS. 11C and 11D) to the circuit board 119*a*. The back connector 164 can be similar to the back connector 154 with the difference being that the height of the back connector 164 is larger than the height of the back connector 154. The back connector 164 includes a row of contacts 164*a* that can engage the lands 115*e* on the bottom of the circuit board 115*b*. It is possible for the back connector 164 to include a single row of contacts 164*a* as shown in FIG. 11A or to include more than one row of contacts 164*a* as shown in FIG. 11B.

As shown in FIG. 11D, to mate the transceiver 150 with the circuit boards 119*a*, 119*b*, the front end of the circuit board 115*b* is inserted into the front connector 162 on the circuit board 119*b*, and then the back end of the circuit board 115*b* is pressed down into the back connector 164 on the circuit board 119*a* such that the clips 165 engage with the portions of the circuit board 115*b* that extend beyond the heatsink 151. To unmate the transceiver 150 from the circuit boards 119*a*, 119*b*, a force is applied to the clips 165 to disengage the clips 165 from the portions of the circuit board 115*b* that extend beyond the heatsink 151, and then the front end of the circuit board 115*b* is pulled out of the front connector 162. Preferably, the high-speed signals are transmitted through the front connector 162, and low-speed signals and/or power are transmitted through the back connector 164.

Figure 12A:
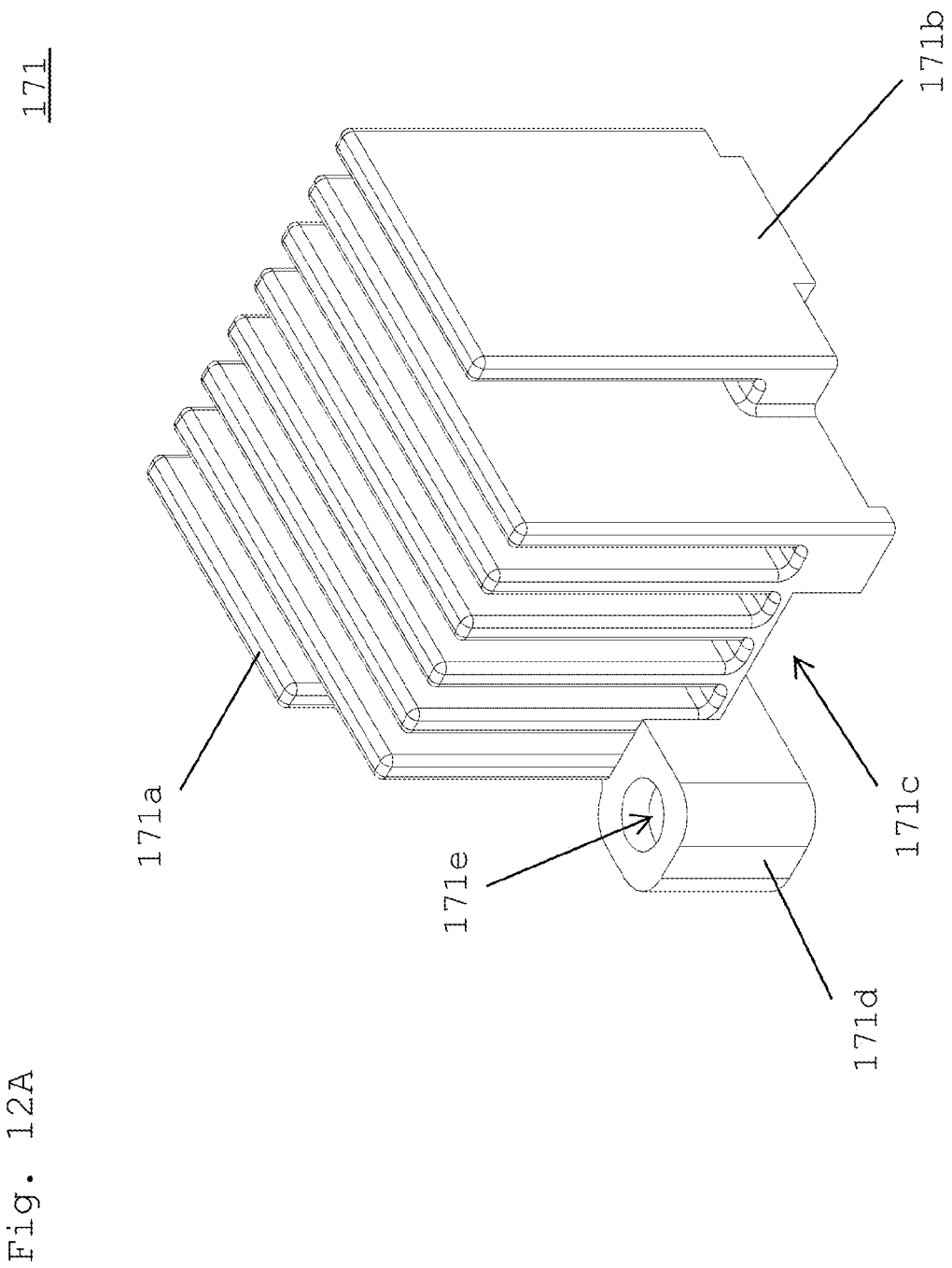
FIGS. 12A and 12B show a heatsink for use with the seventh and eighth preferred embodiments of the present invention.
Figure 12B:
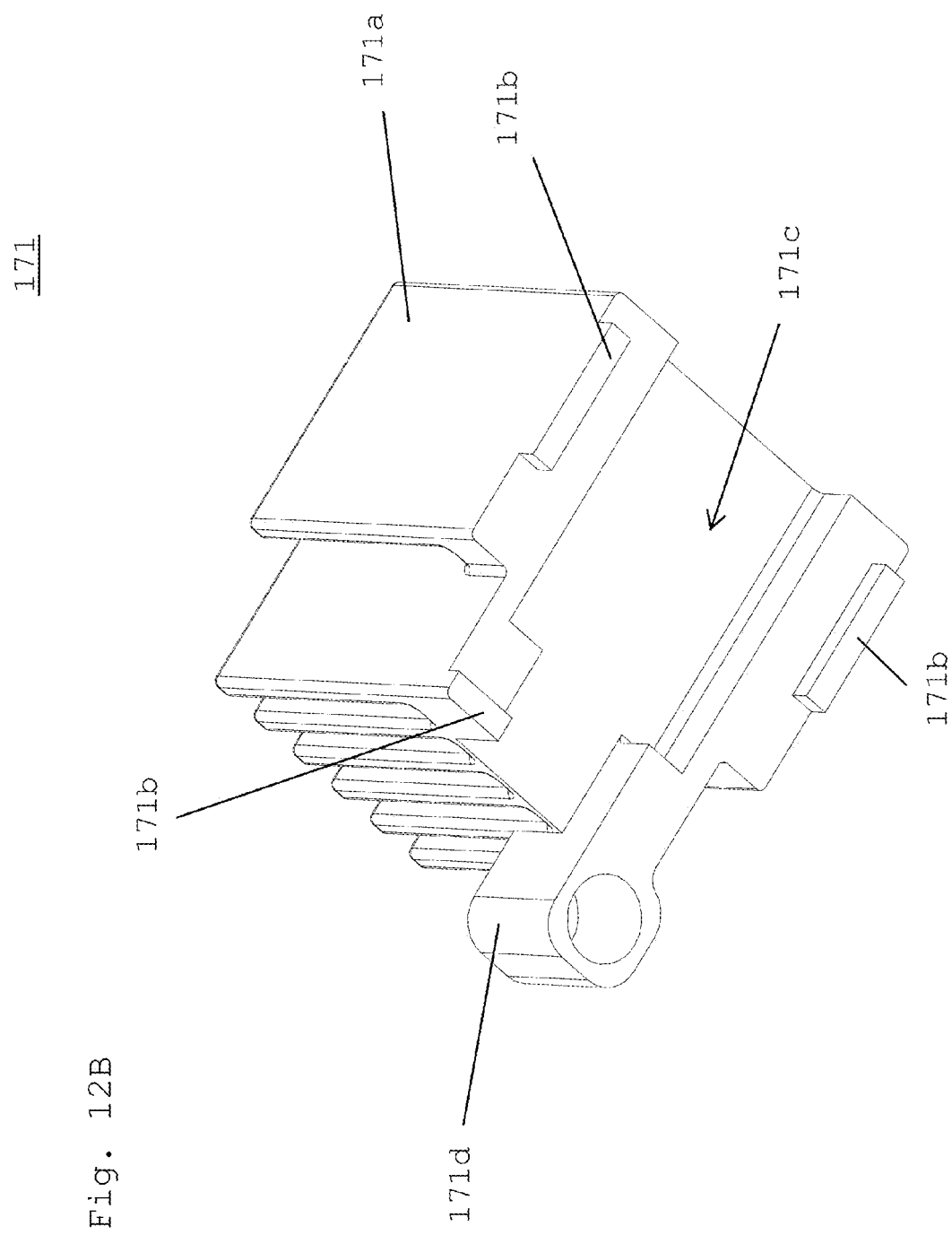
Figure 12C:
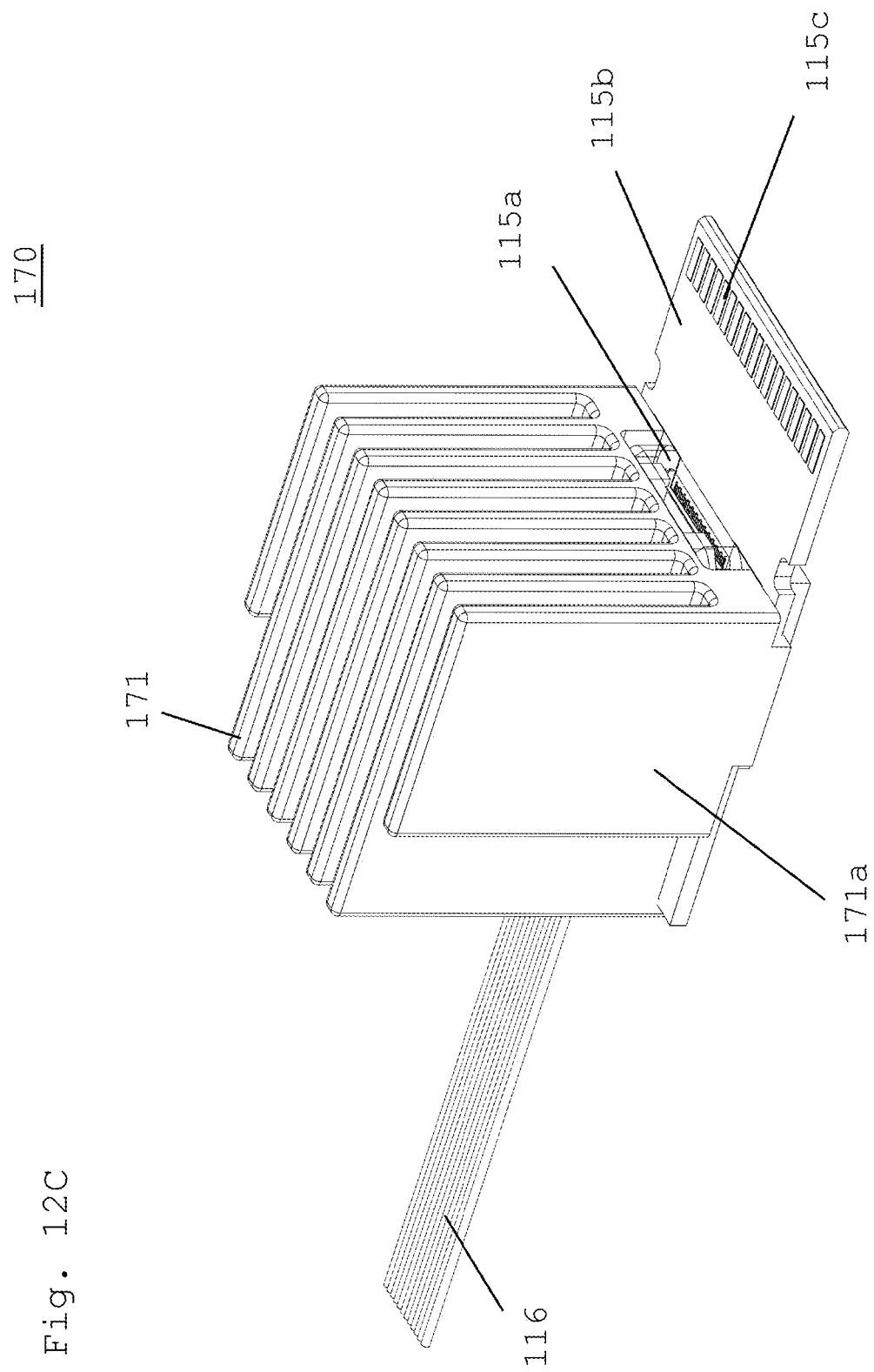

FIGS. 12A and 12B show a heatsink 171 for use with the transceiver 170 shown in FIGS. 12C and 12D. The transceiver 170 is used in the seventh and eighth preferred embodiments of the present invention. The transceiver 170 can be used in the flat, co-planar environment of the seventh preferred embodiment shown in FIGS. 13A and 13B and can be used in the stepped-plane environment of the eighth preferred embodiment shown in FIGS. 14A and 14D.

As shown in FIGS. 12A and 12B, the heatsink 171 includes fins 171*a* to transmit heat from the optical engine 115*a*, legs 131*b* and post 171*d* to secure the circuit board 115*b*, and cavity 171*c* in which the optical engine 115*a* is located. Any suitable arrangement and number of fins 171*a* can be used as long as an adequate amount of heat can be dissipated from the optical engine 115*a*. The post 171*d* of the heatsink 171 includes a hole 171*e* through which the screw 175 is inserted to secure the circuit board 115*b*. As seen in FIG. 12D, the circuit board 115*b* preferably includes a tab 115*i* with a hole through which the screw 175 is inserted.

Figure 13B:
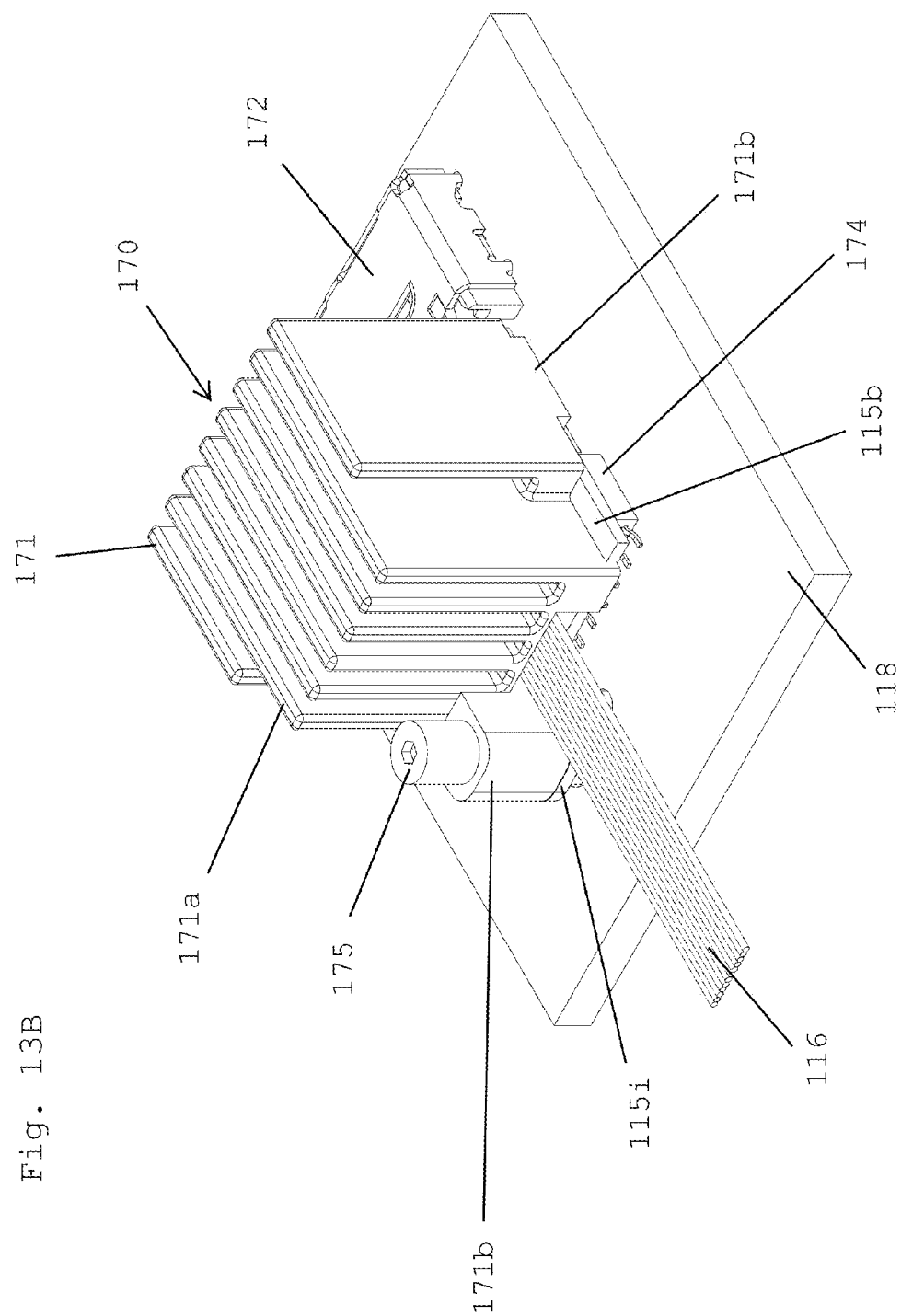

FIGS. 13A and 13B show a two-piece connector system according to the seventh preferred embodiment of the present invention. FIGS. 13A and 13B show the circuit board 118 with front connectors 172 and back connectors 174.

The front connectors 172 are preferably edge-card connectors that mate with the front of the circuit board 115*b*. Preferably, the front connector 172 includes two rows of contacts 172*a*, with one row of contacts 172*a* that can engage the lands 115*c* on top of the circuit board 115*b* and with the other row contacts 172*a* that can engage the lands 115*d* on bottom of the circuit board 115*b*.

The back connector 174 is preferably a zero-insertion-force connector. Retainer 175*a* can be used to secure the heatsink 171 (not shown in FIG. 13A and but shown in FIG. 13B) to the circuit board 118. The screw 175 can be inserted into a hole 175*b* of the retainer 175*a*. The screw 175 secures the transceiver 170 to the circuit board 118 by being inserted through the holes 171*e*, 175*b* in the heatsink 171, the circuit board 115*b*, and the retainer 175*b*. The back connector 174 includes contacts 174*a* that can engage the lands 115*e* on the bottom of the circuit board 115*b*. It is possible for the back connector 174 to include a single row of contacts 174*a* as shown in FIG. 13A or to include more than one row of contacts 174*a*.

To mate the transceiver 170 with the circuit board 118, the front end of the circuit board 115*b* is inserted into the front connector 172, and then the screw 175 is used to secure the transceiver 170 to the circuit board 118. To unmate the transceiver 150 from the circuit board 118, the screw 175 is unscrewed from at least the retainer 175*a*, and then the front end of the circuit board 115*b* is pulled out of the front connector 172. Preferably, the high-speed signals are transmitted through the front connector 172, and low-speed signals and/or power are transmitted through the back connector 174.

Figure 14A:
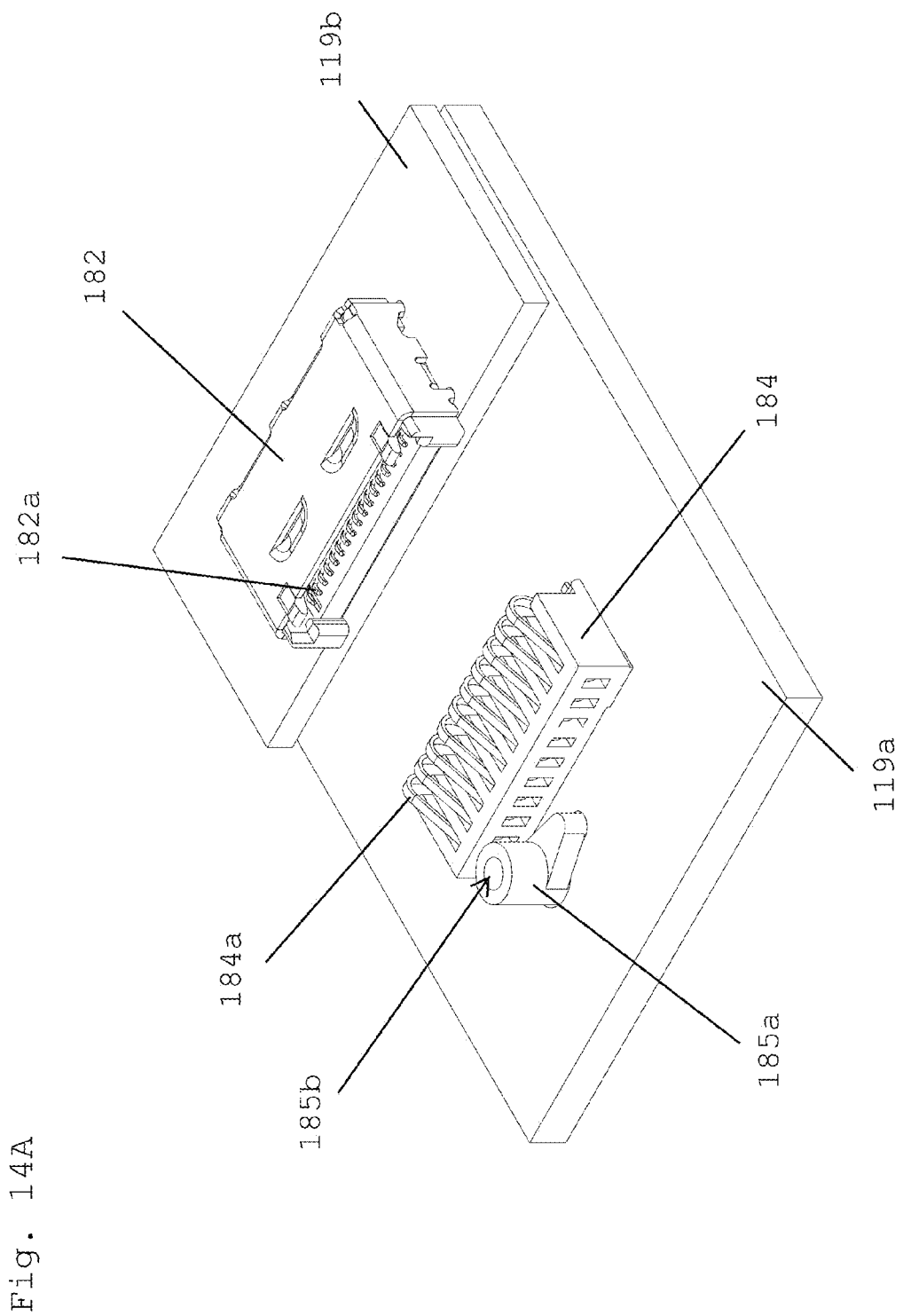
FIGS. 14A and 14B show a circuit board and a transceiver according to the eighth preferred embodiment of the present invention.
Figure 14B:
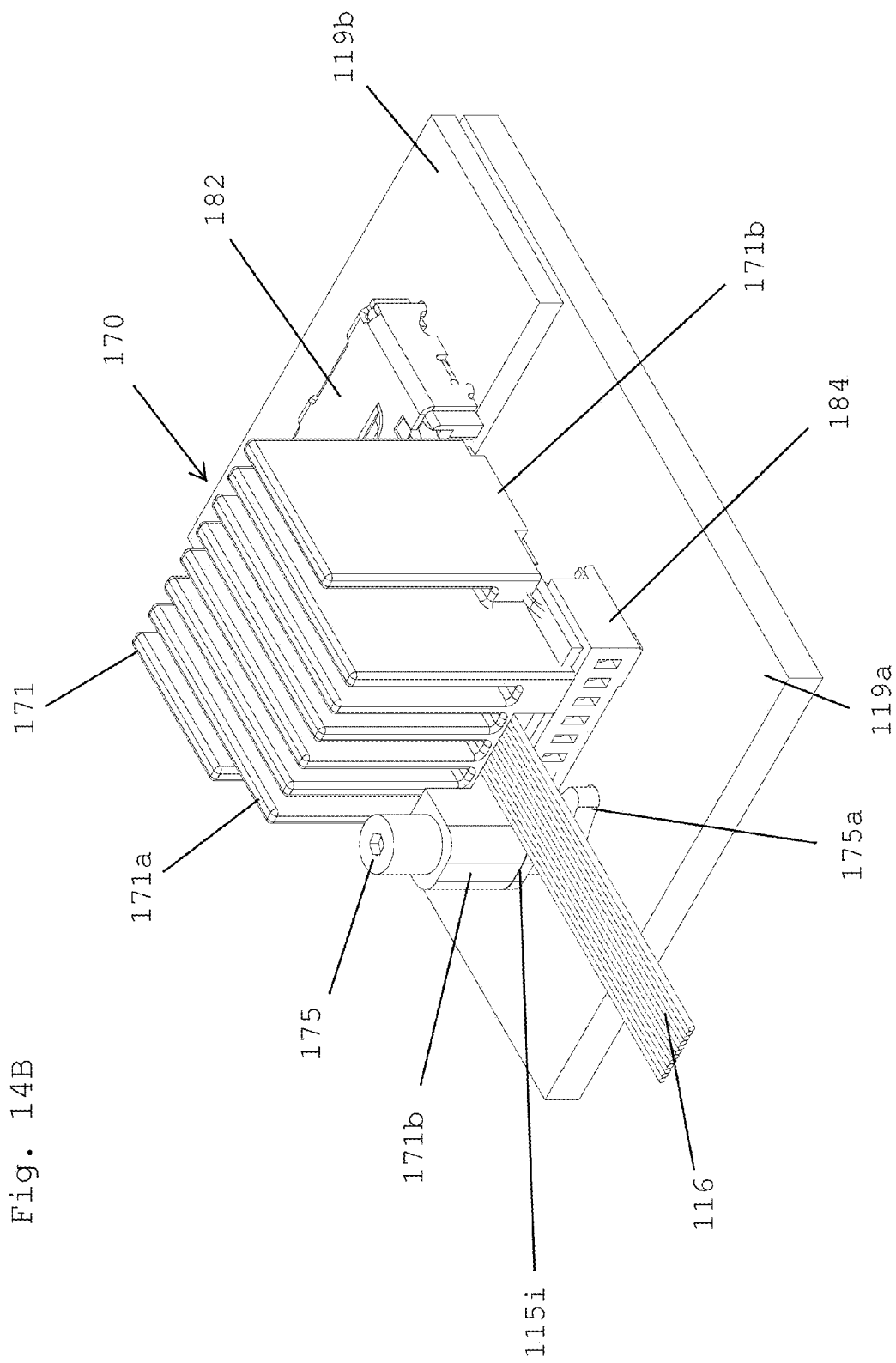

FIGS. 14A and 14B show a two-piece connector system according to the eighth preferred embodiment of the present invention. FIGS. 14A and 14B show the circuit board 119*b* with the front connector 182 and the circuit board 119*a* with the back connector 184. The circuit board 119*b* can be part of an IC package; however, for simplicity, only the circuit board 119*b* is shown.

The front connector 182 is preferably an edge-card connector that mates with the front of the circuit board 115*b*. Preferably, the front connector 182 includes two rows of contacts 182*a*, with one row of contacts 182*a* that can engage the lands 115*c* on top of the circuit board 115*b* and with the other row contacts 182*a* that can engage the lands 115*d* on bottom of the circuit board 115*b*.

The back connector 184 is preferably a zero-insertion-force connector. Retainer 185*a* can be used to secure the heatsink 171 (not shown in FIG. 14A and but shown in FIG. 14B) to the circuit board 119*a*. The screw 175 can be inserted into a hole 185*b* of the retainer 185*a*. The screw 175 secures the transceiver 170 to the circuit board 119*a* by being inserted through the holes 171*e*, 185*b* in the heatsink 171, the circuit board 115*b*, and the retainer 175*b*. The back connector 184 includes contacts 184*a* that can engage the lands 115*e* on the bottom of the circuit board 115*b*. It is possible for the back connector 184 to include a single row of contacts 184*a* as shown in FIG. 14A or to include more than one row of contacts 184*a*.

To mate the transceiver 170 with the circuit boards 119*a*, 119*b*, the front end of the circuit board 115*b* is inserted into the front connector 182 on the circuit board 119*b*, and then the screw 175 is used to secure the transceiver 170 to the circuit board 119*a*. To unmate the transceiver 170 from the circuit boards 119*a*, 119*b*, the screw 175 is unscrewed from at least the retainer 185*a*, and then the front end of the circuit board 115*b* is pulled out of the front connector 182. Preferably, the high-speed signals are transmitted through the front connector 182, and low-speed signals and/or power are transmitted through the back connector 184.

Figure 15A:
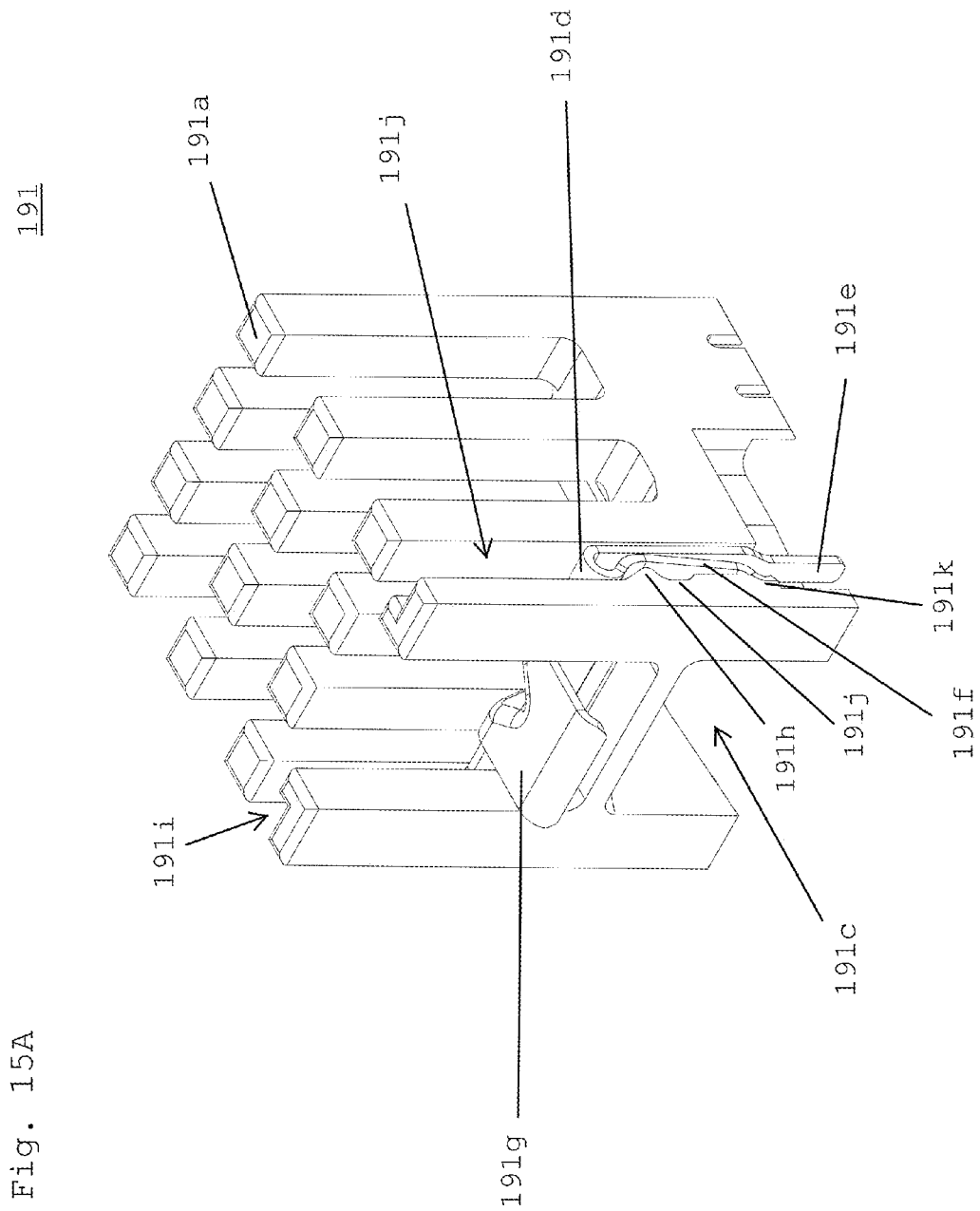
FIGS. 15A and 15B show a heatsink for use with the ninth and tenth preferred embodiments of the present invention.
Figure 15B:
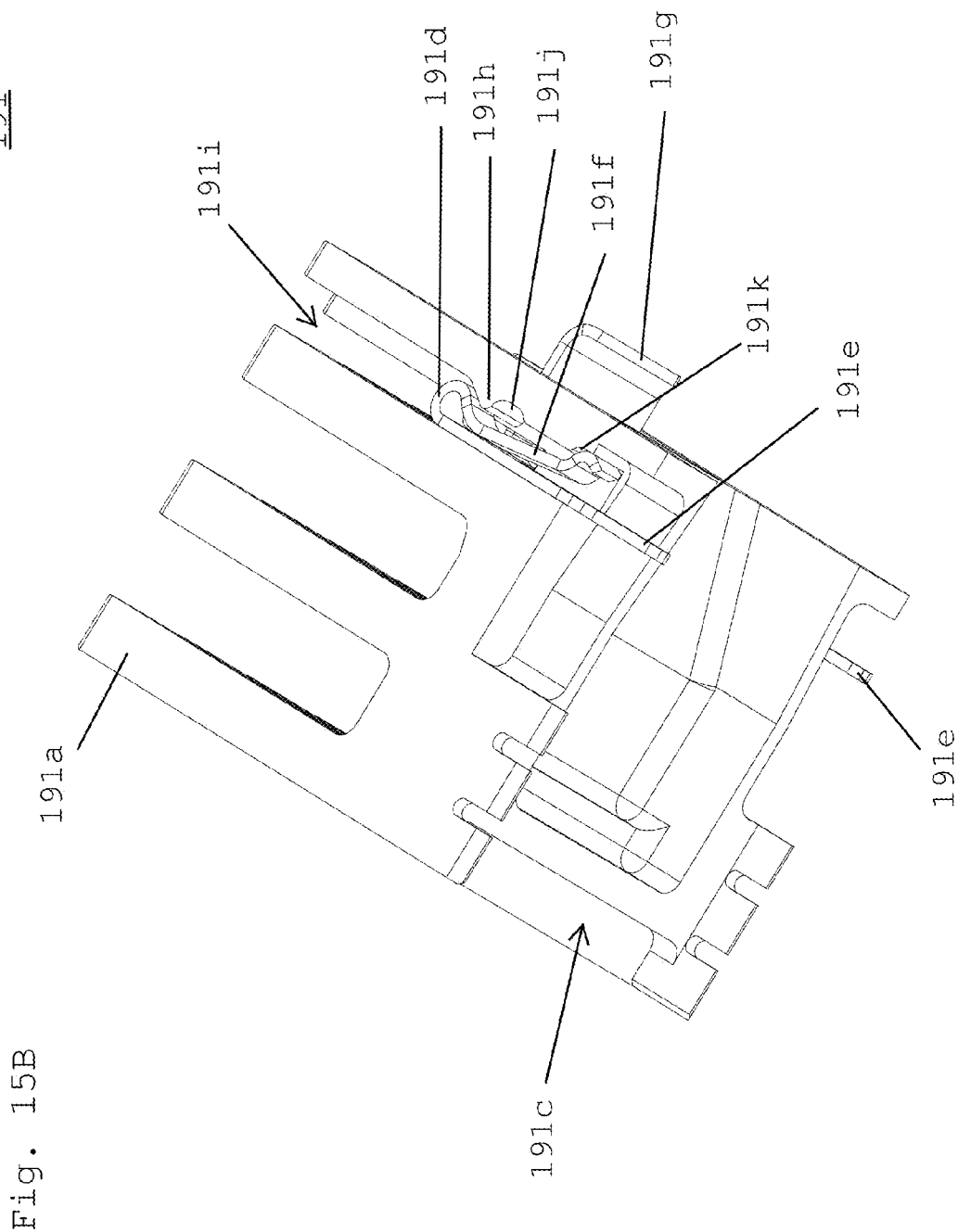
Figure 15D:
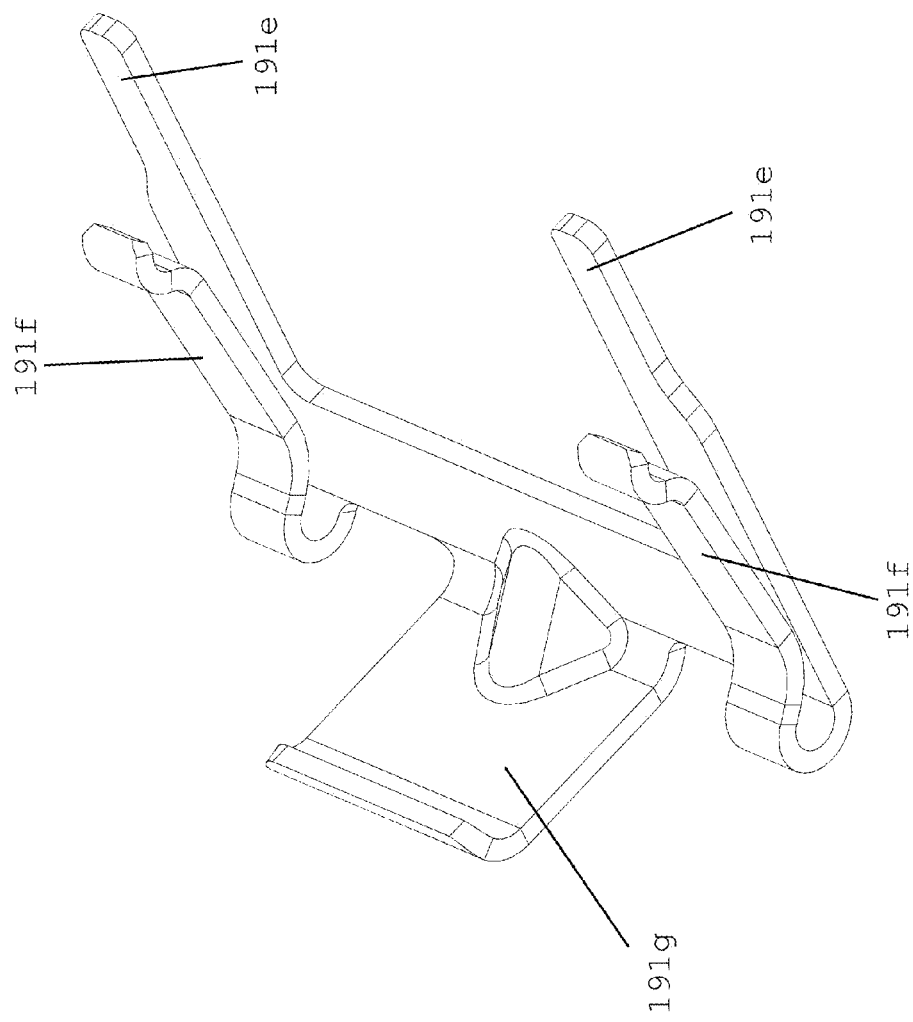
Figure 15E:
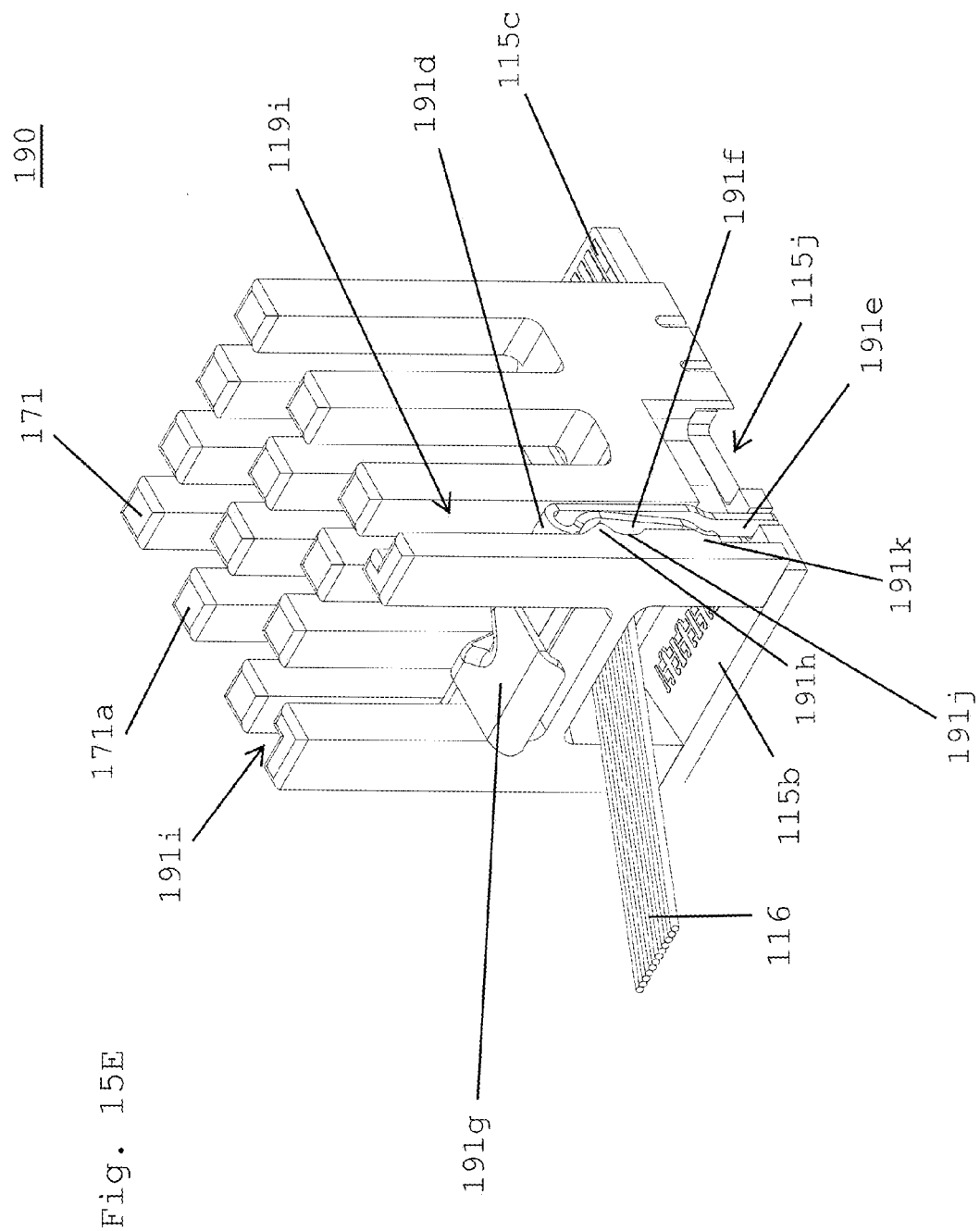
FIGS. 15E and 15F show a transceiver with a heatsink for use with the ninth and tenth preferred embodiments of the present invention.
Figure 15F:
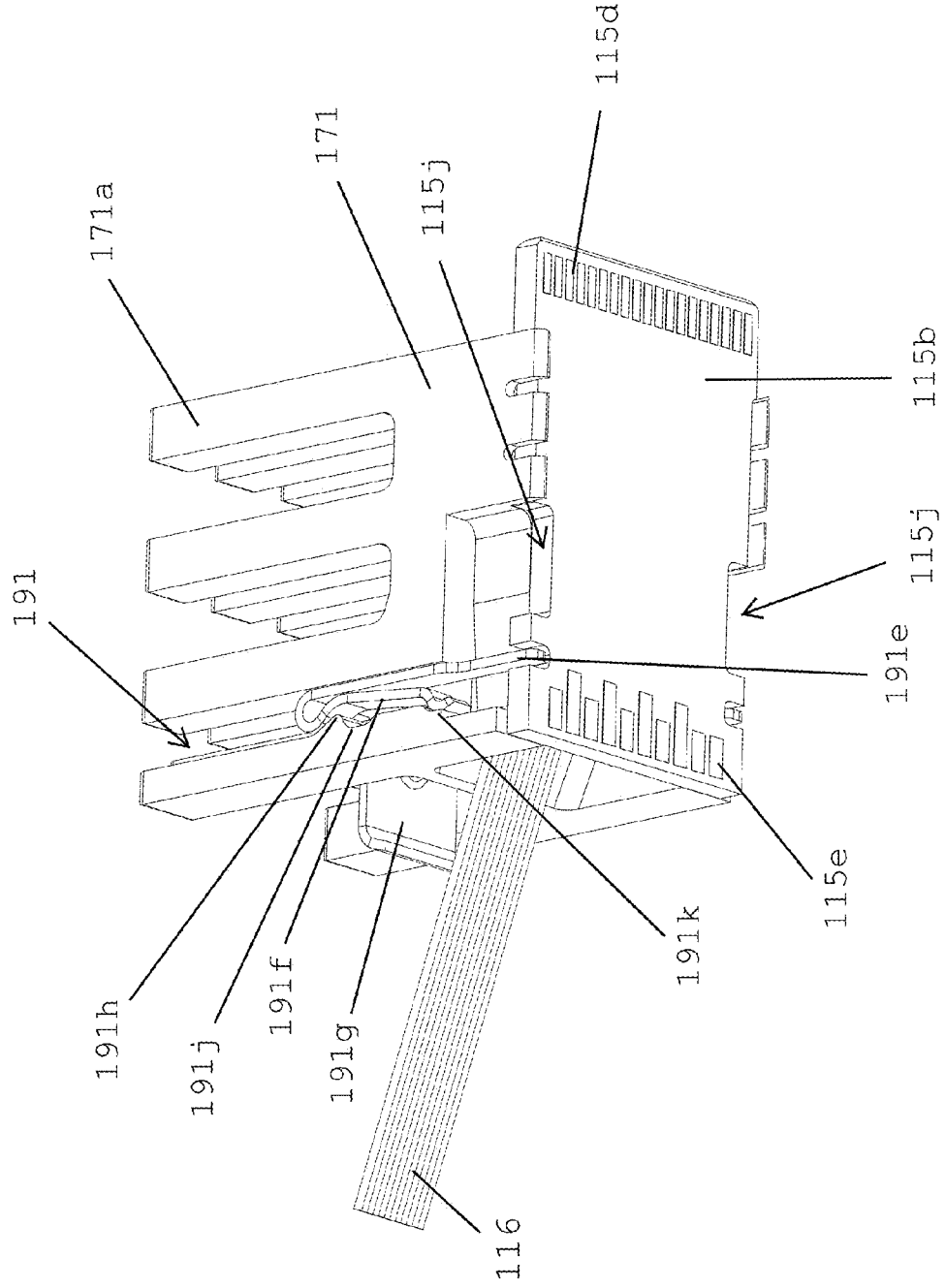

FIGS. 15A and 15B show a heatsink 191 for use with the transceiver 190 shown in FIGS. 15E and 15F. FIGS. 15C and 15D show how a U-clip 191*d* is used to secure the heatsink to the circuit boards 118, 119*a*. The transceiver 190 is preferably used in the ninth and tenth preferred embodiments of the present invention. The transceiver 190 can be used in the flat, co-planar environment of the ninth preferred embodiment shown in FIGS. 16A and 16B and can be used in the stepped-plane environment of the tenth preferred embodiment shown in FIGS. 17A and 17B.

As shown in FIGS. 15A and 15B, the heatsink 191 includes tines 191a to transmit heat from the optical engine 115a, a U-clip 191d that engages with the notches 195, 205 shown in FIG. 16A-17B to secure the circuit board 115b as well as the heatsink 191, cavity 191c in which the optical engine 115a is located. The heatsink 191 also preferably includes slots 191i in which the U-clip 191d is inserted. Each of the slots 191i preferably includes a ramp 191h that engages the top of the arm 191f and that stops the U-clip 191d from being inserted past the ramp 191h and preferably includes depressions 191j, 191k that engage the bottom of the arm 191f. Depressions 191j are arranged to engage the bottom of the arm 191f to stop the U-clip 191d from being pulled out of the heatsink 191. Depressions 191k are also arranged to engage the bottom of the arm 191f when the legs 191e are engaged with the notches 195, 205 to provide a resistance when the U-clip 191d is pulled-up to disengage the legs 191e from the notches 195, 205.

Any suitable arrangement and number of tines 191a can be used as long as an adequate amount of heat can be dissipated from the optical engine 115a. In addition, any length of the tines 191a can be used. The cavity 191c is preferably arranged to allow the cables 116 to be angled with respect to the circuit boards 118, 119a as shown in FIGS. 16B and 17B. By angling the cables 116, it is possible to reduce the size of the footprint required on the circuit boards 118, 119a and to reduce the bend angle of the cable 116. Reducing the bend angle of the cable 116 reduces the possibility of damaging the optical fibers in the cable 116.

FIGS. 15C and 15D show the U-clip 191d. U-clip 191d preferably includes legs 191e, arms 191f, and tab 191g. The tab 191g is arranged such that a force from, for example, a human finger, can push the legs 191e into the notches 195, 205 of the back connector 194, 204 as shown, for example, FIGS. 16A and 17A and can pull the legs 191e from the notches 195, 205 of the back connector 194, 204.

Figure 16A:
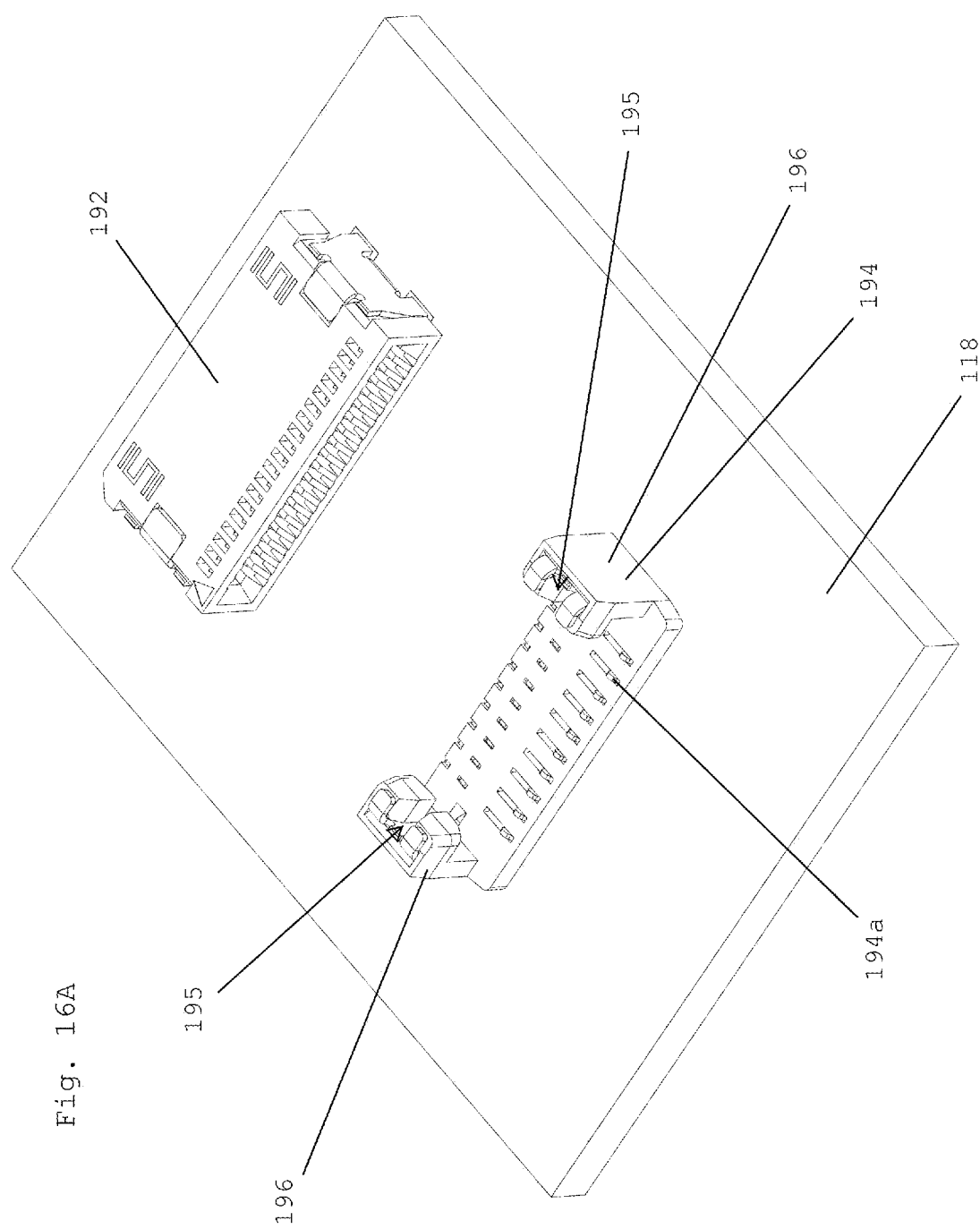
FIGS. 16A and 16B show a circuit board and a transceiver according to the ninth preferred embodiment of the present invention.
Figure 16B:
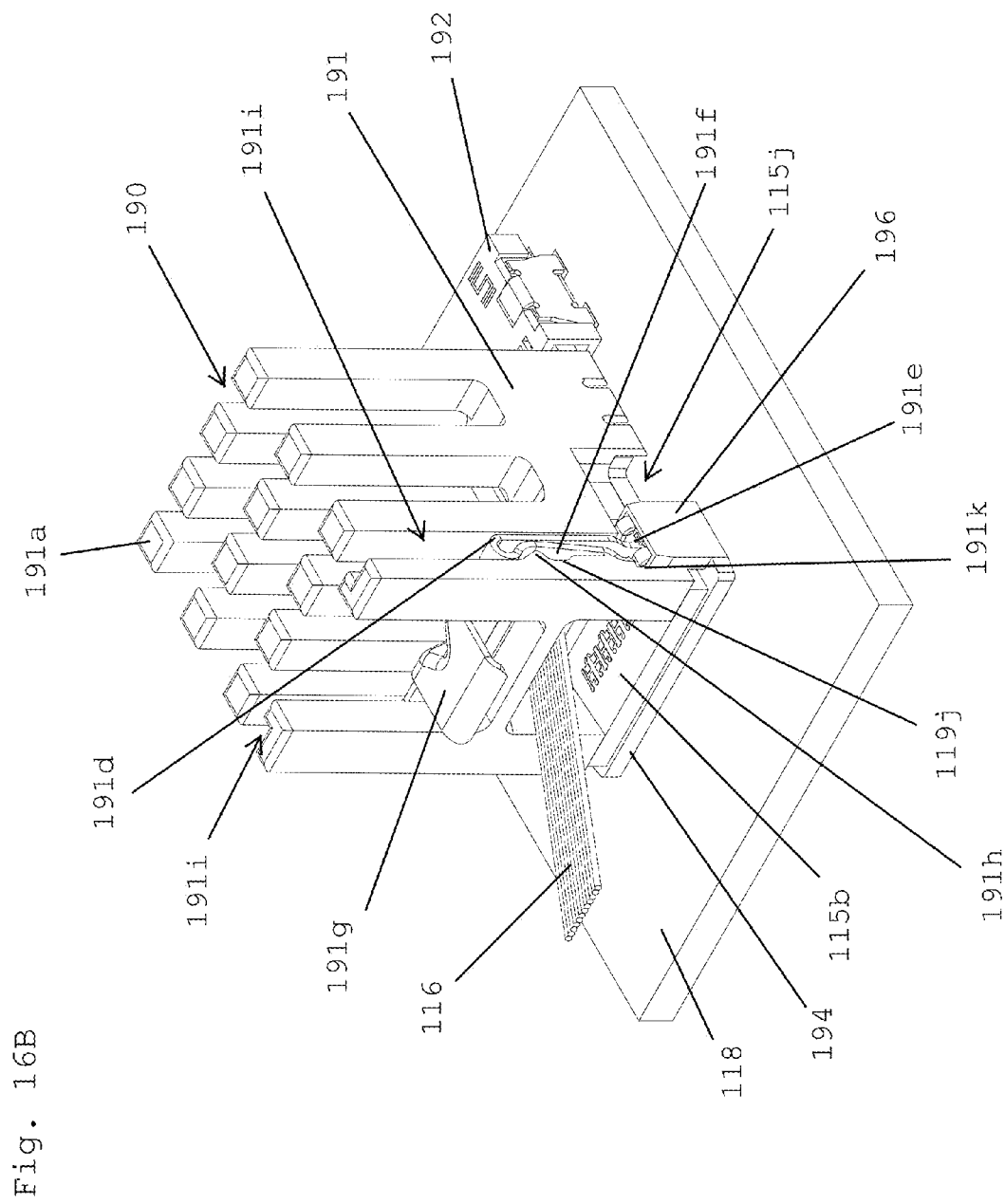

FIGS. 16A and 16B show a two-piece connector system according to the ninth preferred embodiment of the present invention. FIG. 16A shows the circuit board 118 with the front connector 192 and the back connector 194.

The front connector 192 is preferably an edge-card connector that mates with the front of the circuit board 115b. Preferably, the front connector 192 includes two rows of contacts (not seen in FIG. 16A), with one row of contacts that can engage the lands 115c on top of the circuit board 115b and with the other row contacts that can engage the lands 115d on bottom of the circuit board 115b.

The back connector 194 is preferably a zero-insertion-force connector that includes notches 195 that can be used with U-clip 191d to secure the back portion of the transceiver 190 (not shown in FIG. 16A but shown in FIG. 16B) to the circuit board 118. The back connector 194 includes a row of contacts 194a that can engage the lands 115e on the bottom of the circuit board 115b. Although a single row of contacts 194a is shown in FIG. 16A, it is also possible to use more than one row of contacts 194a.

To mate transceiver 190 with the circuit board 118, the circuit board 115b is pressed down into the back connector 194 so that posts 196 align with notches 115j in the circuit board 115b, and then the circuit board 115b is pushed forward so that the front end of the circuit board 115b is inserted into the front connector 192. Then, the U-clip 191d can be pushed down such that the legs 191e engage the notches 195. To unmate the transceiver 190 from the circuit board 118, the U-clip 191d can be pulled up such that the legs 191e disengage with the notches 195. Then the front end of the circuit board 115b is pulled out of the front connector 192 so that the posts 196 align with the notches 115j, and then the transceiver 190 is pulled out of the back connector 194. Preferably, the high-speed signals are transmitted through the front connector 192, and low-speed signals and/or power are transmitted through the back connector 194.

Figure 17A:
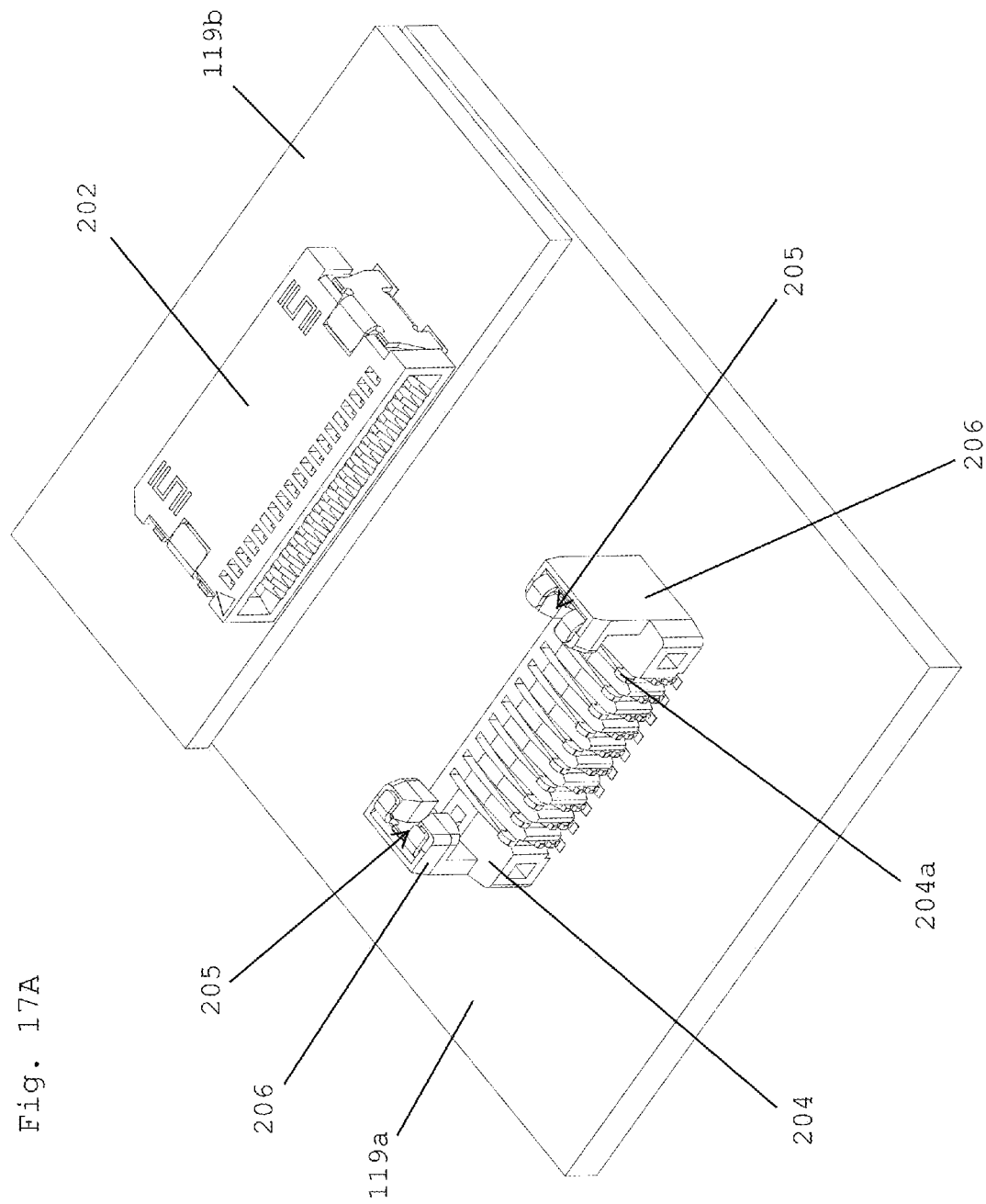
Figure 18:
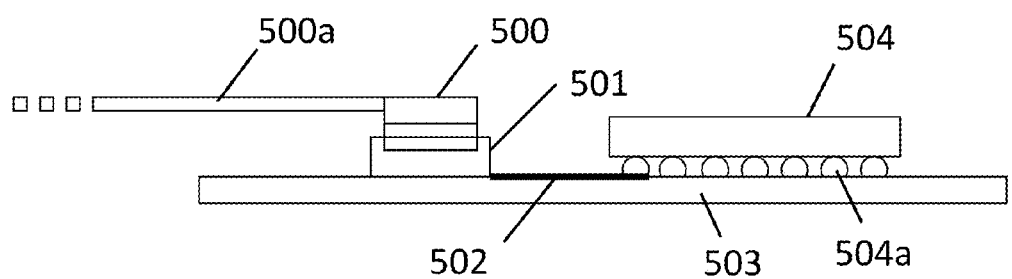
FIG. 18 shows a conventional transceiver and a conventional IC package.
Figure 19A:
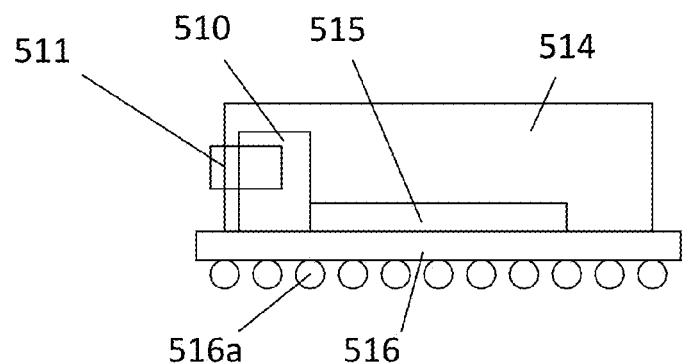
FIG. 19A shows another conventional IC package.
Figure 19B:
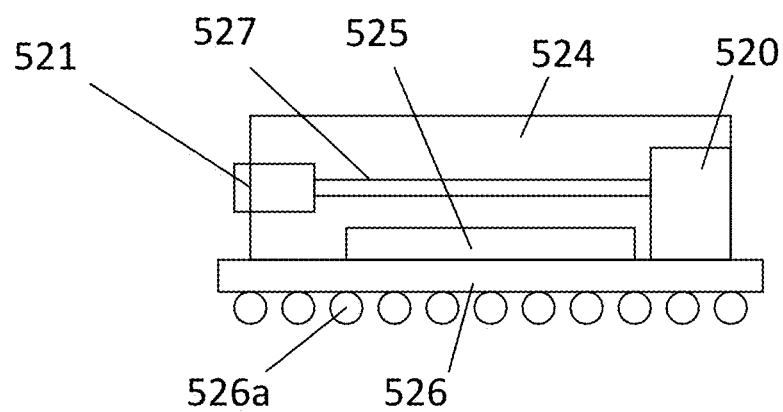
FIG. 19B shows a conventional modification of the IC package shown FIG. 19A.

FIGS. 17A and 17B show a two-piece connector system according to the tenth preferred embodiment of the present invention. FIG. 17A shows the circuit board 119b with the front connector 202 and the circuit board 119a with the back connector 204. The circuit board 119b can be part of an IC package; however, for simplicity, only the circuit board 119a is shown.

The front connector 202 is preferably an edge-card connector that mates with the front of the circuit board 115b. Preferably, the front connector 202 includes two rows of contacts (not seen in FIG. 17A), with one row of contacts that can engage the lands 115c on top of the circuit board 115b and with the other row contacts that can engage the lands 115d on bottom of the circuit board 115b.

The back connector 204 is preferably a zero-insertion-force connector that includes notches 205 that can be used with U-clip 191d to secure the back portion of the transceiver 190 (not shown in FIG. 17A but shown in FIG. 17B) to the circuit board 119a. The back connector 204 can be similar to the back connector 194 with the difference being that the height of the back connector 204 is larger than the height of the back connector 194. The back connector 204 includes a row of contacts 204a that can engage the lands 115e on the bottom of the circuit board 115b. Although a single row of contacts 204a is shown in FIG. 17A, it is also possible to use more than one row of contacts 204a.

To mate transceiver 190 with the circuit boards 119a, 119b, the circuit board 115b is pressed down into the back connector 204 so that posts 206 align with notches 115j in the circuit board 115b, and then the circuit board 115b is pushed forward so that the front end of the circuit board 115b is inserted into the front connector 202. Then, the U-clip 191d can be pushed down such that the legs 191e engage the notches 205. To unmate the transceiver 190 from the circuit boards 119a, 119b, the U-clip 191d can be pulled up such that the legs 191e disengage with the notches 205. Then the front end of the circuit board 115b is pulled out of the front connector 202 so that the posts 206 align with the notches 115j, and then the transceiver 190 is pulled out of the back connector 204. Preferably, the high-speed signals are transmitted through the front connector 202, and low-speed signals and/or power are transmitted through the back connector 204.

Instead of using the latches 135, 145, clips 155, 165, screws 175, or a U-clip 191d of the various preferred embodiments of the present invention described above, it is also possible to use other arrangements to secure the circuit board 115b to the heatsink 131, 151, 171, including, for example, staples or epoxy.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A two-piece connector system comprising:
a socket and a connector, wherein
the two-piece connector system accommodates a transceiver, the socket transmits only high-speed signals to and/or from the transceiver, and the connector transmits only low-speed signals and/or power to and/or from the transceiver.

2. The two-piece connector system of claim 1, wherein the socket is an edge-card connector.

3. The two-piece connector system of claim 1, wherein the connector is a compression connector.

4. The two-piece connector system of claim 1, wherein the socket is an edge-card connector, the connector is a compression connector, and further comprising a transceiver that is pushed into the socket then pressed down into the compression connector.

5. The two-piece connector system of claim 1, further comprising the transceiver, wherein the transceiver includes a circuit board, and the high-speed signals are located within a portion of the circuit board that mates with the socket and the low-speed signals and/or the power are located with a portion of the circuit board that mates with the connector.

6. The two-piece connector system of claim 5, wherein the socket is an edge-card connector.

7. The two-piece connector system of claim 5, wherein the connector is a compression connector.

8. The two-piece connector system of claim 1, wherein the socket is a 0.5 mm pitch edge-card connector, and the connector is a 0.8 mm pitch compression connector.

9. The two-piece connector system of claim 1, further comprising a circuit board; wherein the circuit board includes first and second lands;

lands in each of the first and second lands are arranged in at least one row;

the connector is mounted to the circuit board through the first lands; and the socket is mounted to the circuit board through the second lands.

10. The two-piece connector system of claim 1, further comprising a first circuit board and a second circuit board mounted to the first circuit board; wherein the first circuit board includes first lands;

the second circuit board includes second lands;

lands in each of the first and second lands are arranged in at least one row;

the connector is mounted to the first circuit board through the first lands; and the socket is mounted to the second circuit board through the second lands.

11. The two-piece connector system of claim 1, further comprising the transceiver, wherein the transceiver transmits and/or receives electrical signals.

12. The two-piece connector system of claim 1, further comprising the transceiver, wherein the transceiver transmits and/or receives optical signals.

* * * * *